US012581984B2

(12) United States Patent  
Li et al.

(10) Patent No.: US 12,581,984 B2  
(45) Date of Patent: Mar. 17, 2026

(54) APPARATUS AND METHODS FOR BONDING PAD REDISTRIBUTION LAYERS IN INTEGRATED CIRCUITS

(71) Applicant: Sandisk Technologies, Inc., Milpitas, CA (US)

(72) Inventors: Guangyuan Li, Santa Clara, CA (US); Yuji Totoki, Milpitas, CA (US); Fumiaki Toyama, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 850 days.

(21) Appl. No.: 17/947,672

(22) Filed: Sep. 19, 2022

(65) Prior Publication Data

US 2024/0096826 A1 Mar. 21, 2024

(51) Int. Cl.

| | |
|---|---|
| *H10W 72/90* | (2026.01) |
| *H10W 70/05* | (2026.01) |
| *H10W 70/60* | (2026.01) |
| *H10W 72/00* | (2026.01) |

(52) U.S. Cl.  
CPC ......... *H10W 72/90* (2026.01); *H10W 72/019* (2026.01); *H10W 70/05* (2026.01); *H10W 70/60* (2026.01)

(58) Field of Classification Search  
CPC ..................... H01L 24/05; H01L 24/03; H01L 2224/02311; H01L 2224/02331; H01L 23/5226; H01L 2224/02372; H01L 2224/02375; H01L 2224/04042; H01L 2224/0612; H01L 24/06; H01L 2224/02371; H01L 2224/02373; H01L 2224/02381; H01L 2224/05569  
See application file for complete search history.

(56) References Cited

U.S. PATENT DOCUMENTS

| | | | |
|---|---|---|---|
| 7,482,268 B2 * | 1/2009 | Lin | ................... H01L 23/53238 257/E21.627 |
| 10,916,517 B2 * | 2/2021 | Bih | .................. H01L 21/76814 |
| 11,264,339 B2 | 3/2022 | Choi et al. | |

\* cited by examiner

*Primary Examiner* — Robert G Bachner  
(74) *Attorney, Agent, or Firm* — PEARL COHEN ZEDEK LATZER BARATZ LLP

(57) ABSTRACT

An apparatus is provided that includes an integrated circuit die that includes an uppermost metal layer of an integrated circuit fabrication process, a plurality of first bonding pads disposed on the uppermost metal layer at a first bonding pad pitch, a first additional metal layer disposed above the uppermost metal layer, and a plurality of second bonding pads disposed on the first additional metal layer at a second bonding pad pitch greater than the first bonding pad pitch. The apparatus further includes a plurality of conductors each electrically coupling a unique one of the first bonding pads to a corresponding one of the second bonding pads.

18 Claims, 62 Drawing Sheets

FIG. 6A1

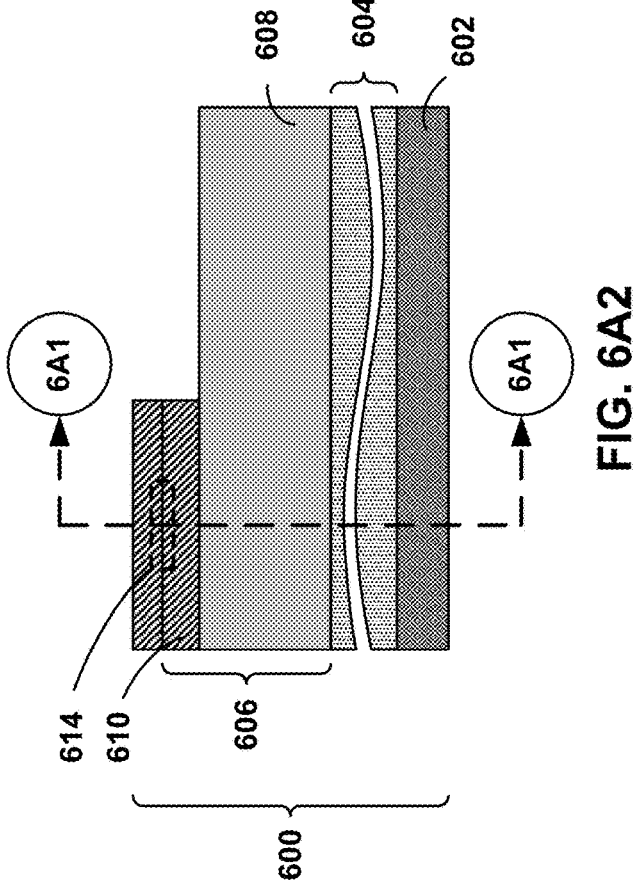
FIG. 6A2

FIG. 6A3

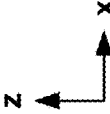
FIG. 6B1

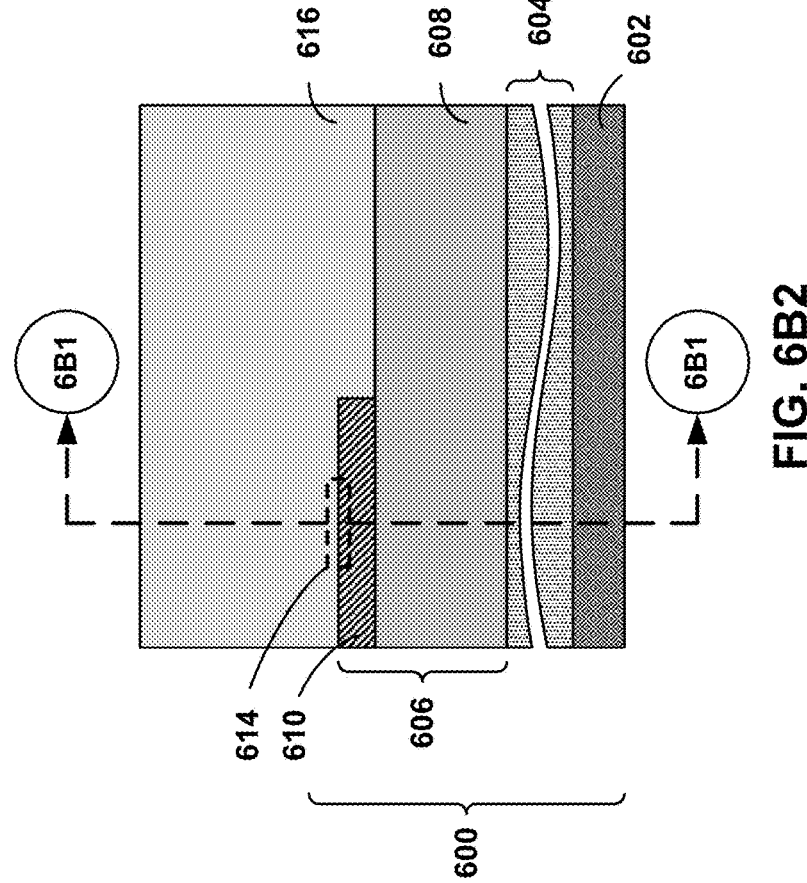
FIG. 6B2
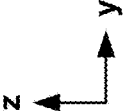

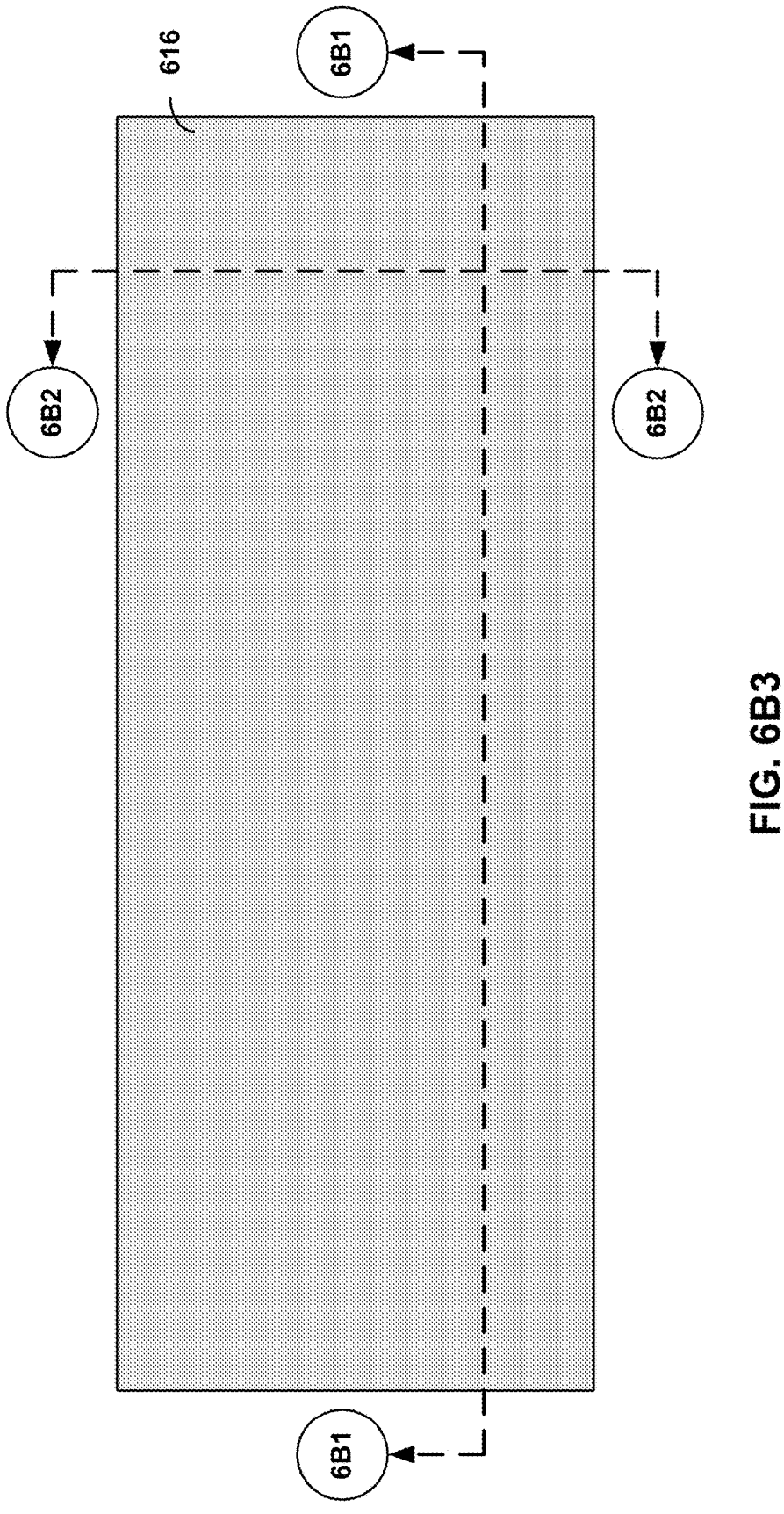
FIG. 6B3

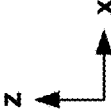
FIG. 6C1

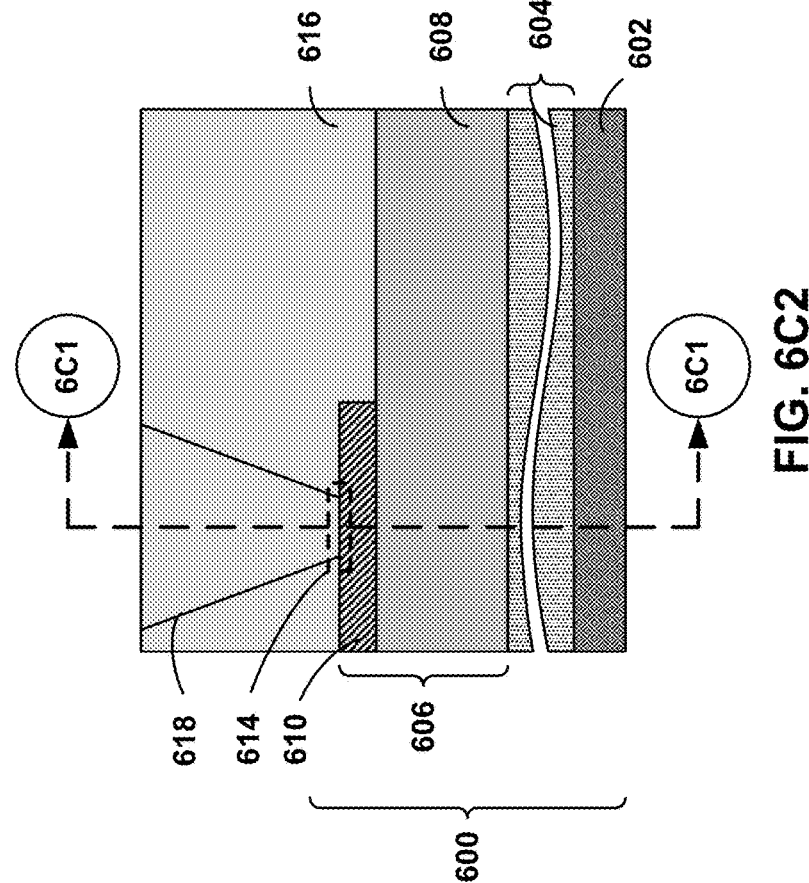
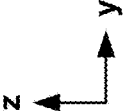
FIG. 6C2

FIG. 6C3

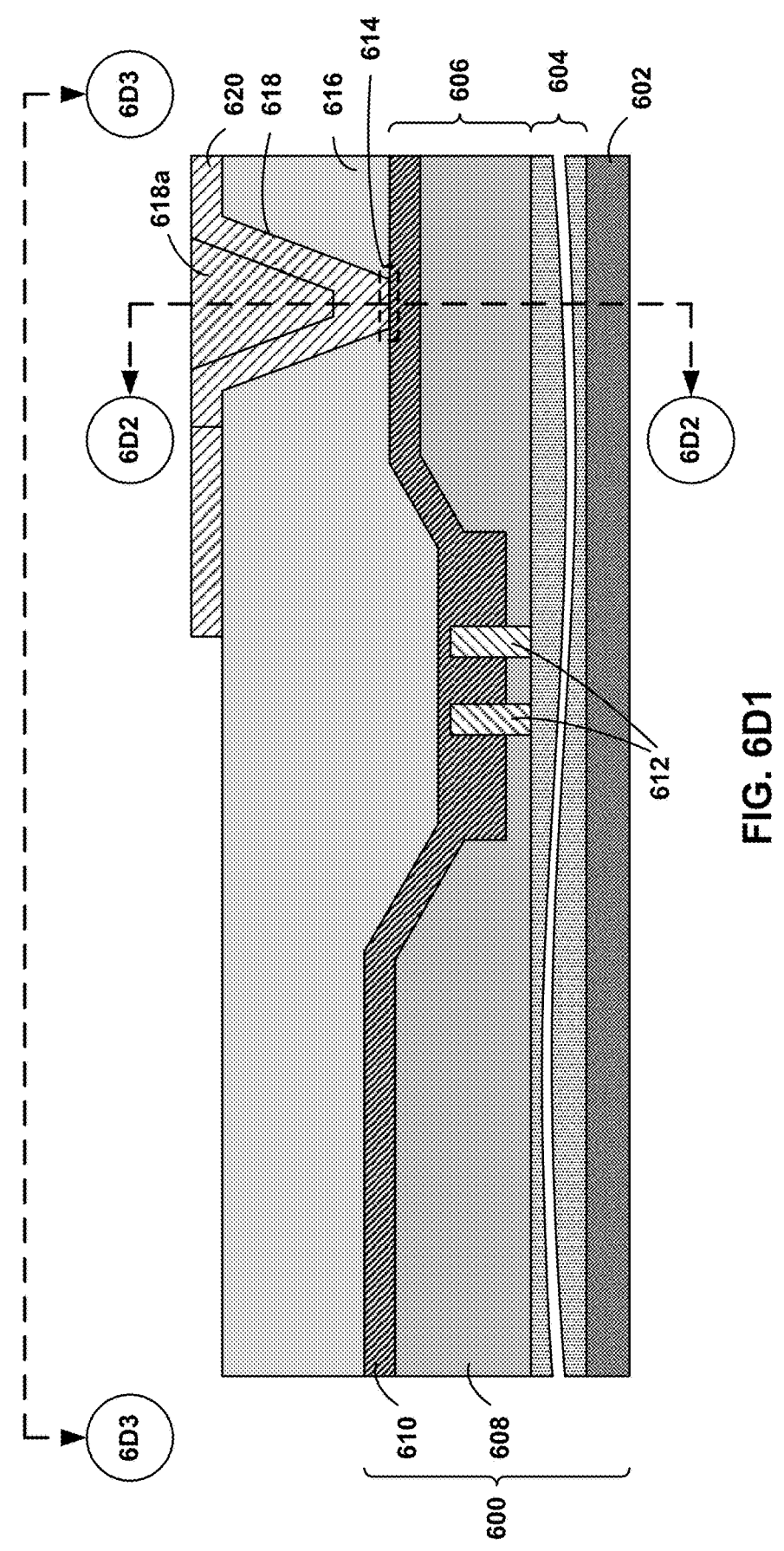
FIG. 6D1

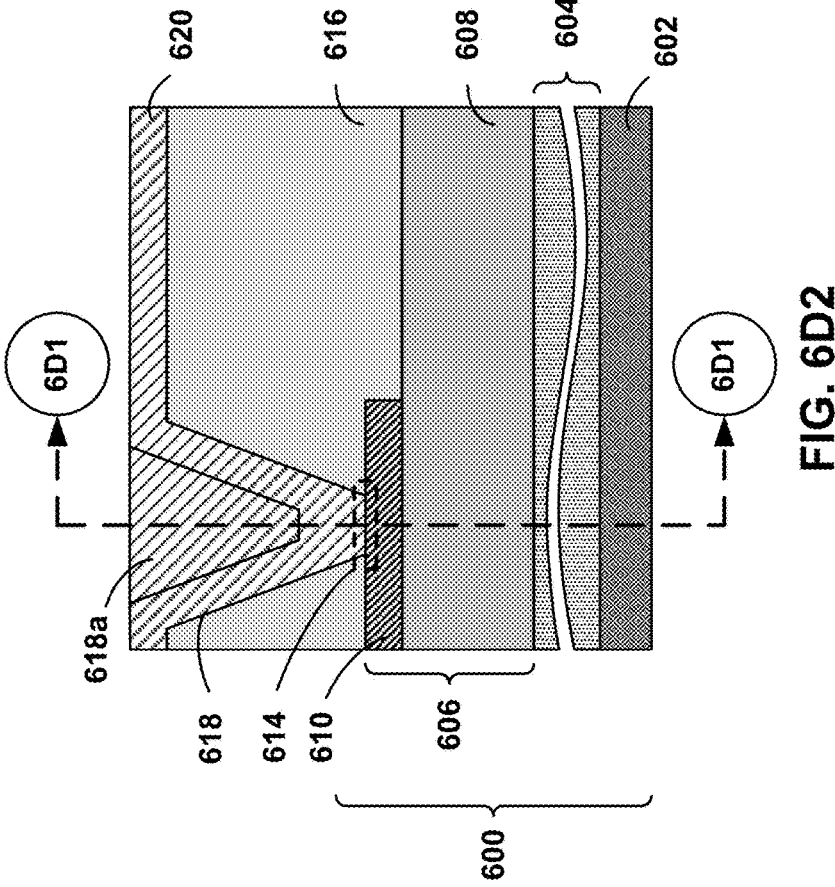
FIG. 6D2

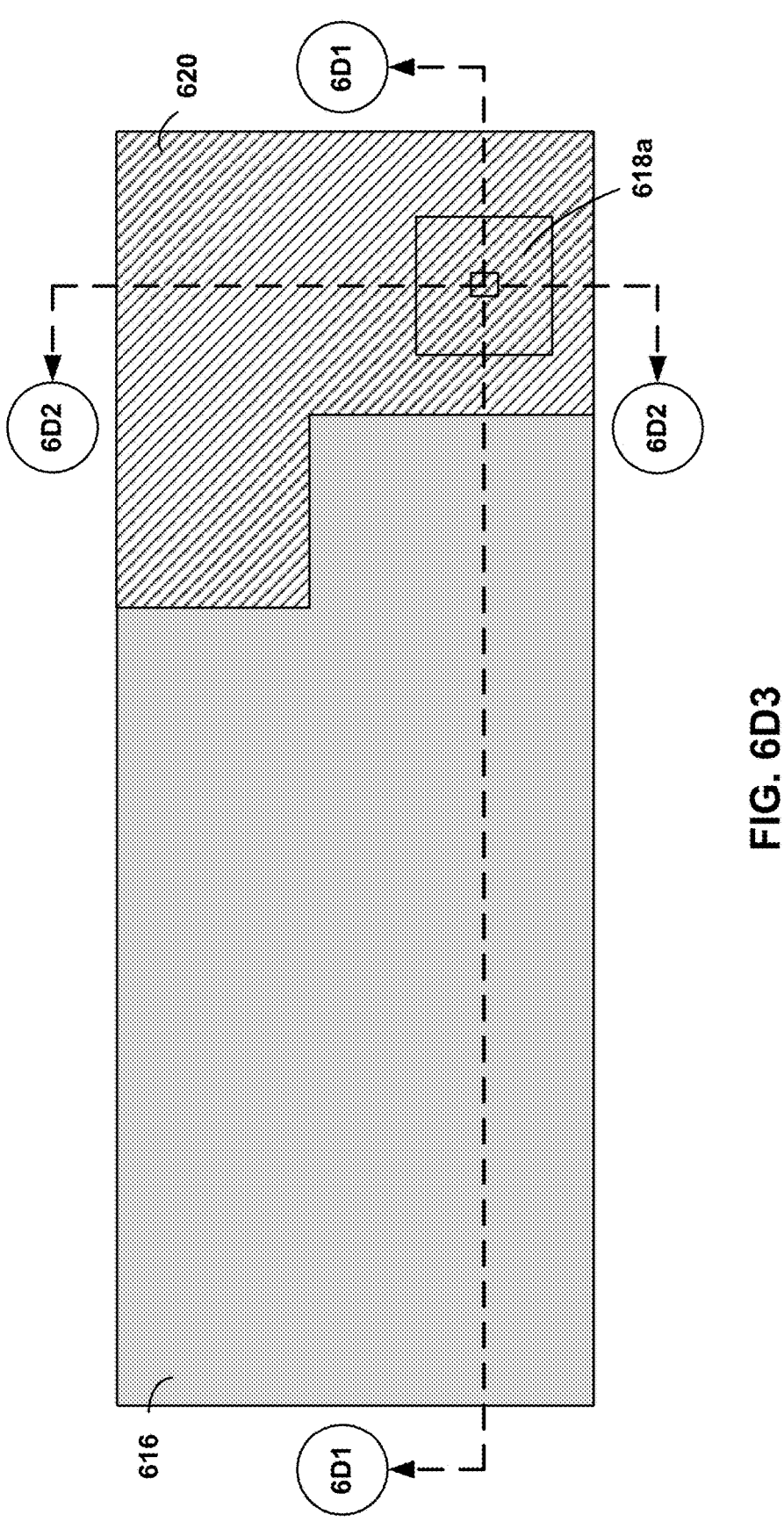
FIG. 6D3

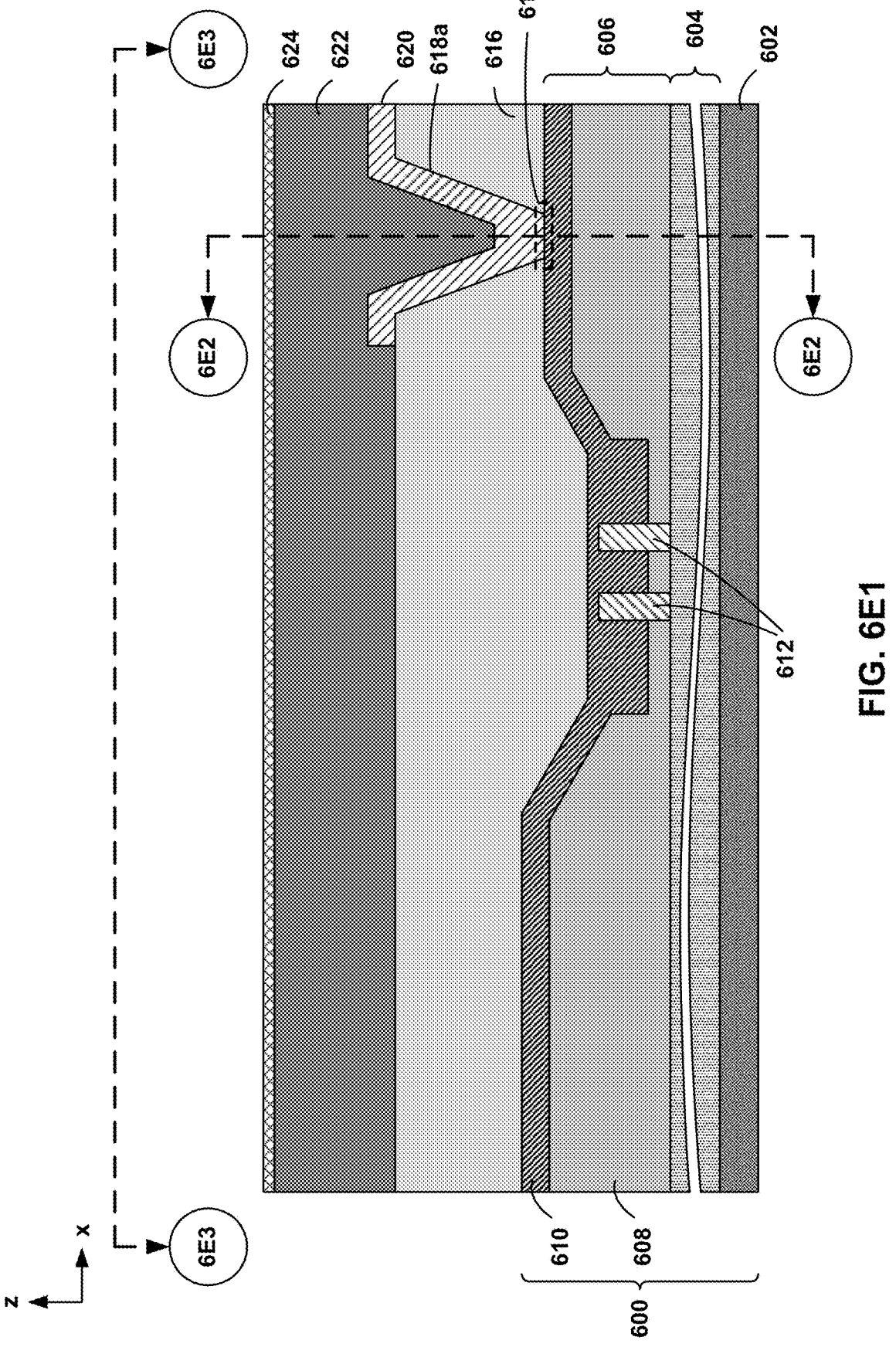
FIG. 6E1

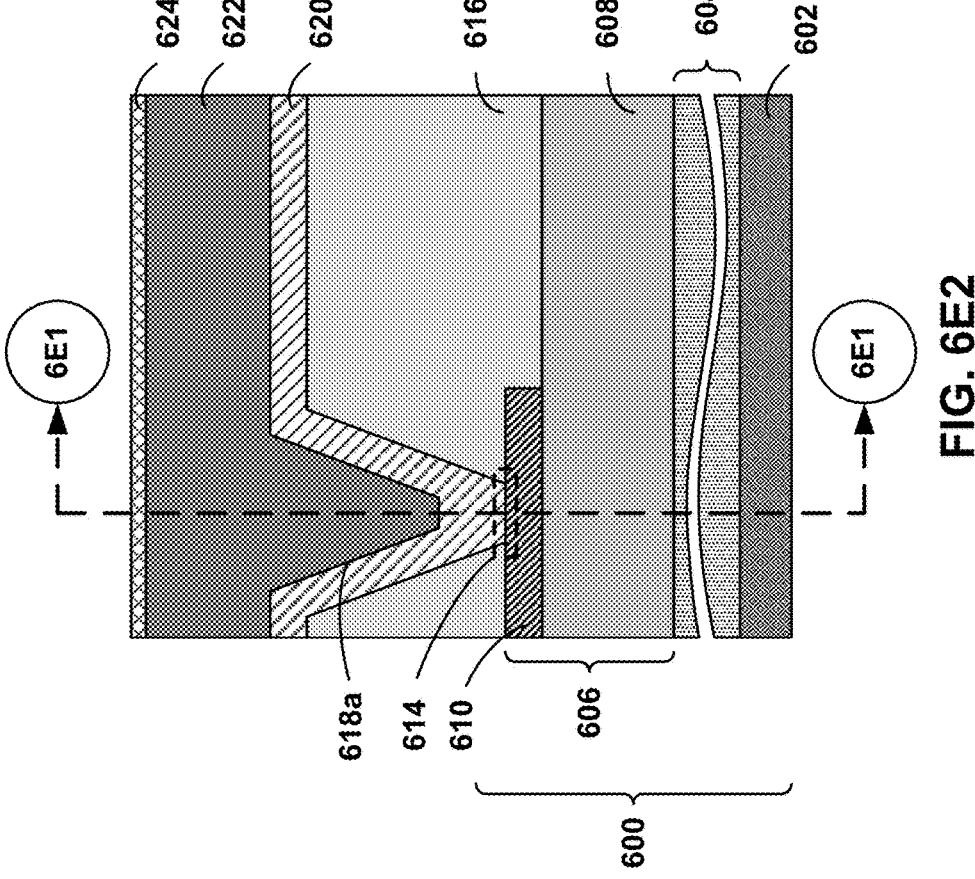
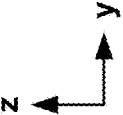
FIG. 6E2

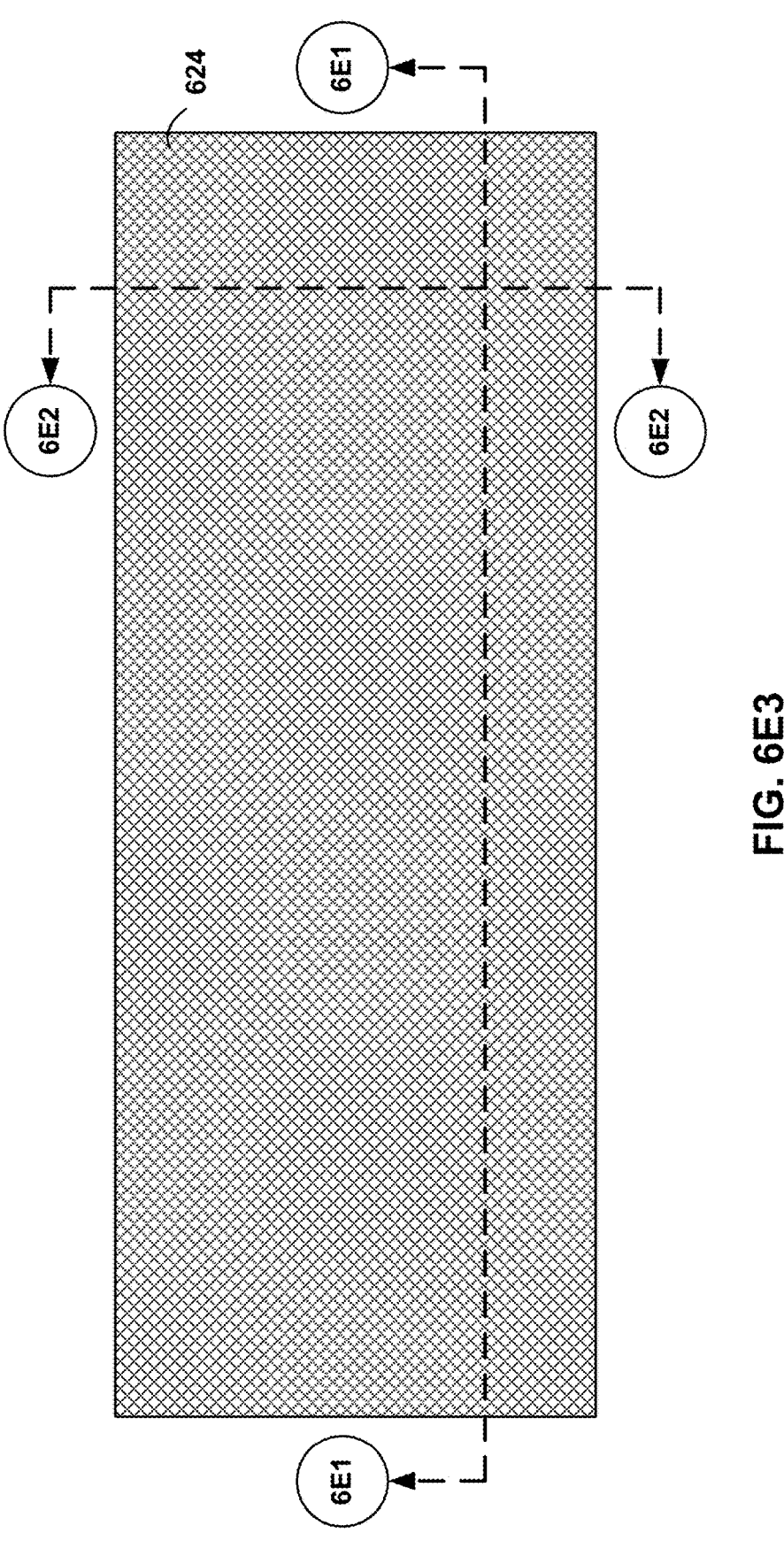
FIG. 6E3

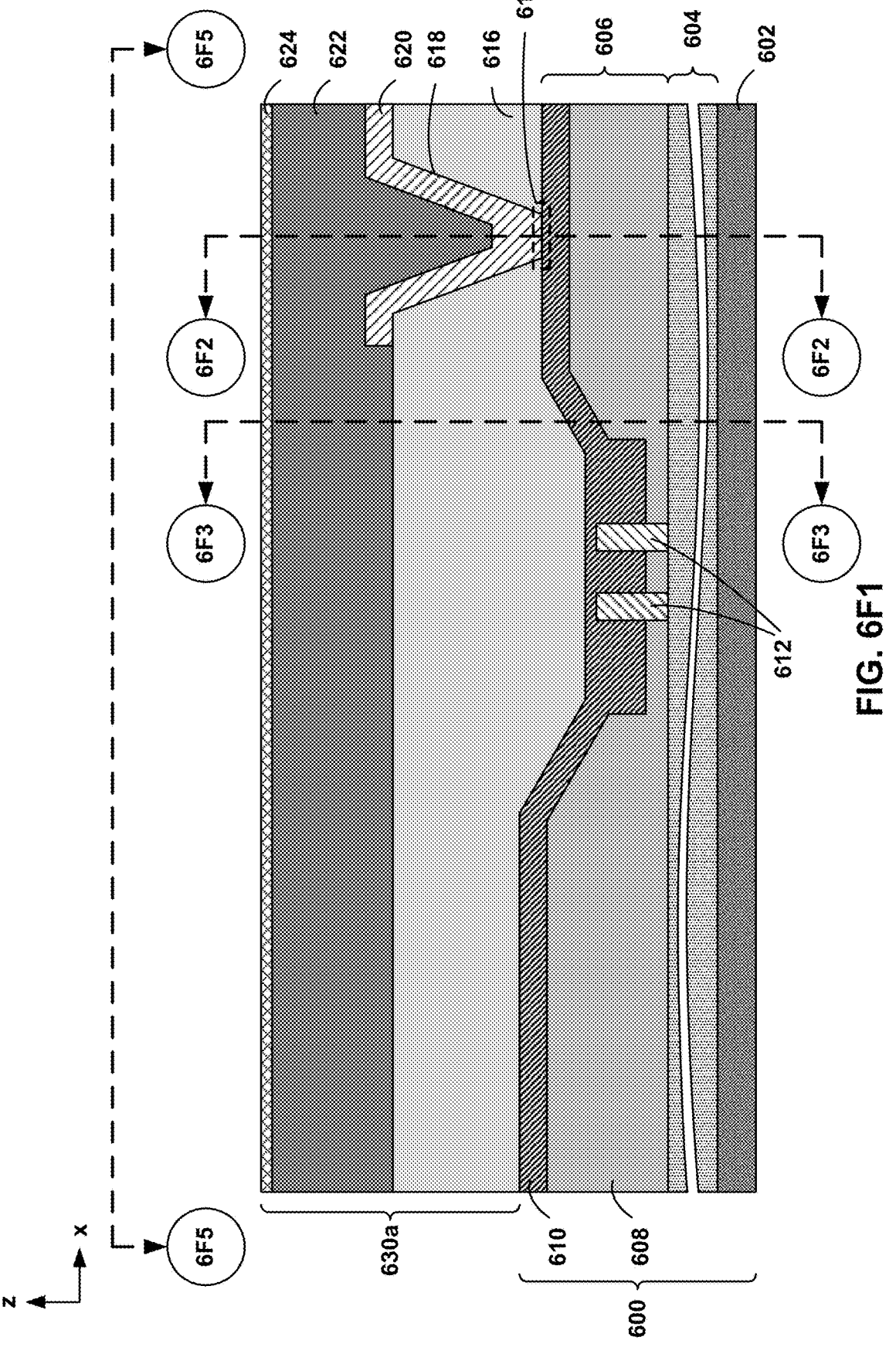
FIG. 6F1

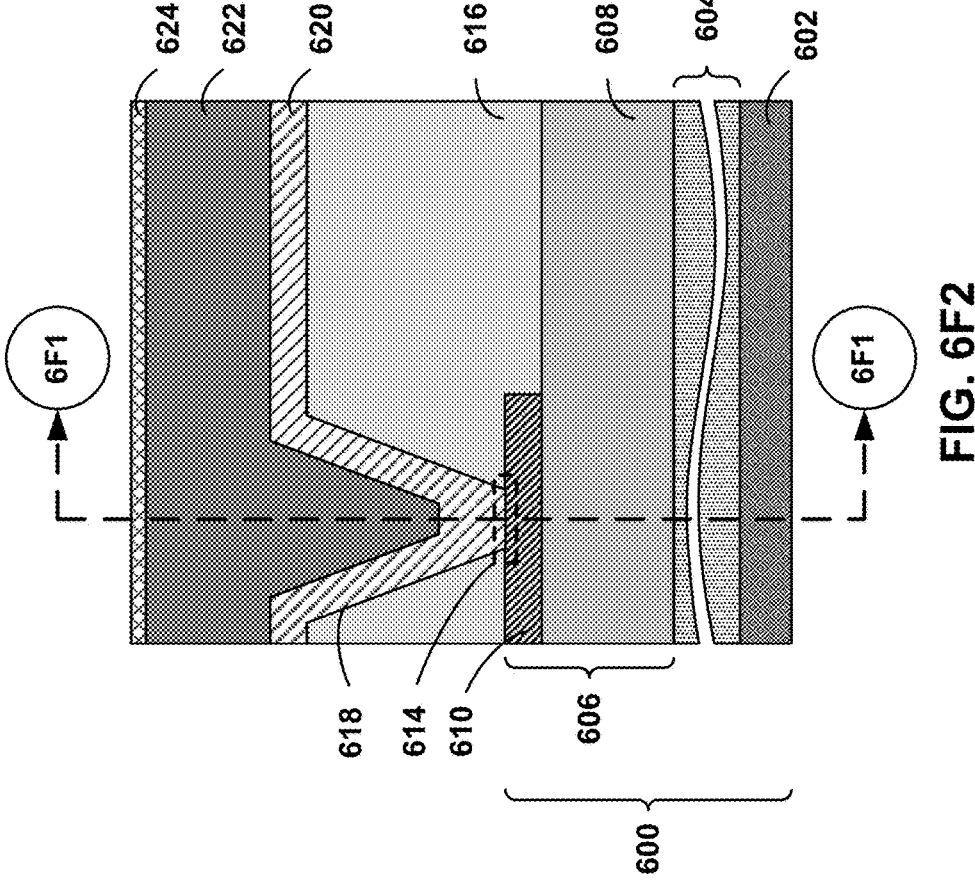
FIG. 6F2

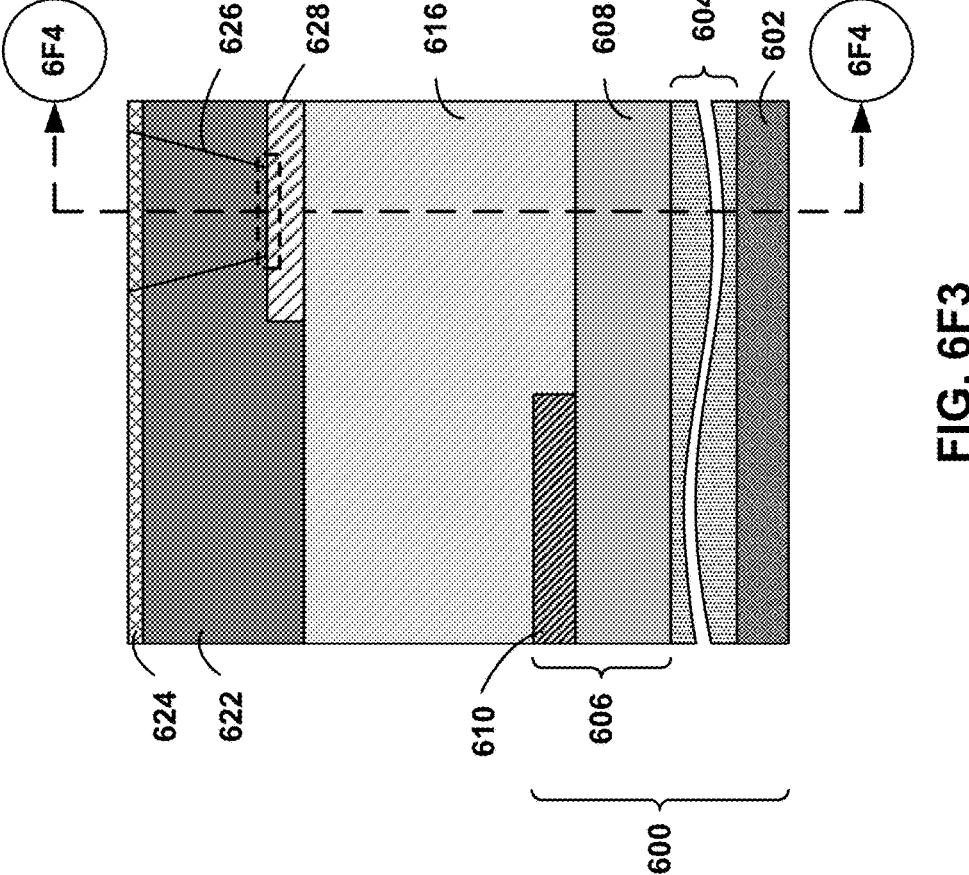
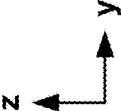
FIG. 6F3

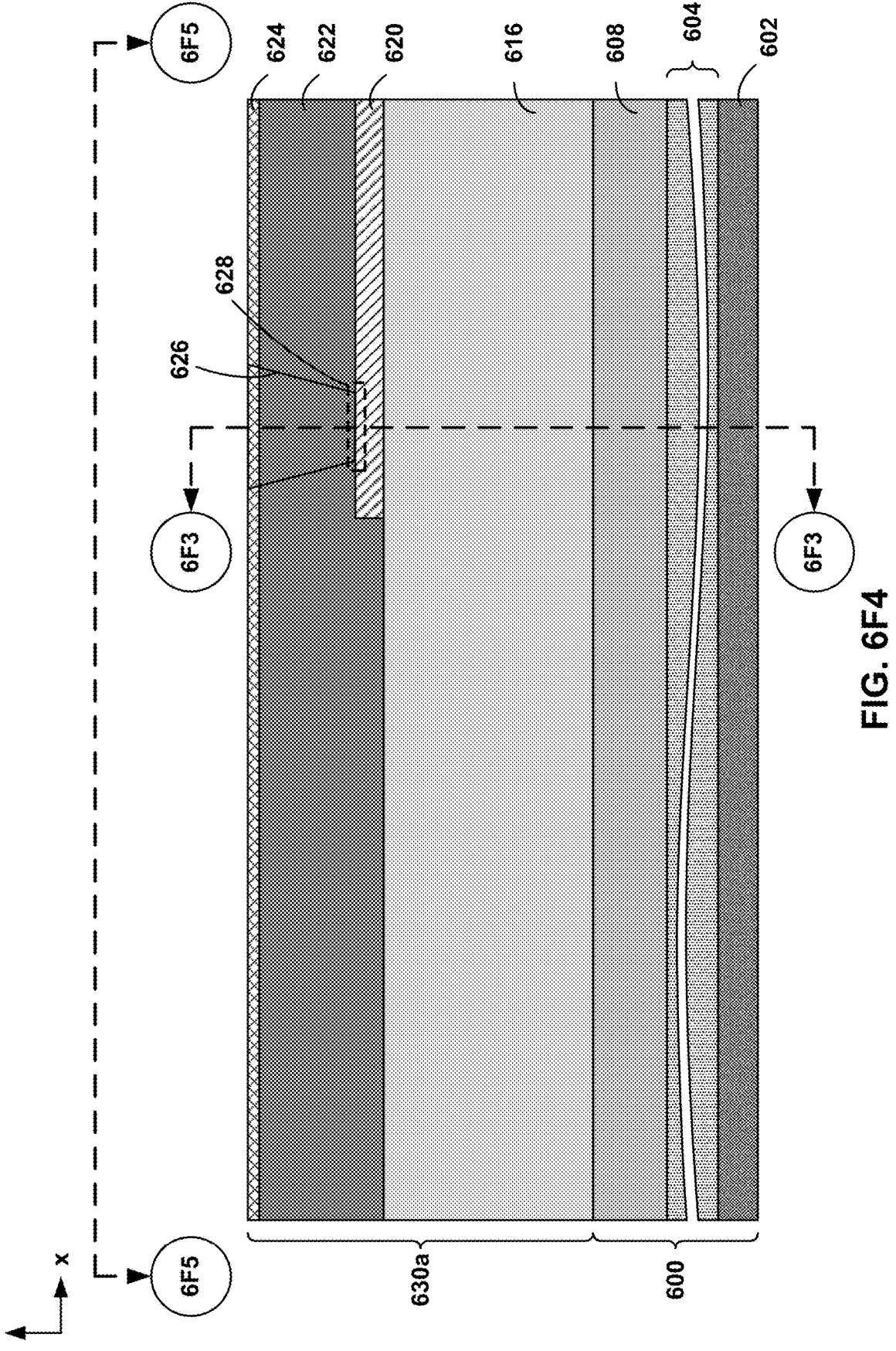
FIG. 6F4

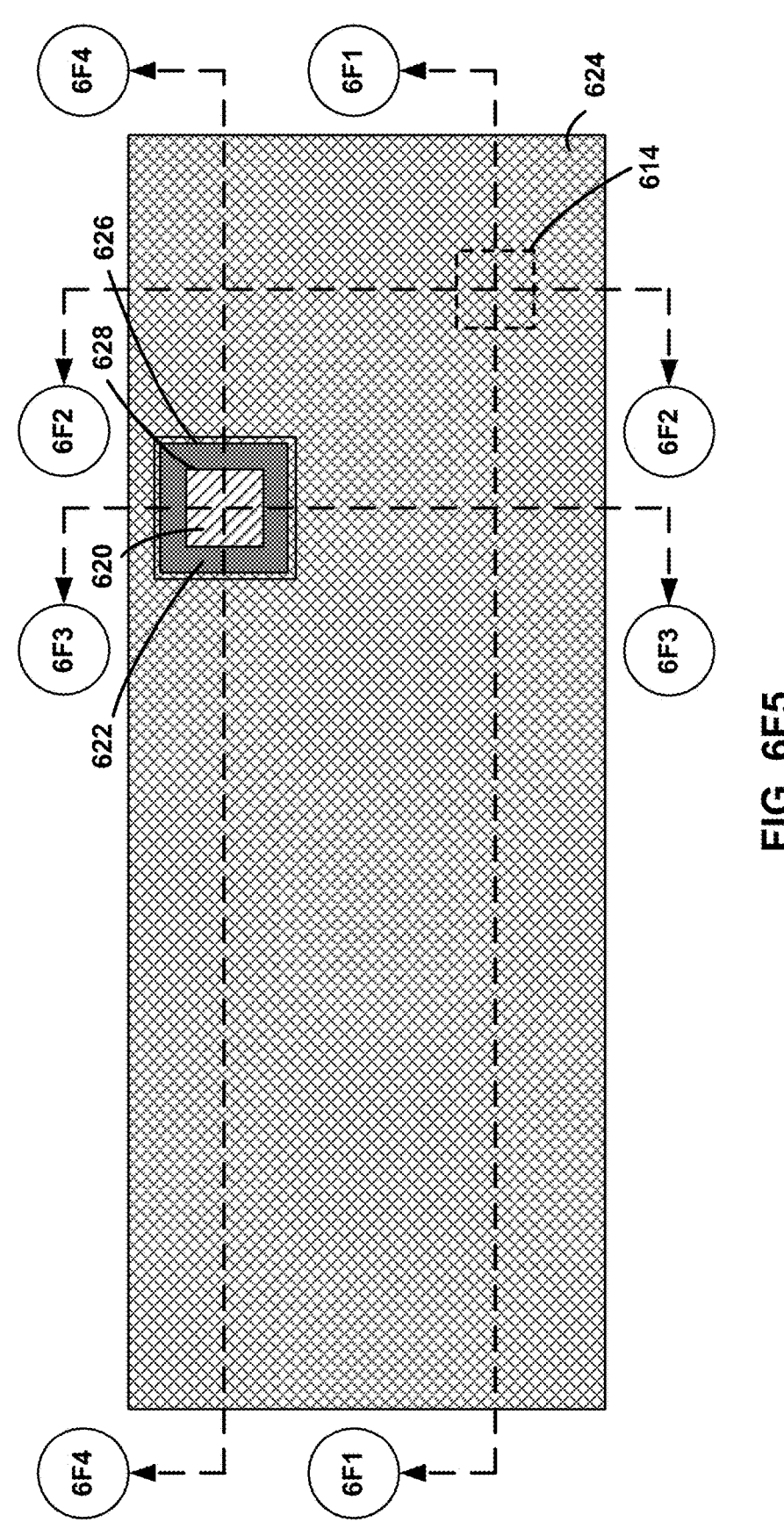
FIG. 6F5

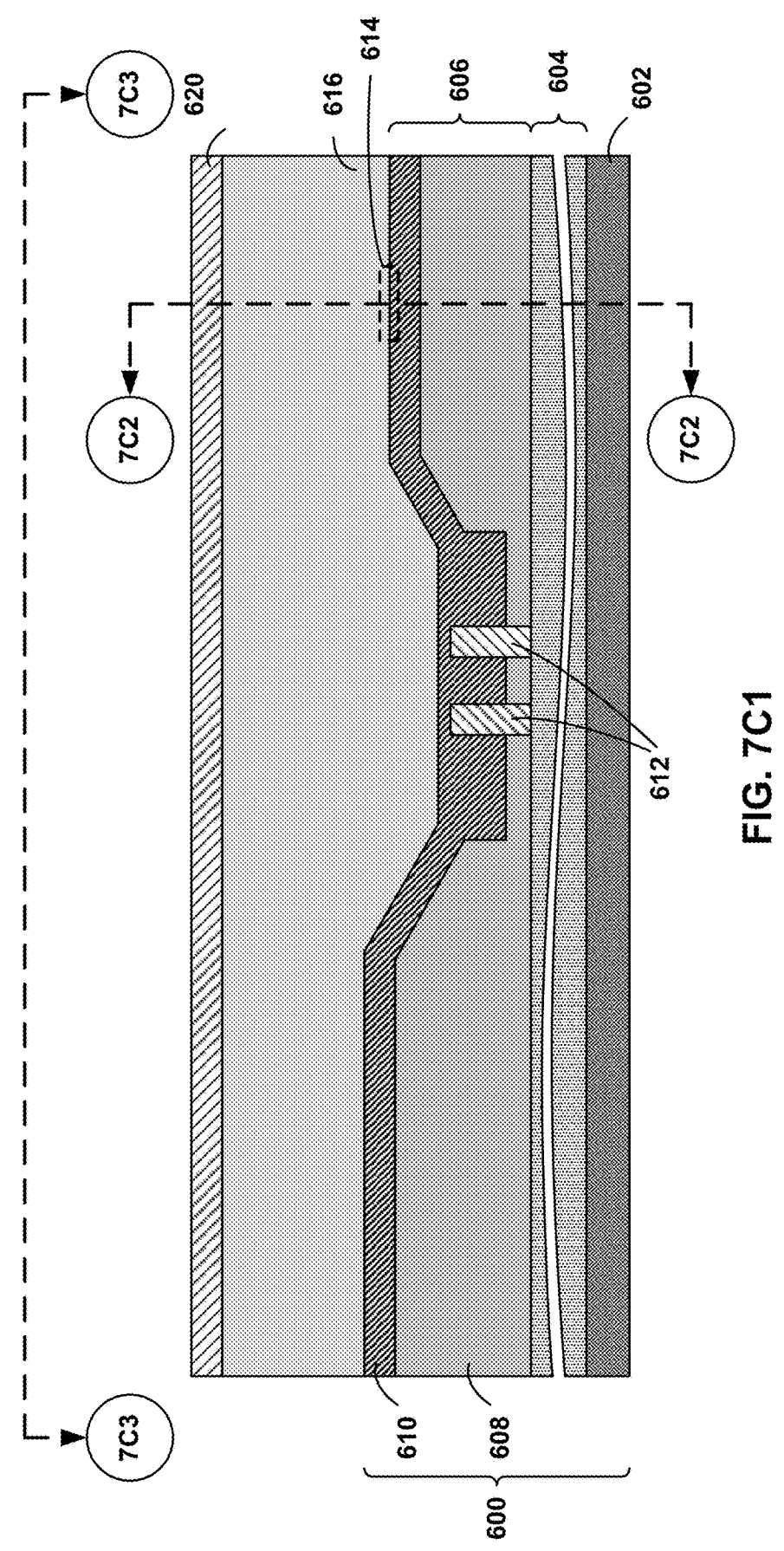
FIG. 7C1

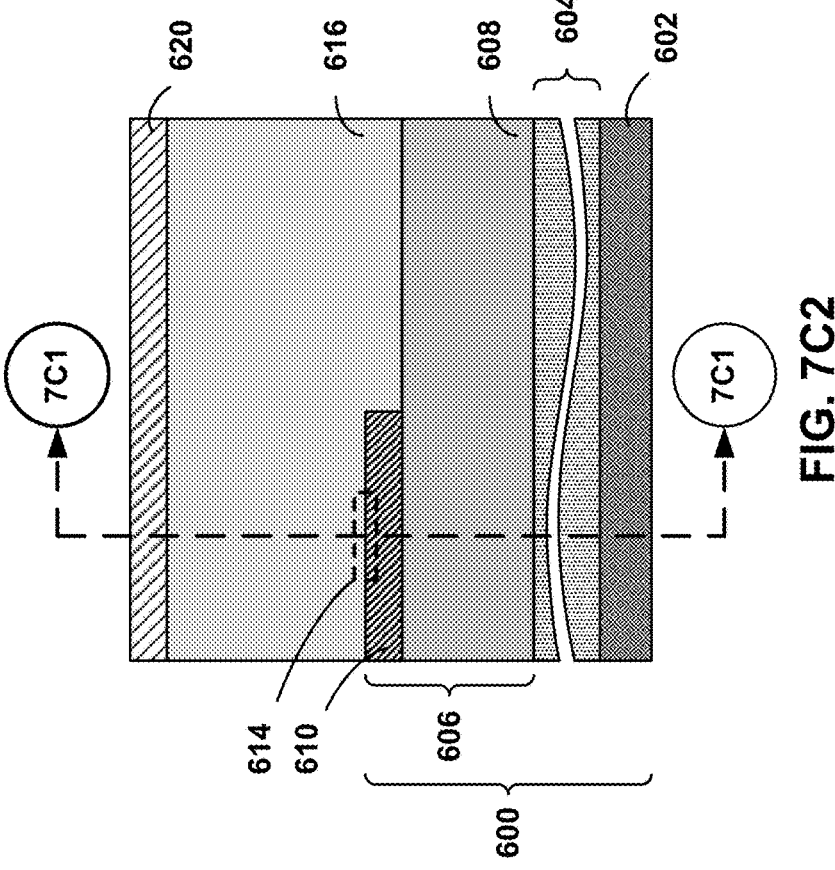
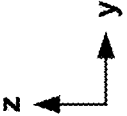
FIG. 7C2

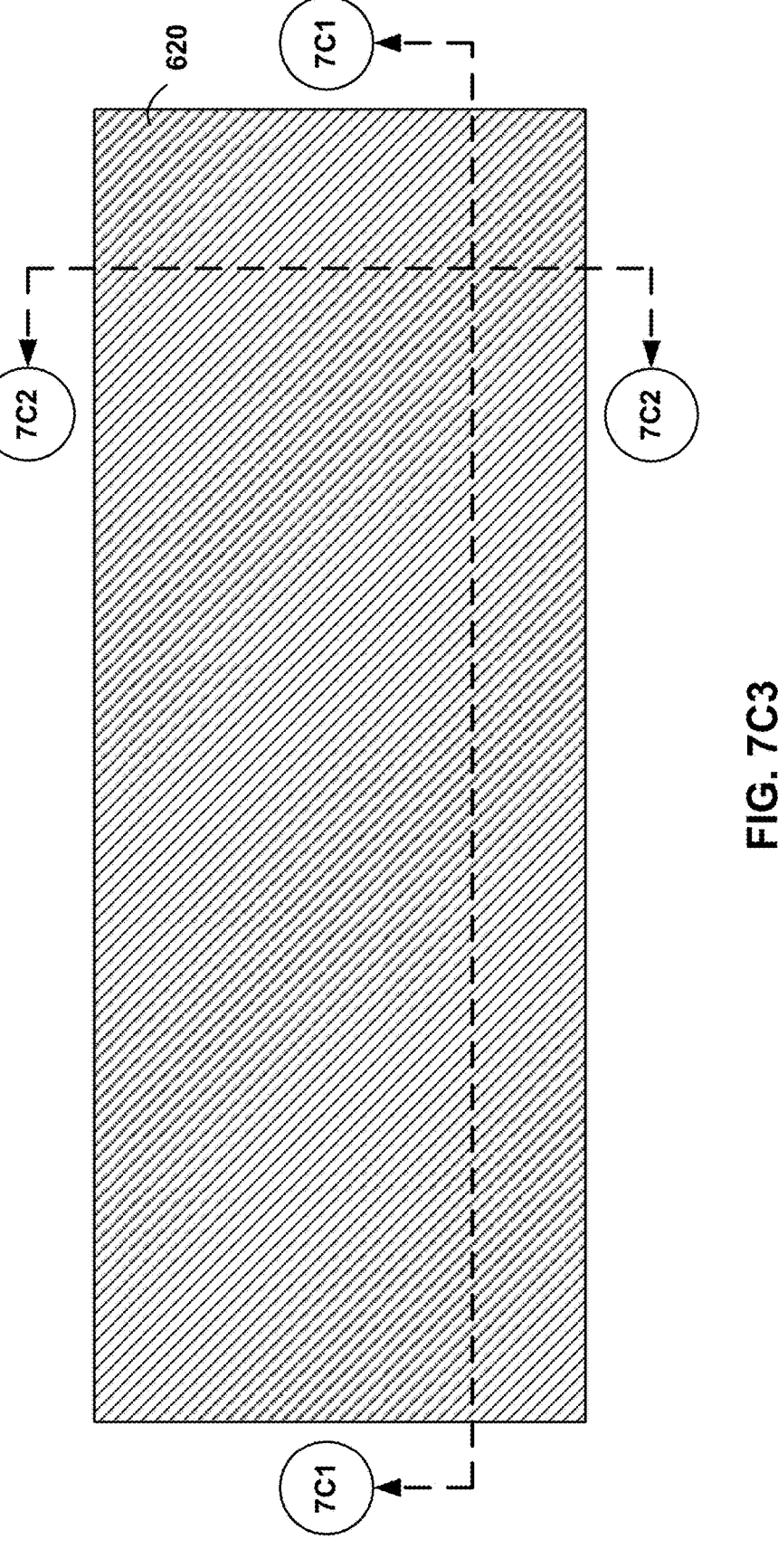
FIG. 7C3

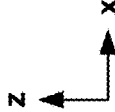
FIG. 7D1

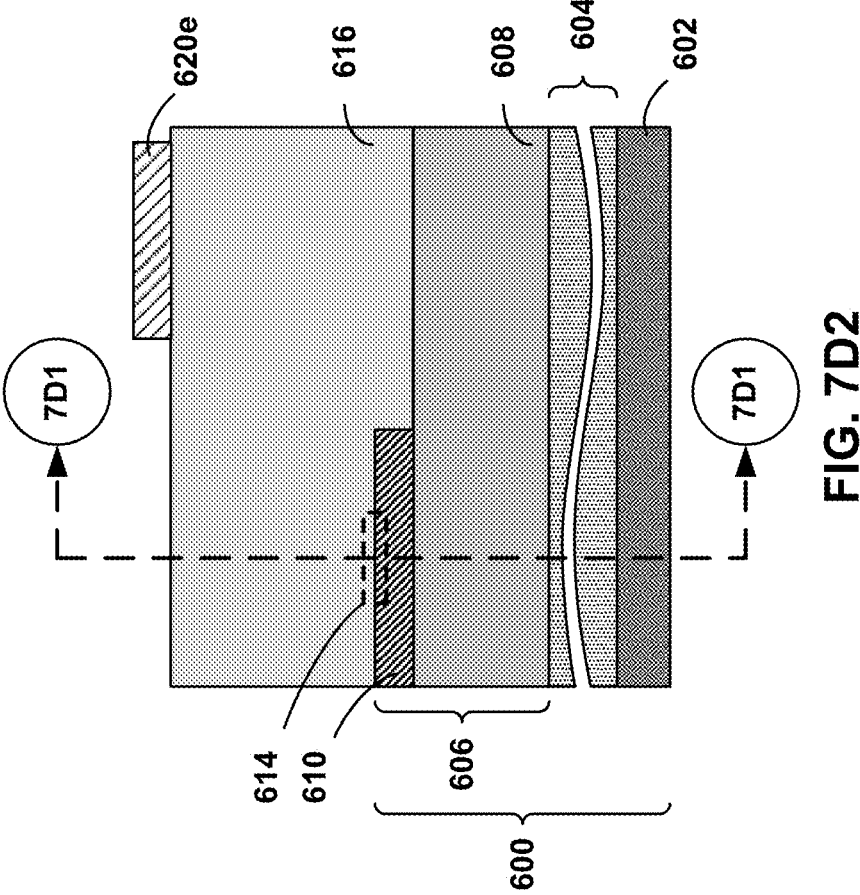
FIG. 7D2
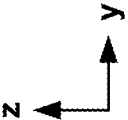

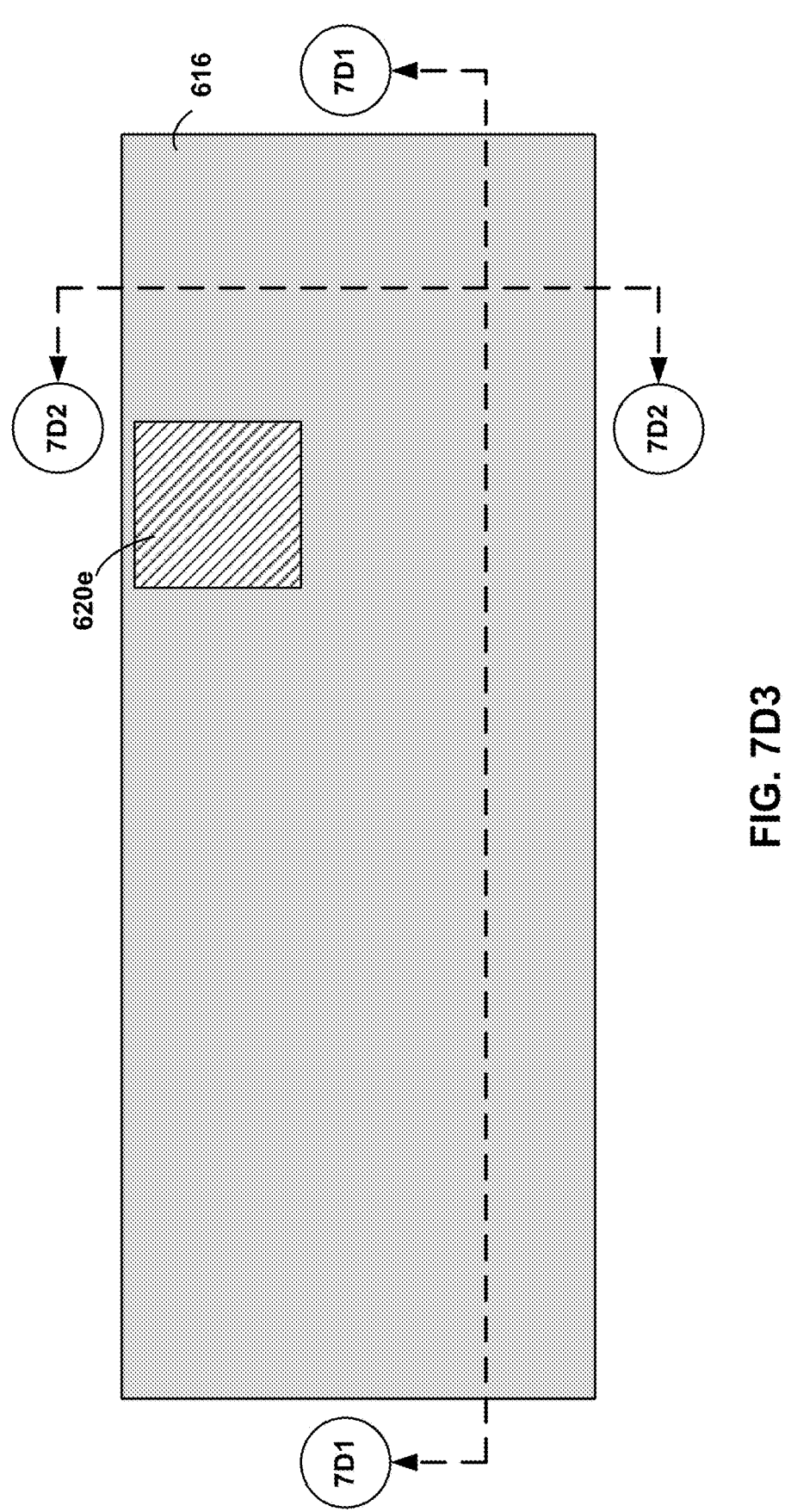
FIG. 7D3

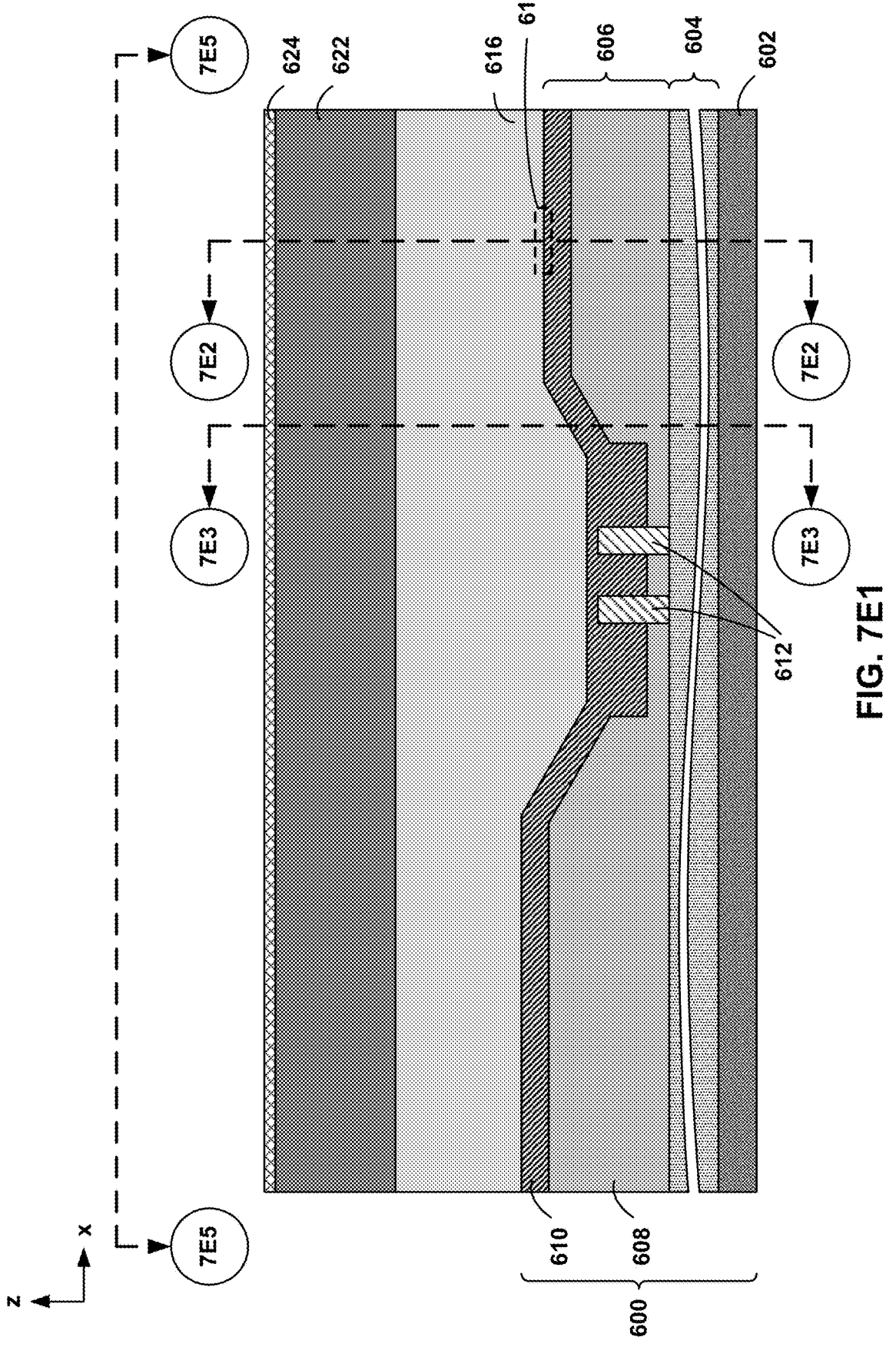
FIG. 7E1

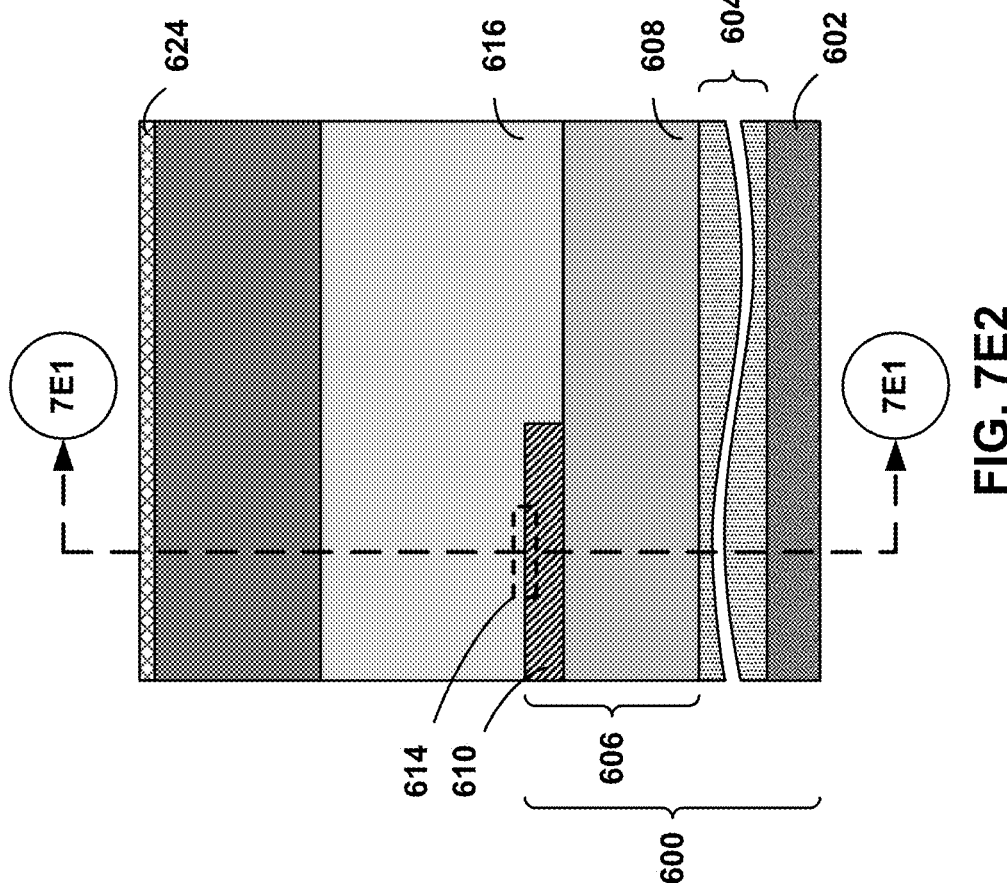
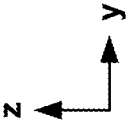
FIG. 7E2

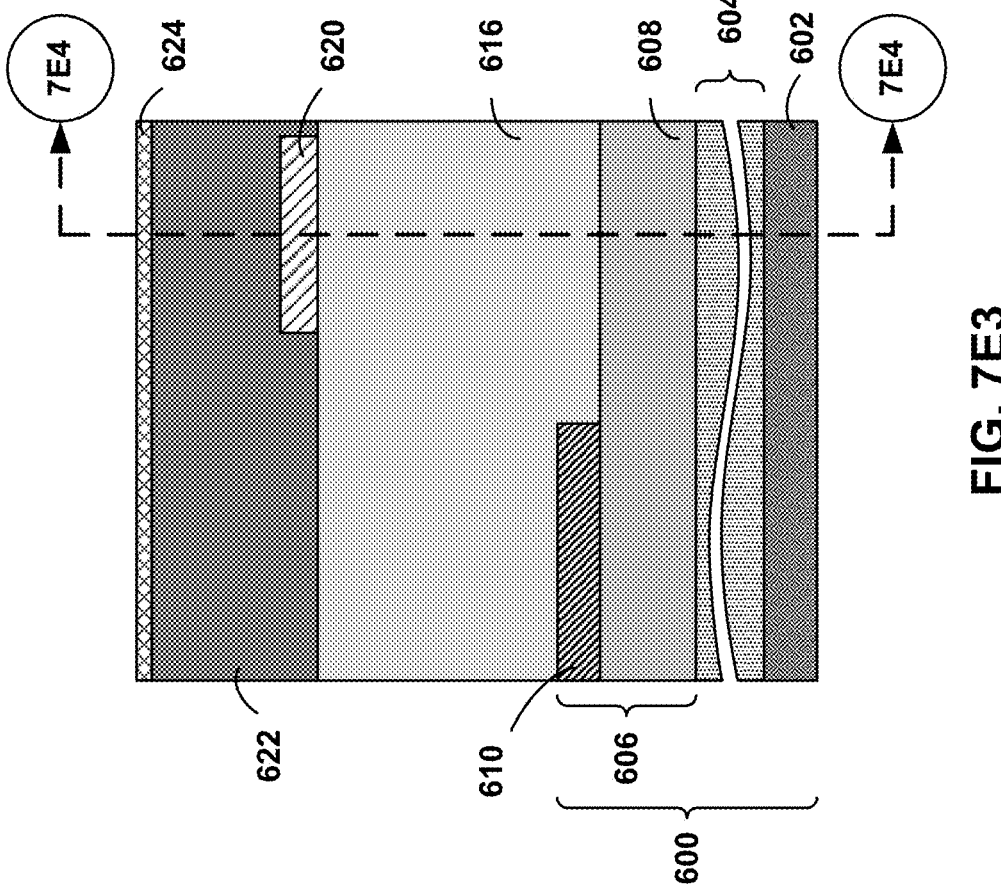
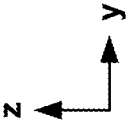
FIG. 7E3

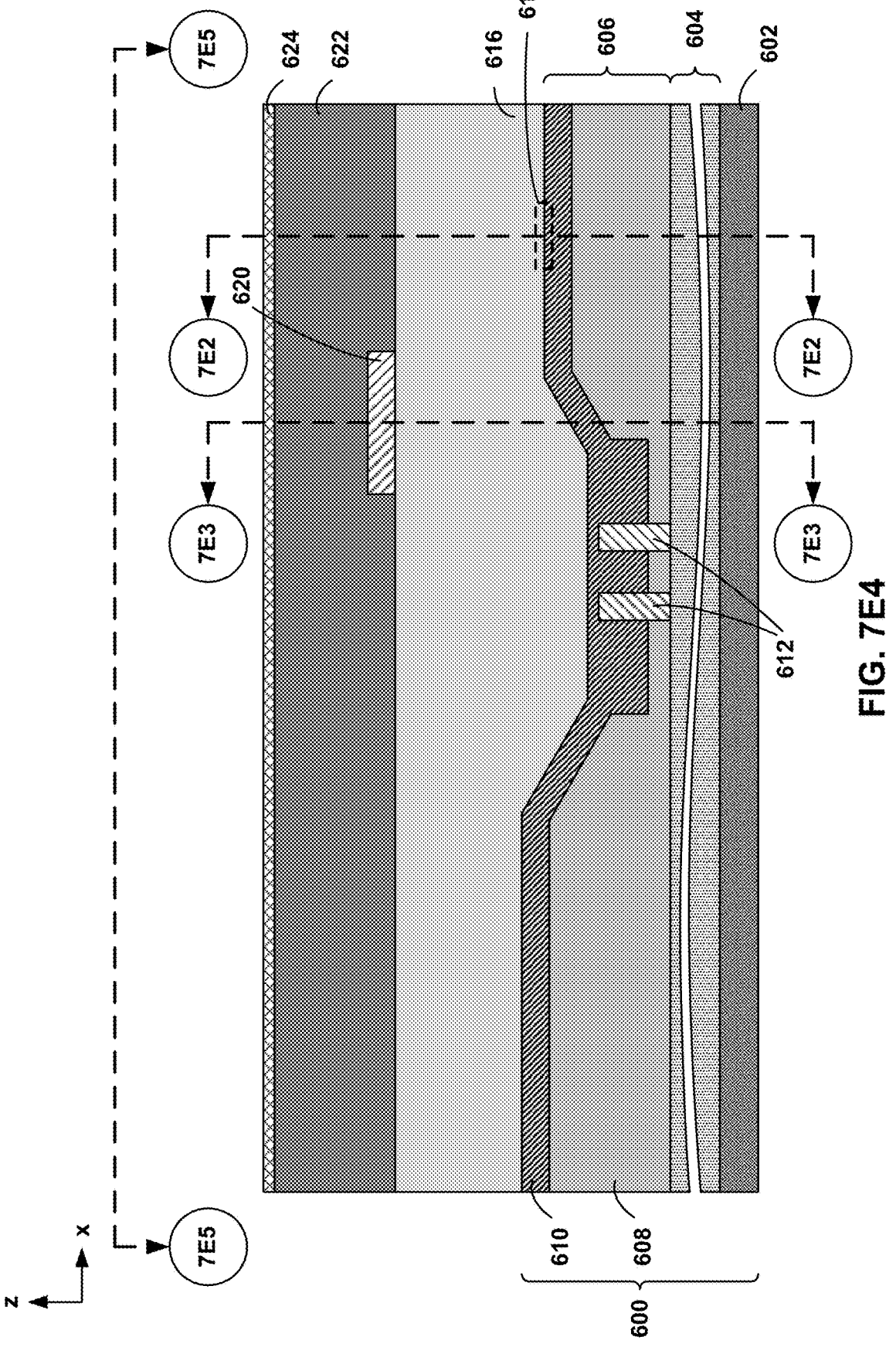
FIG. 7E4

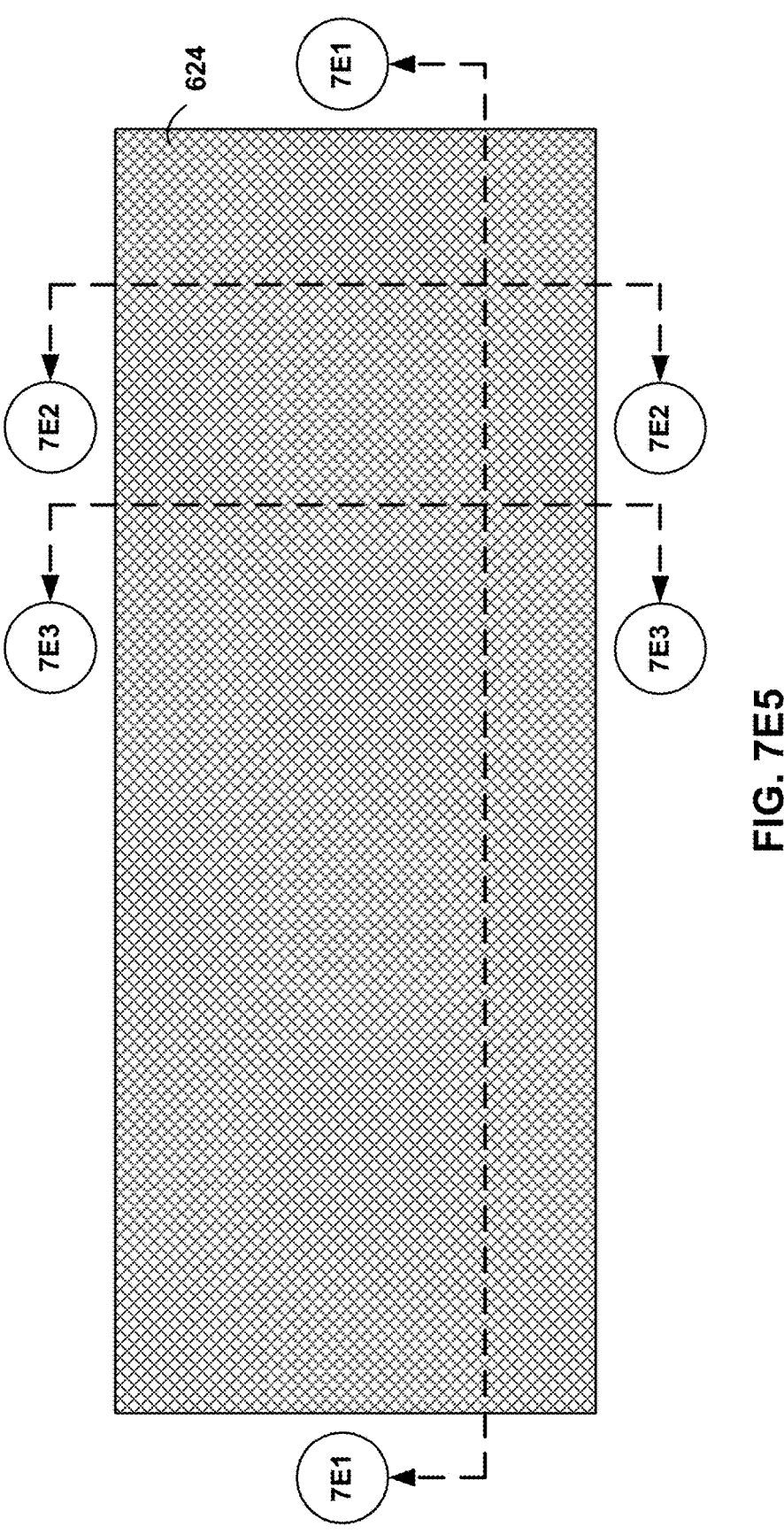
FIG. 7E5

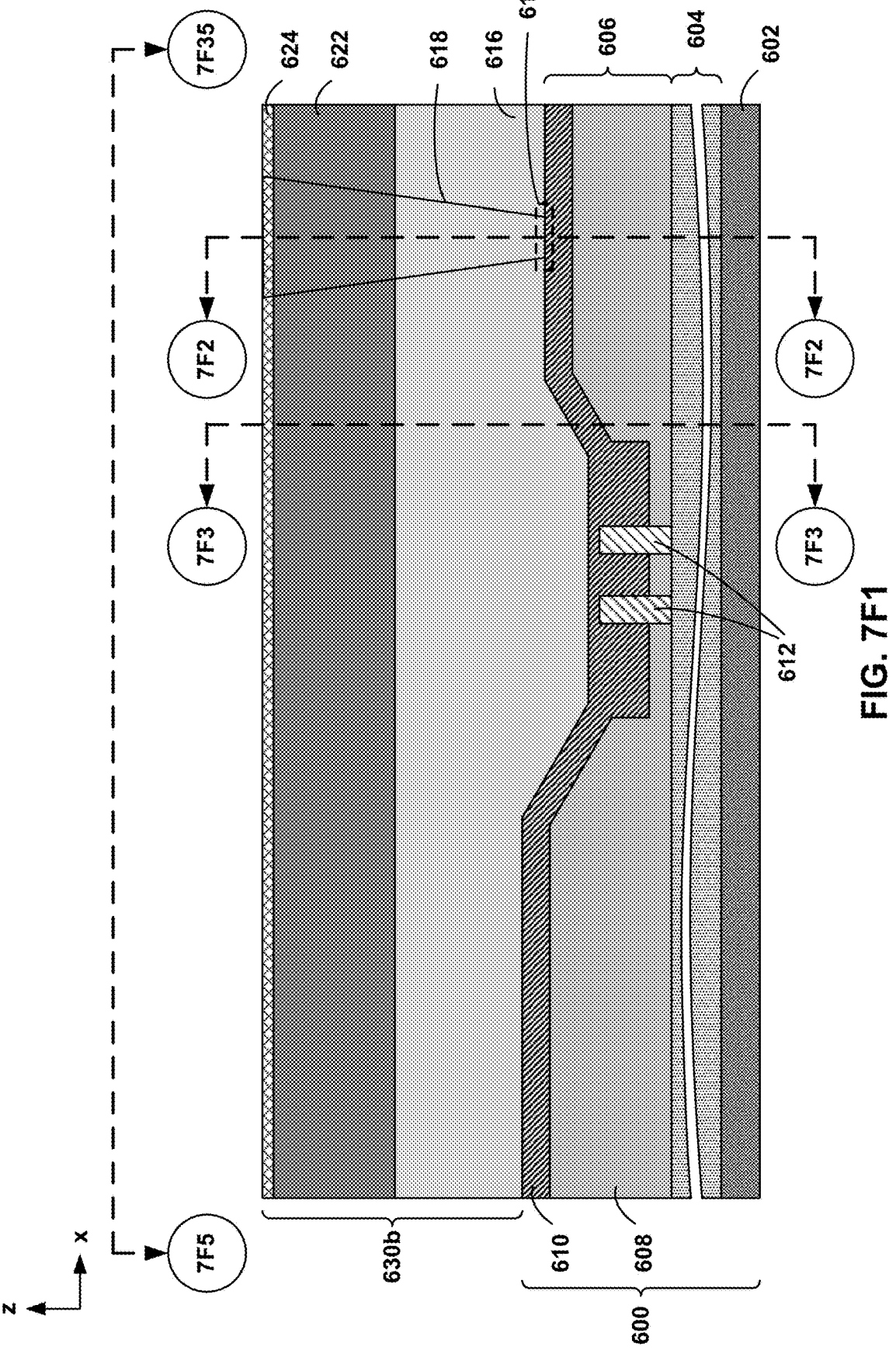
FIG. 7F1

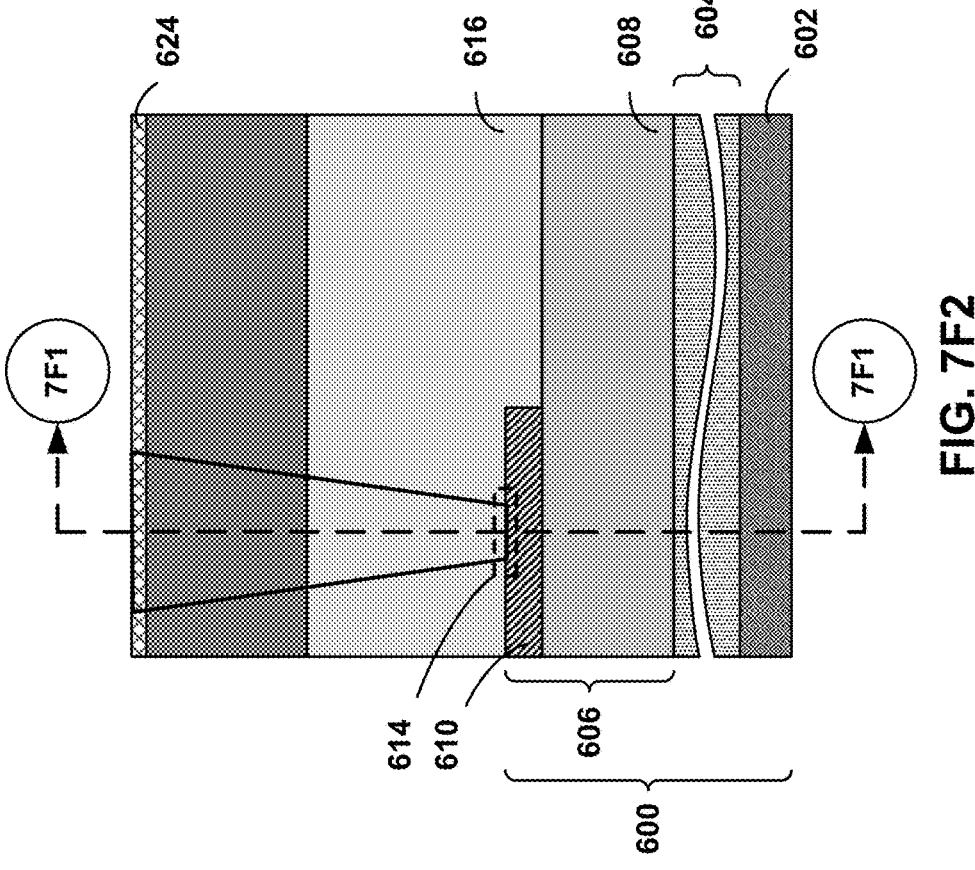
FIG. 7F2
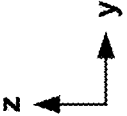

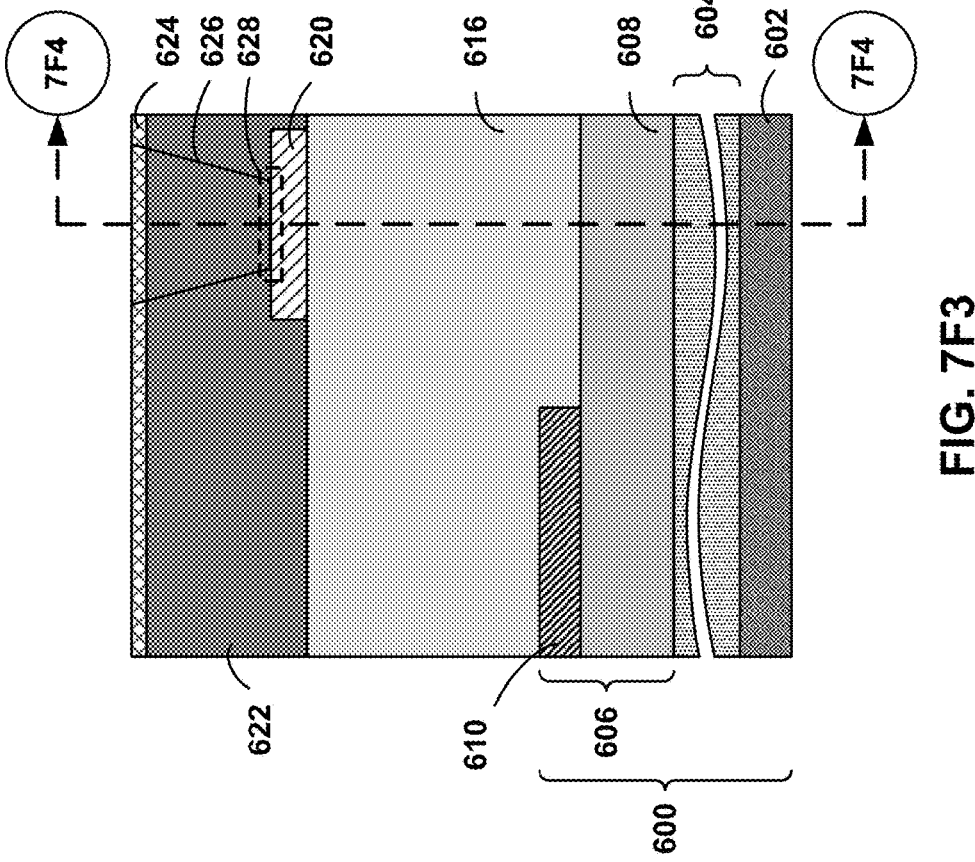
FIG. 7F3

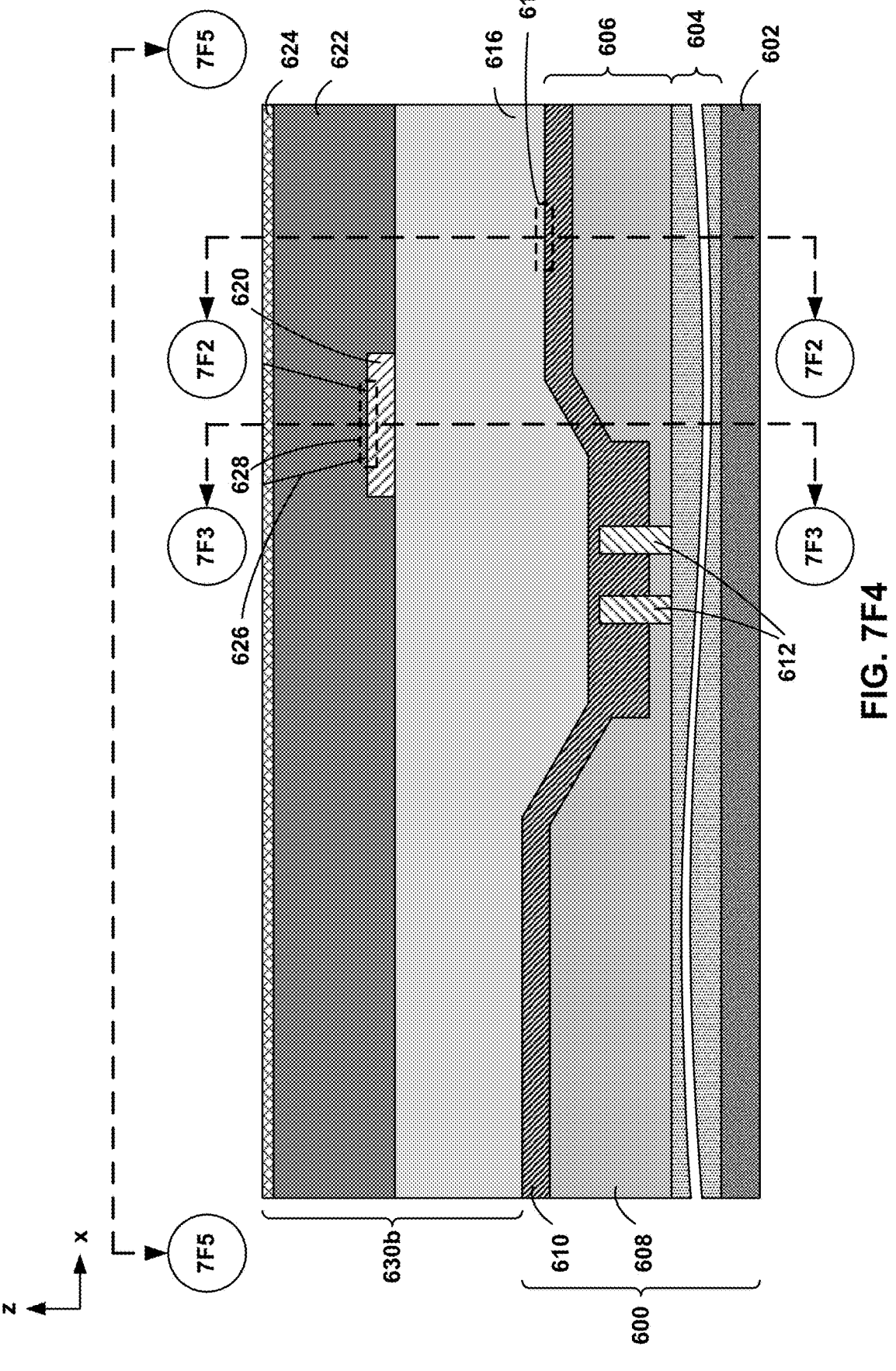
FIG. 7F4

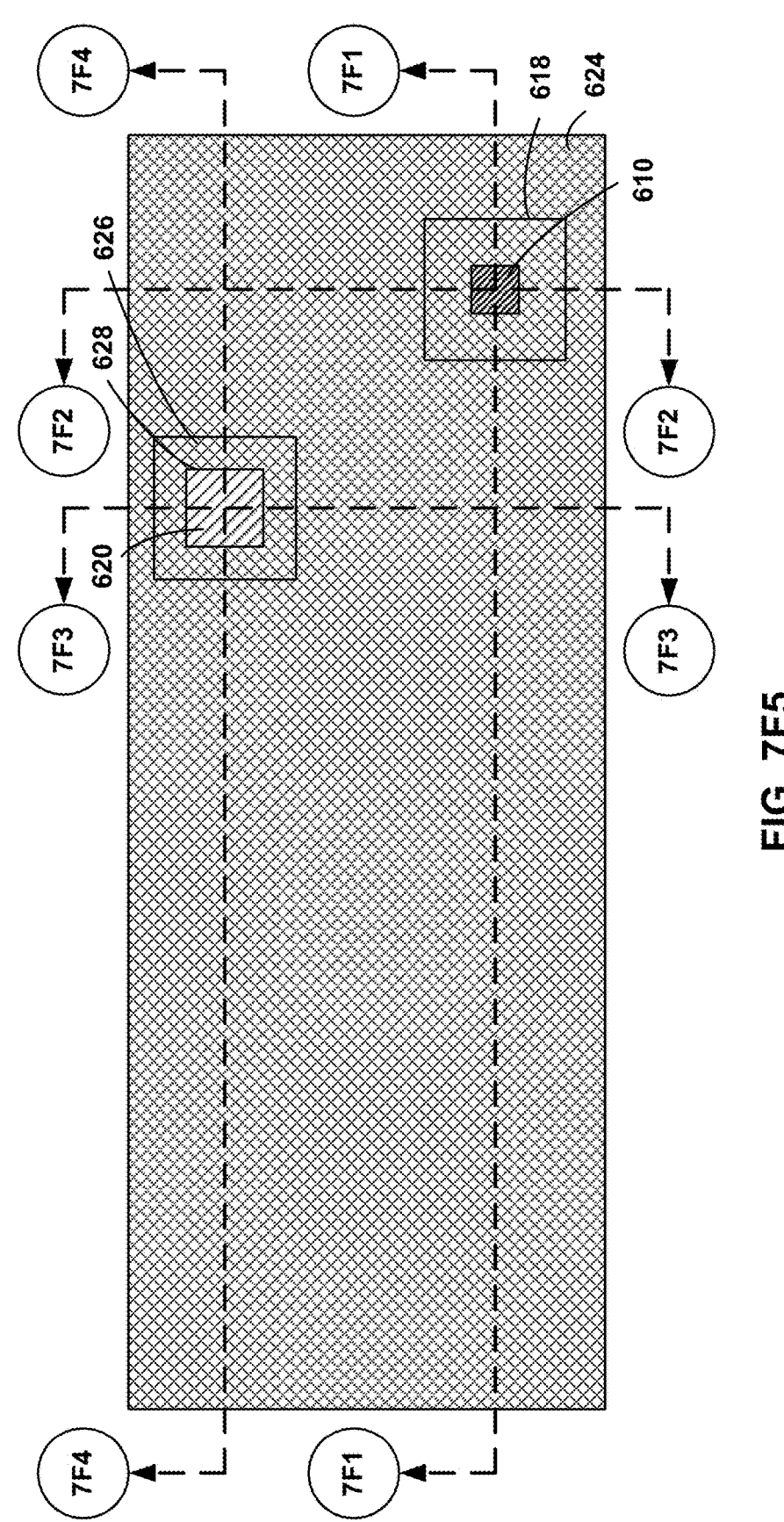
FIG. 7F5

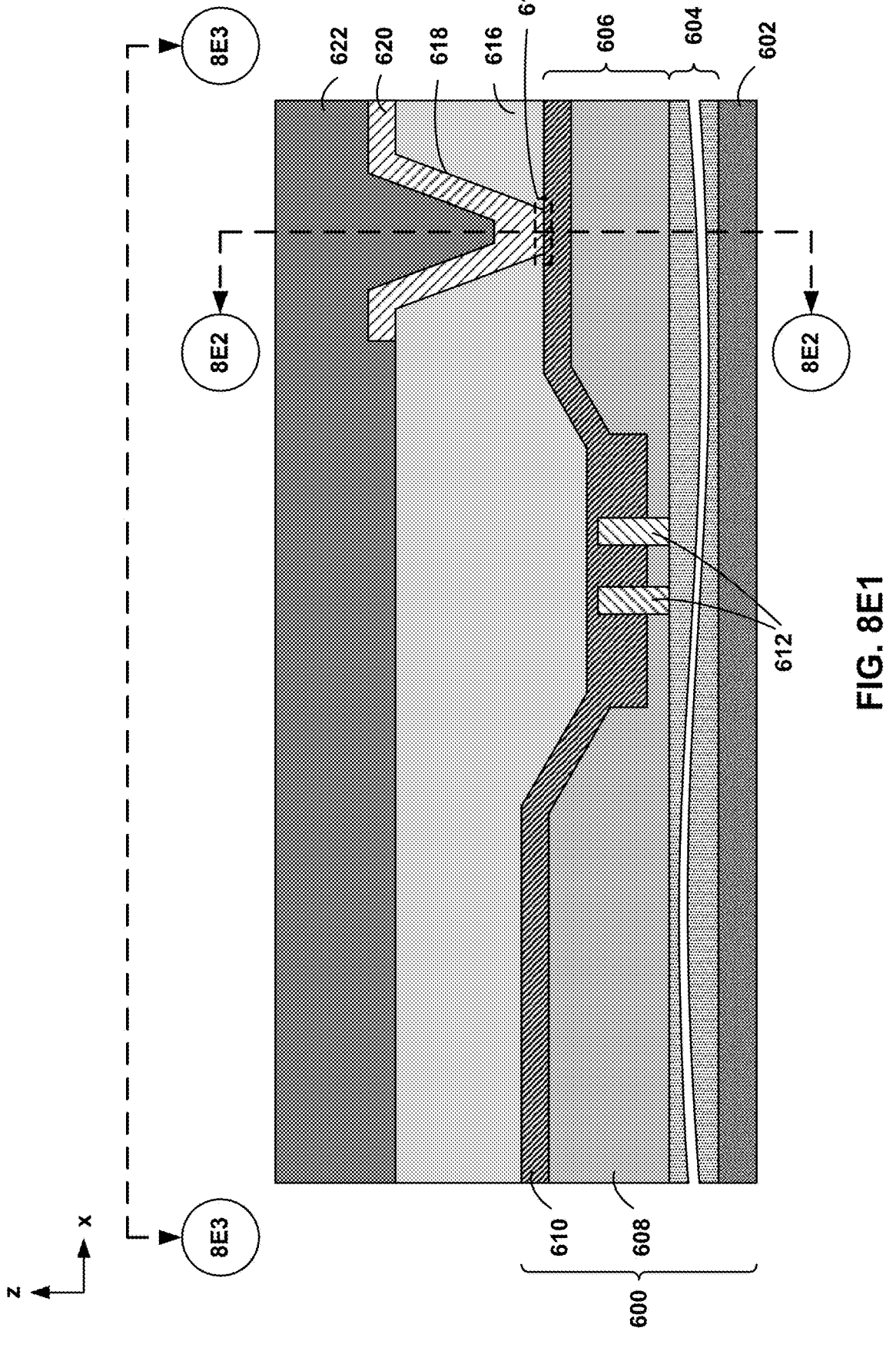
FIG. 8E1

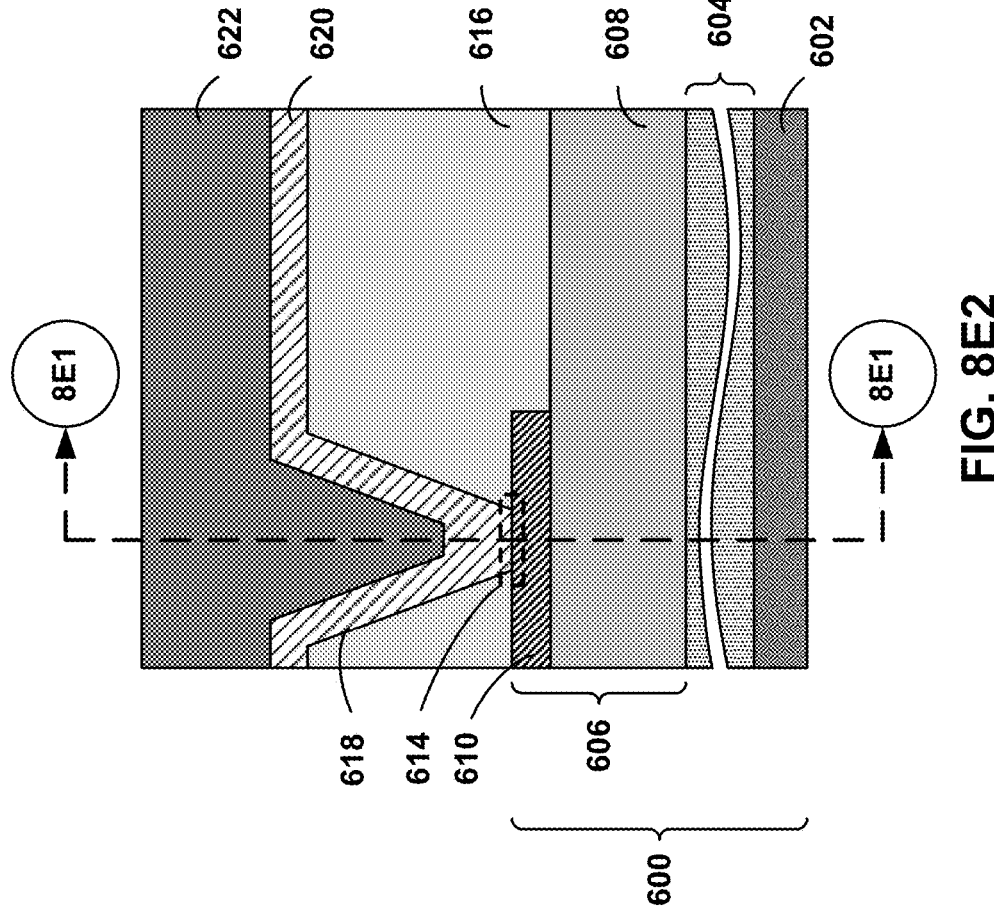
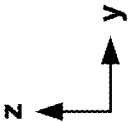
FIG. 8E2

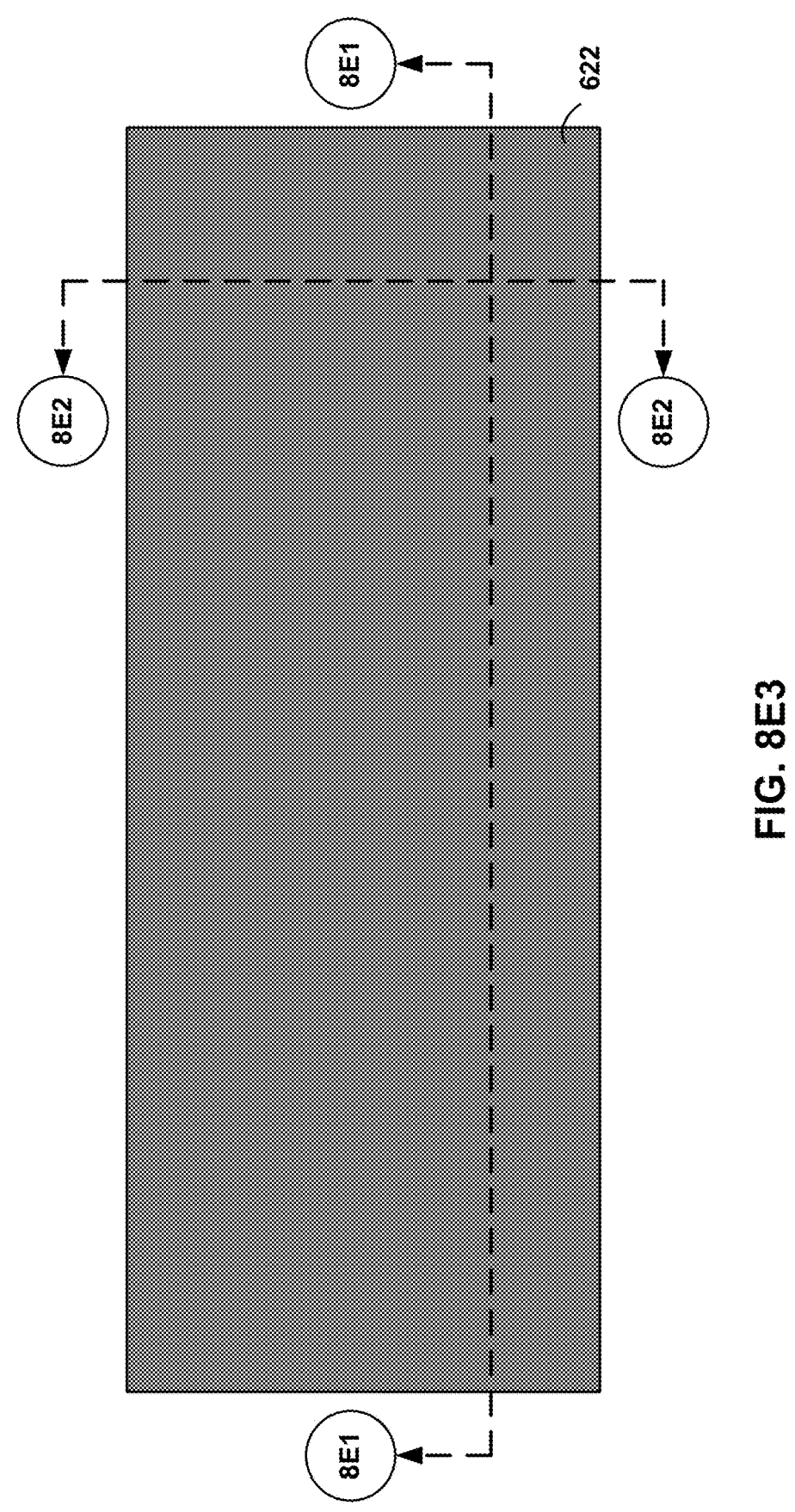
FIG. 8E3

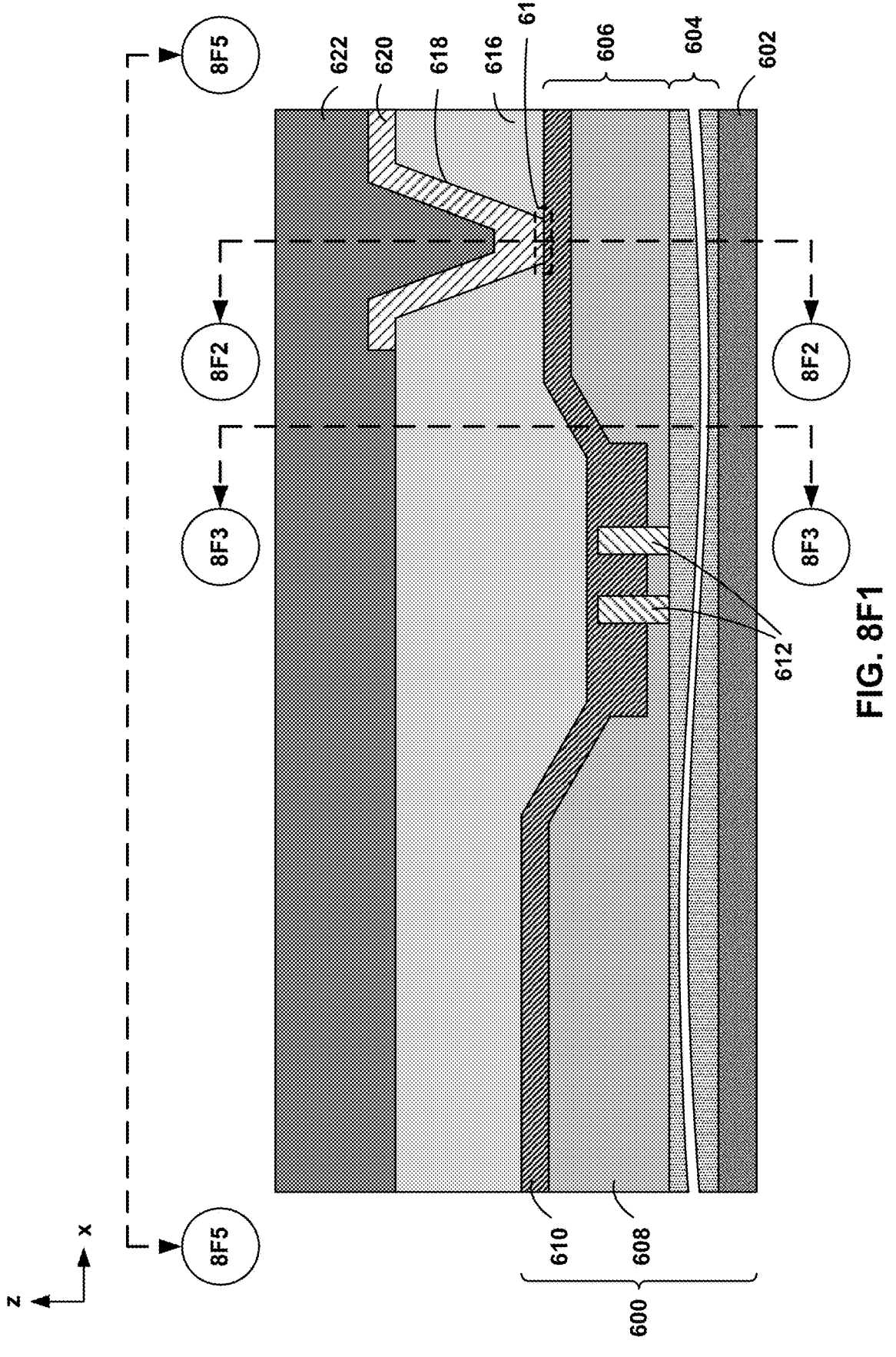
FIG. 8F1

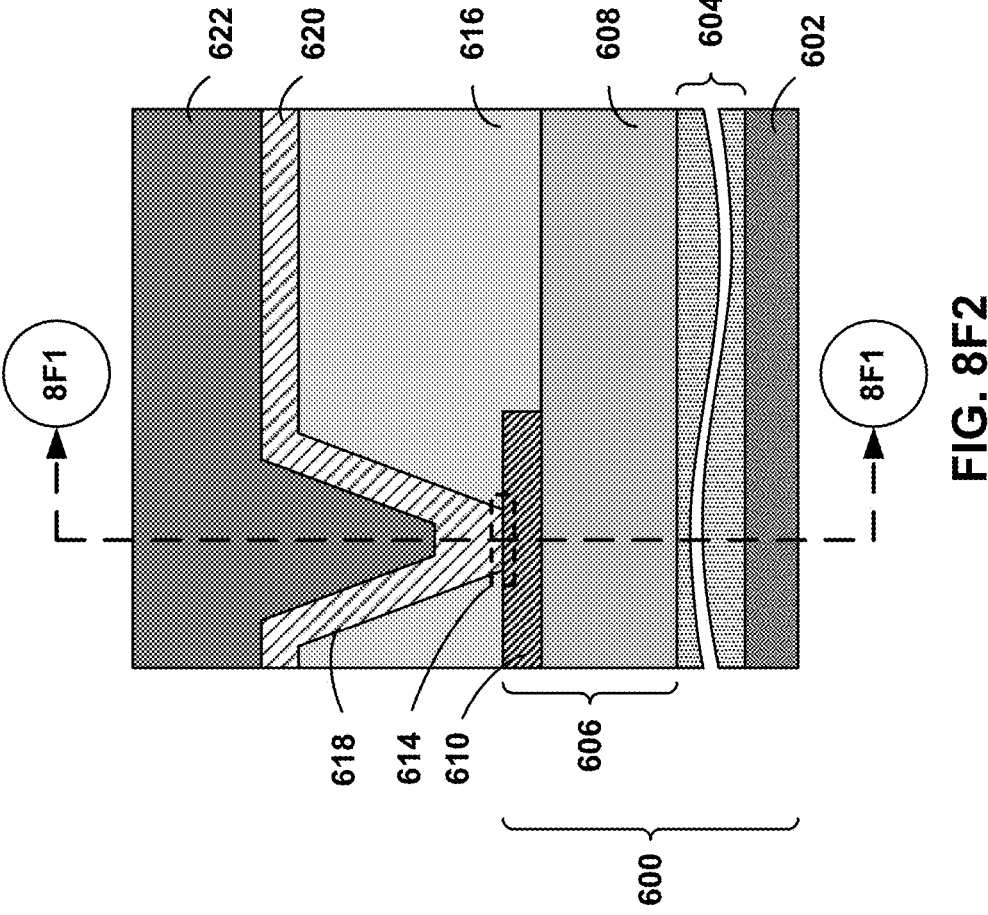
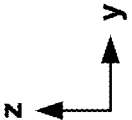
FIG. 8F2

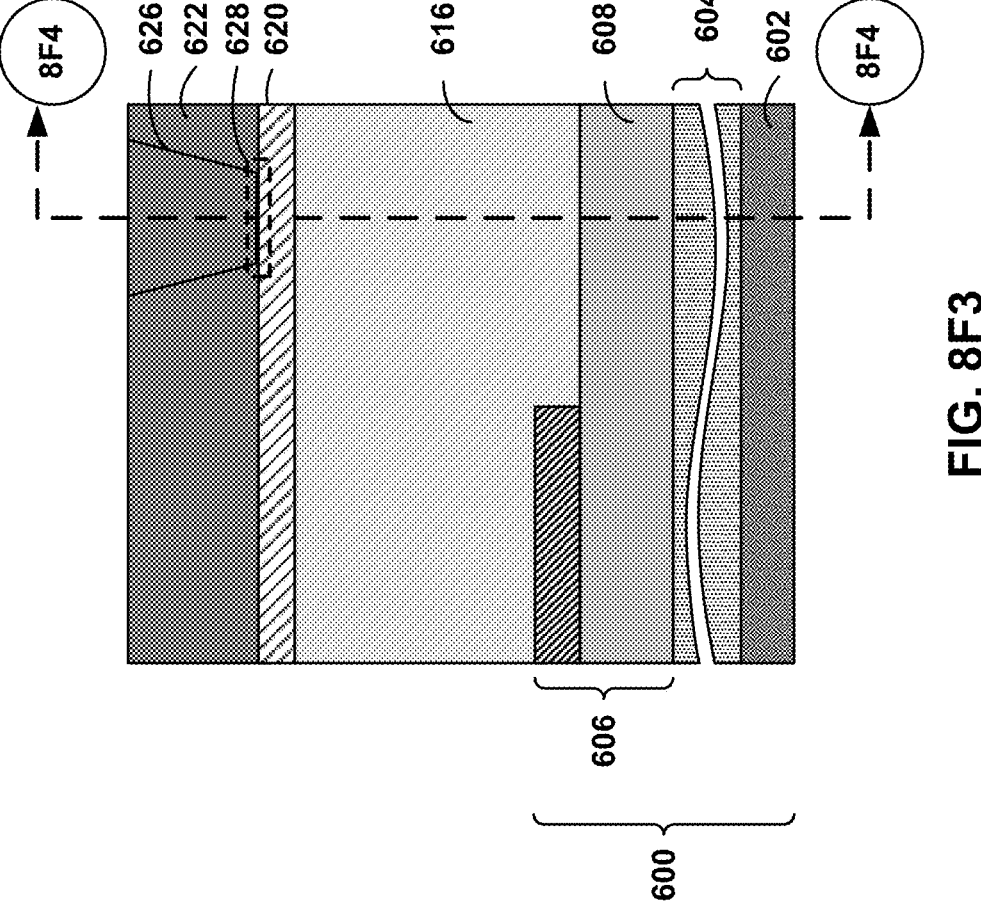
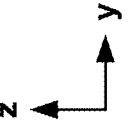
FIG. 8F3

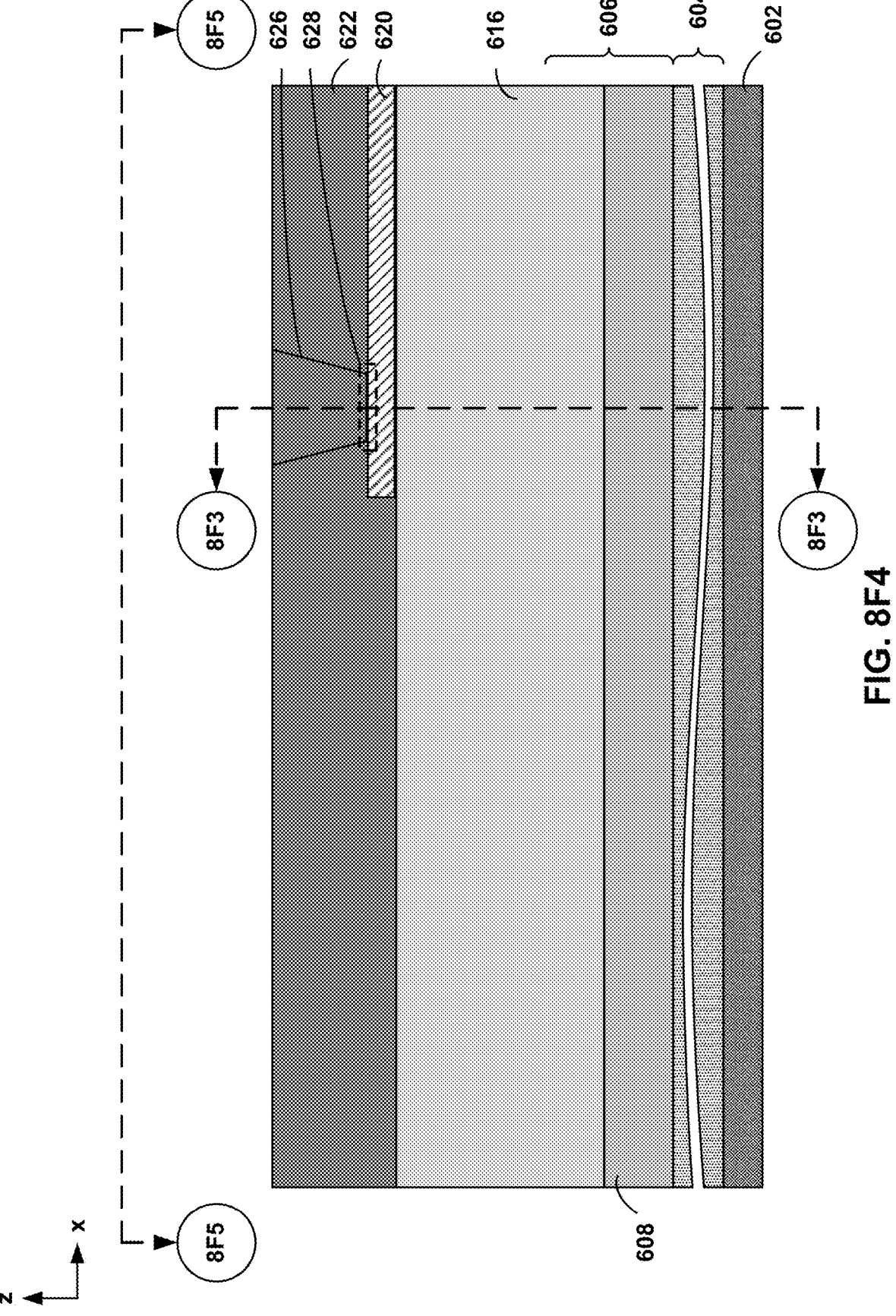
FIG. 8F4

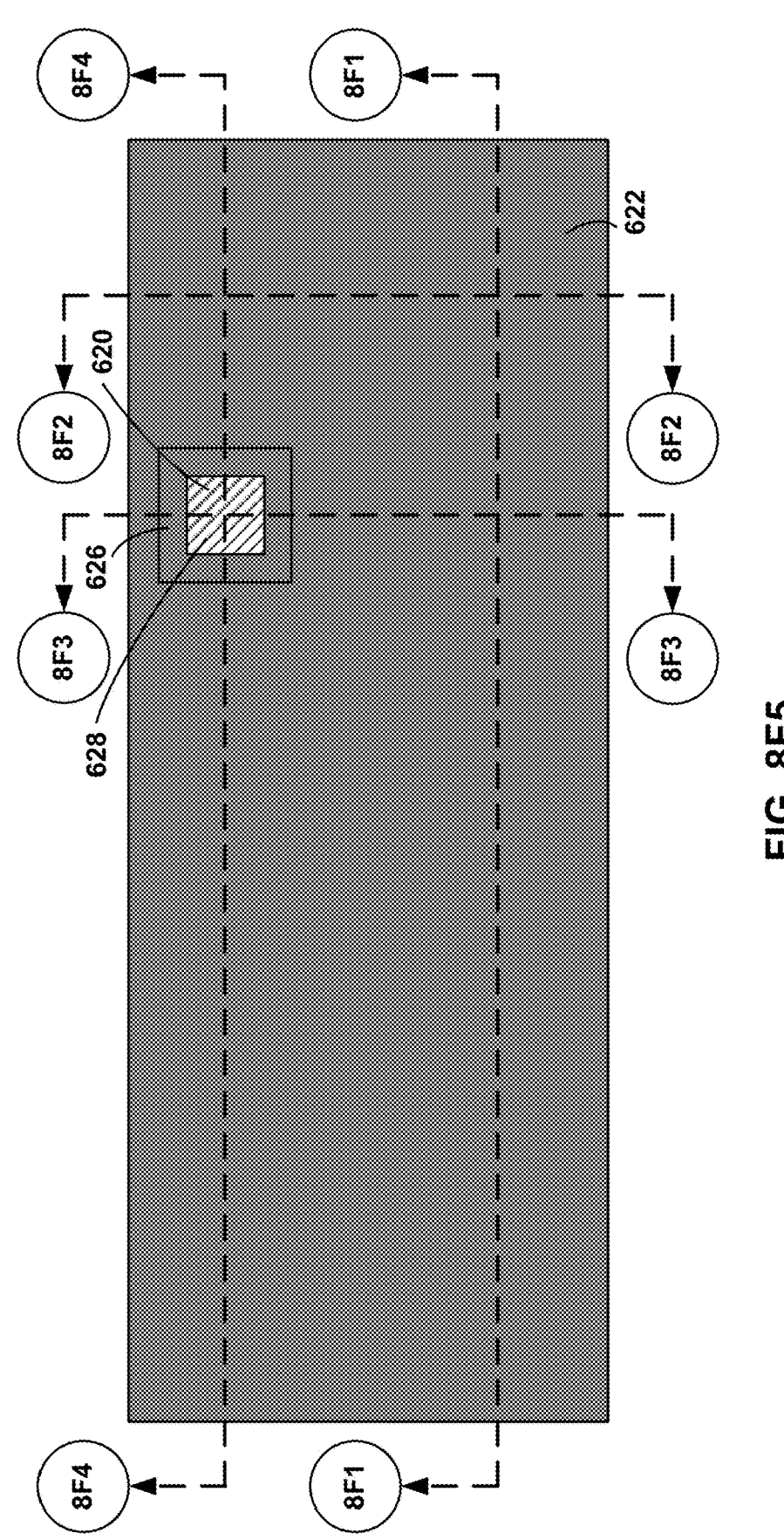
FIG. 8F5

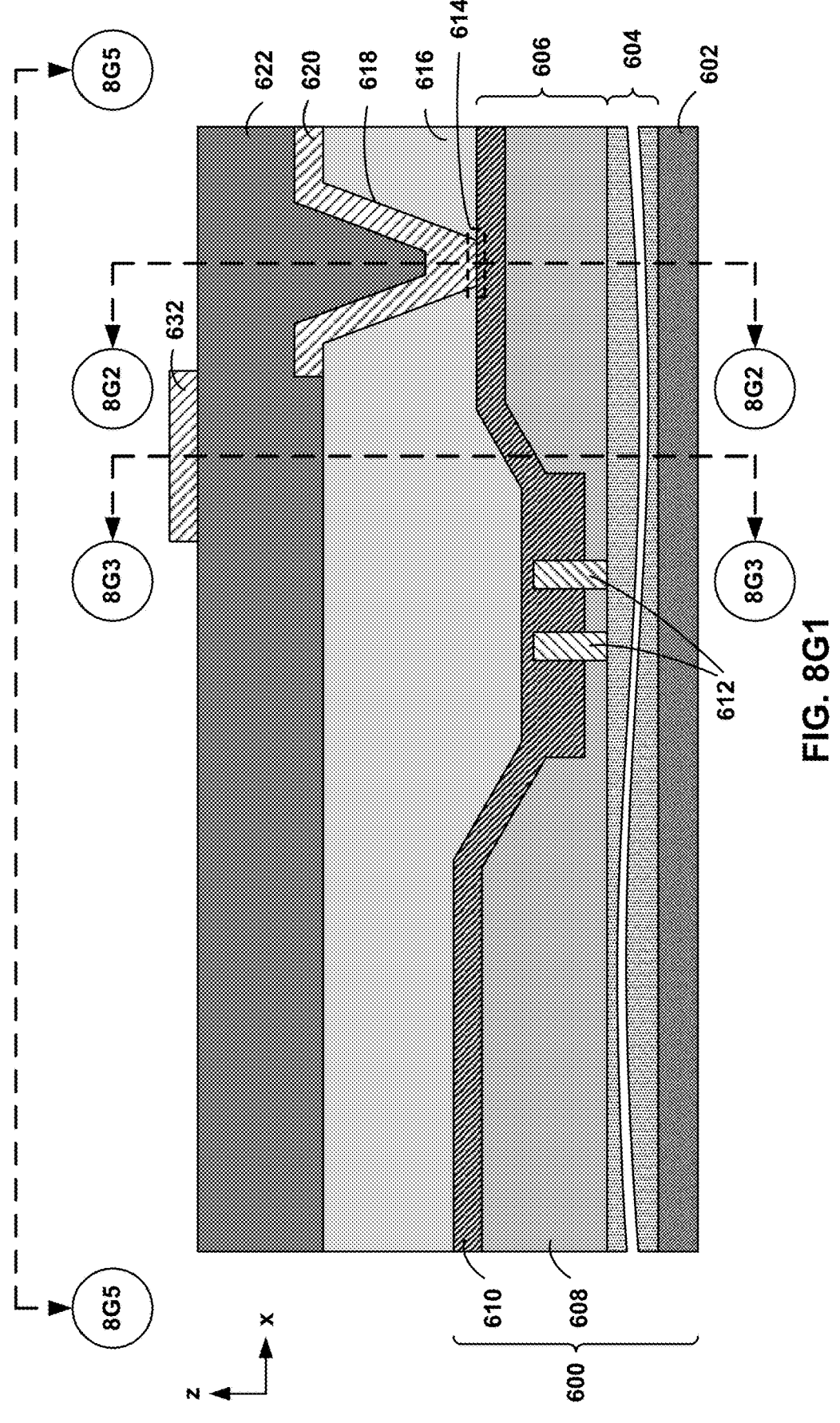
FIG. 8G1

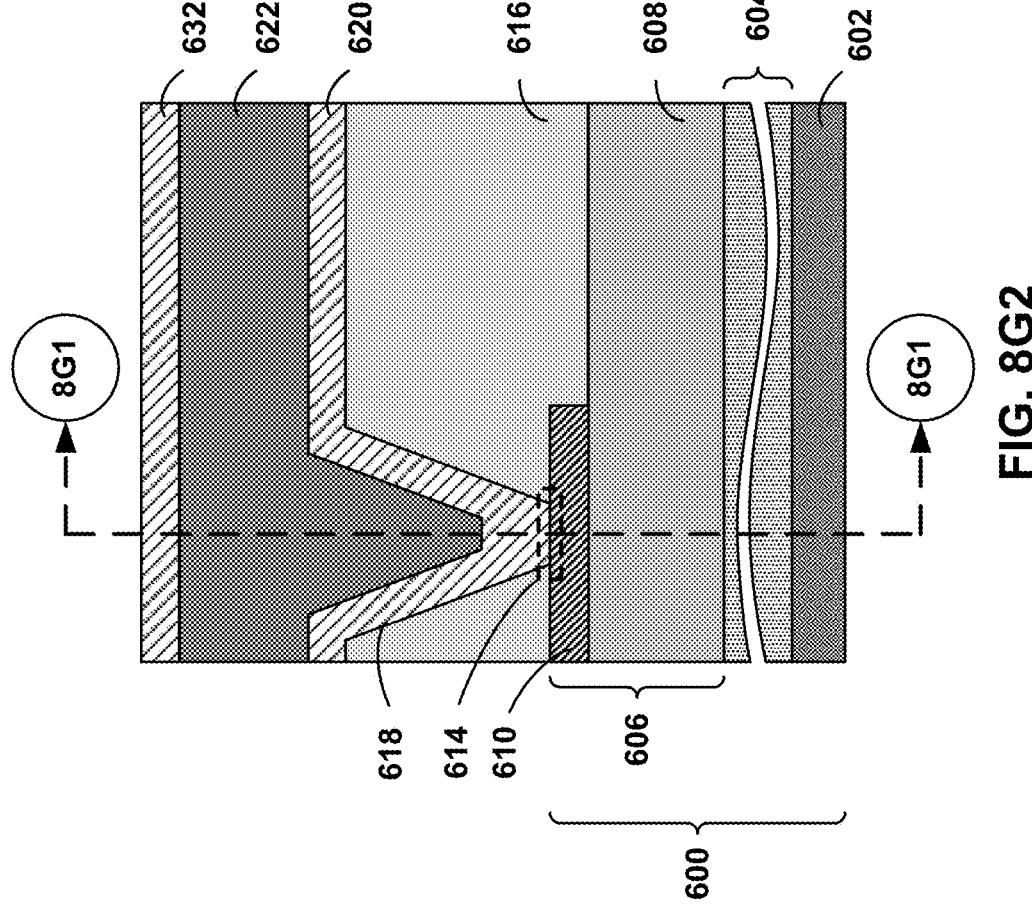
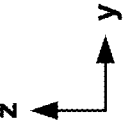
FIG. 8G2

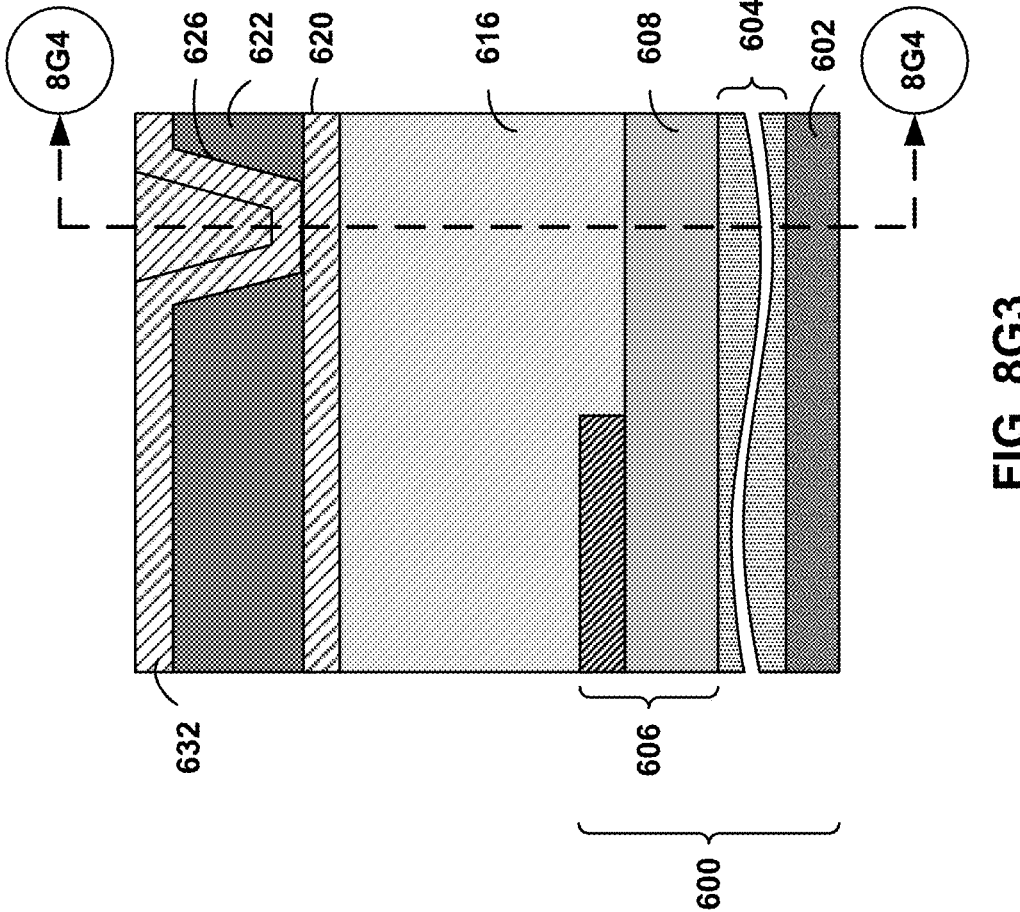
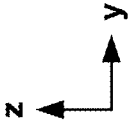
FIG. 8G3

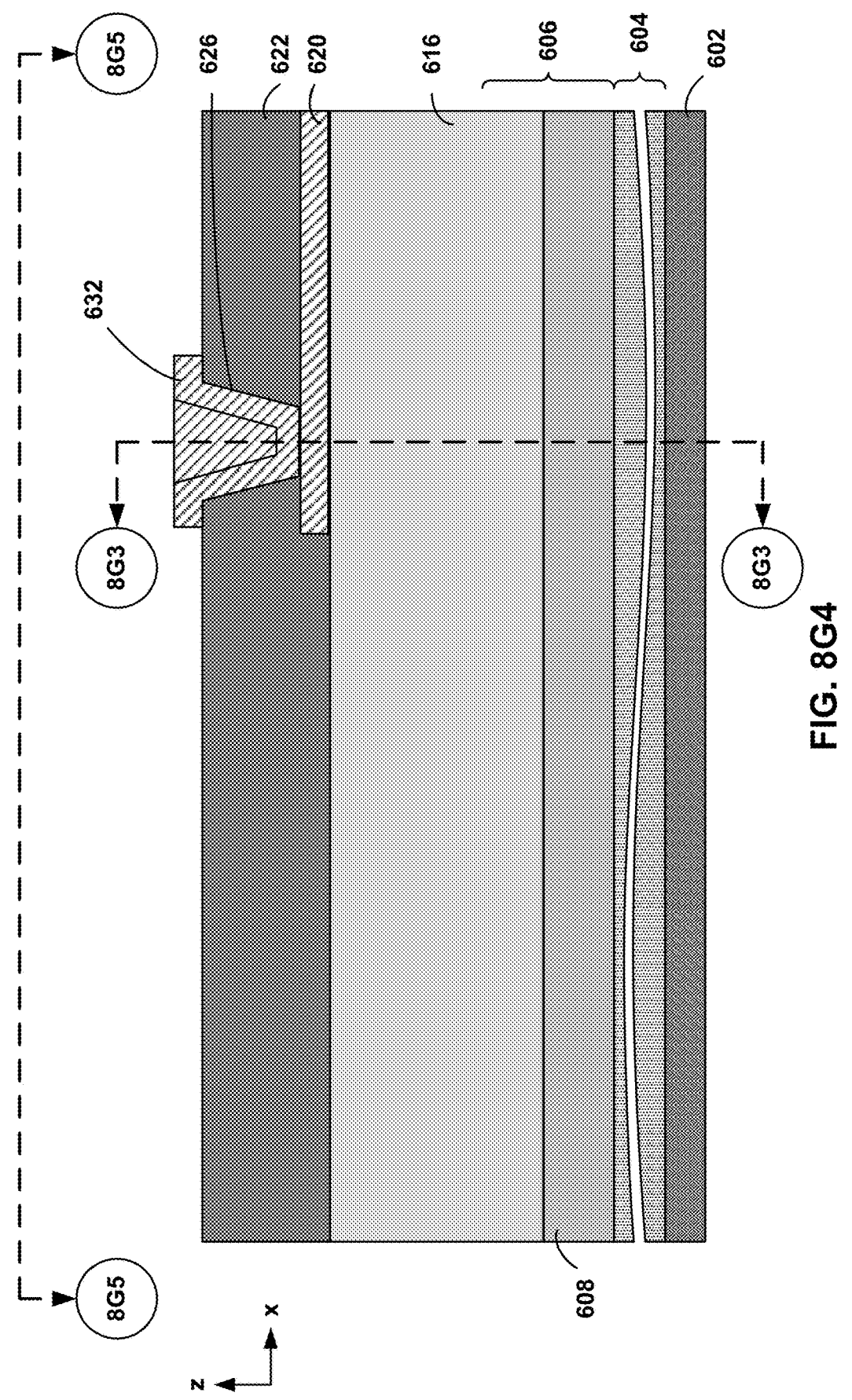
FIG. 8G4

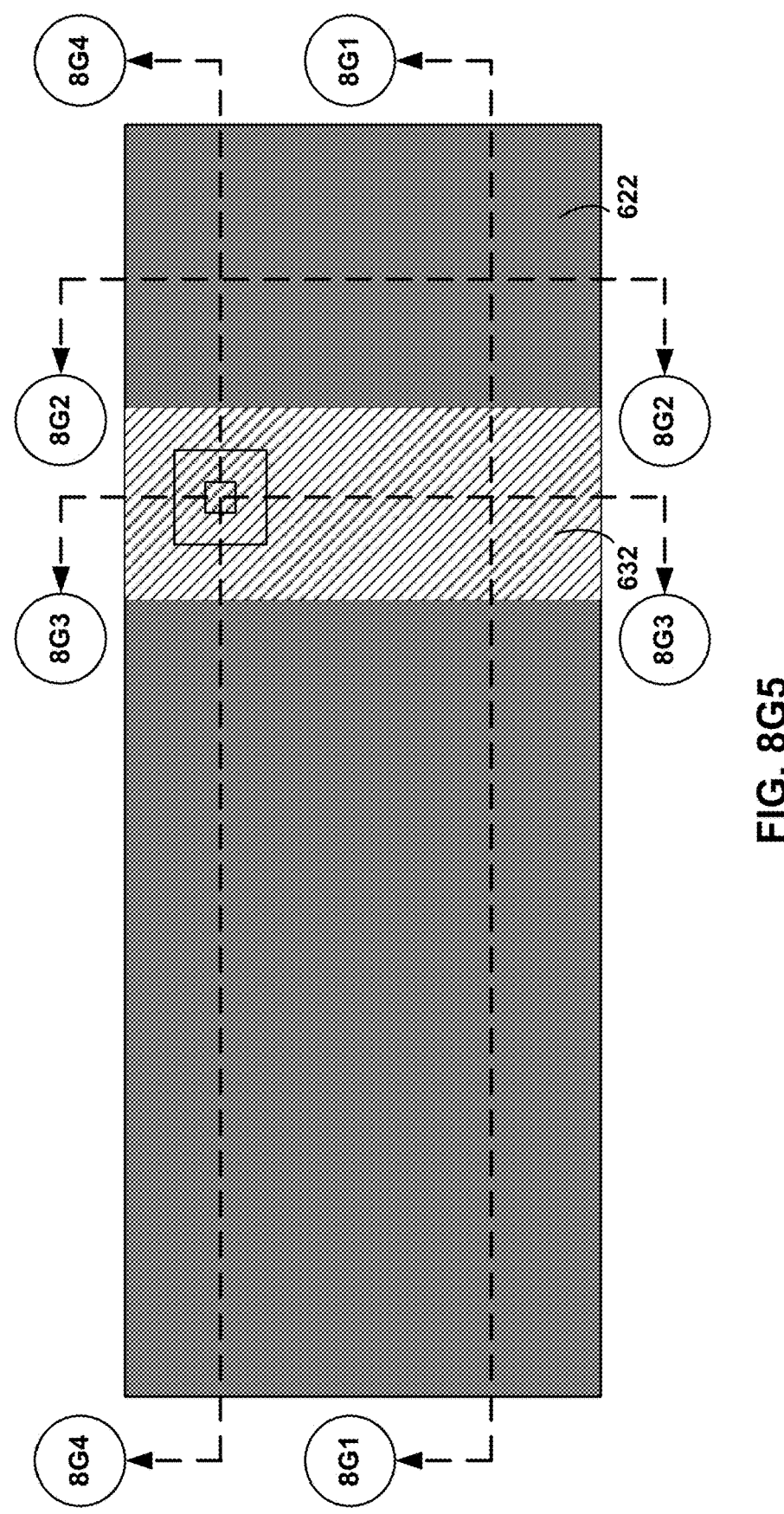
FIG. 8G5

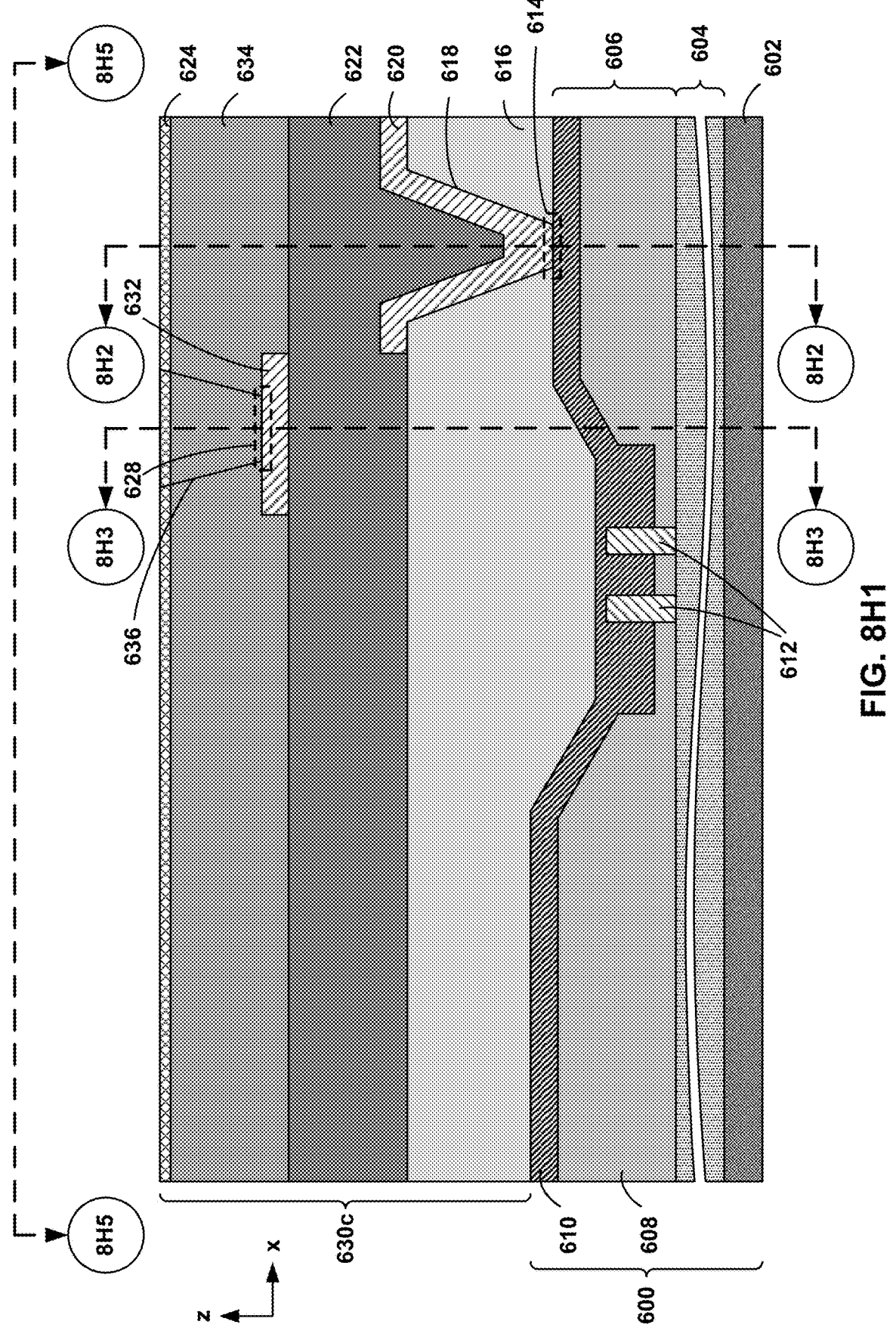
FIG. 8H1

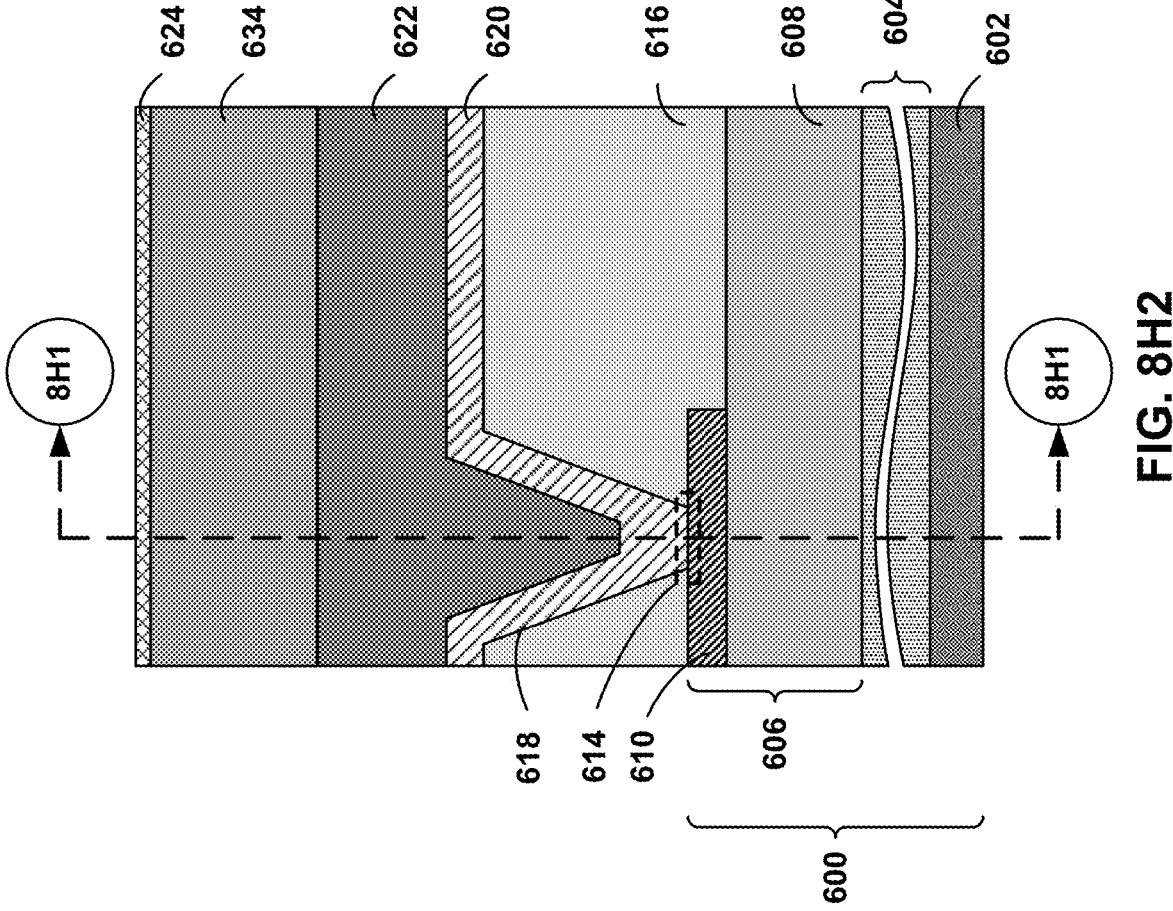
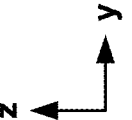
FIG. 8H2

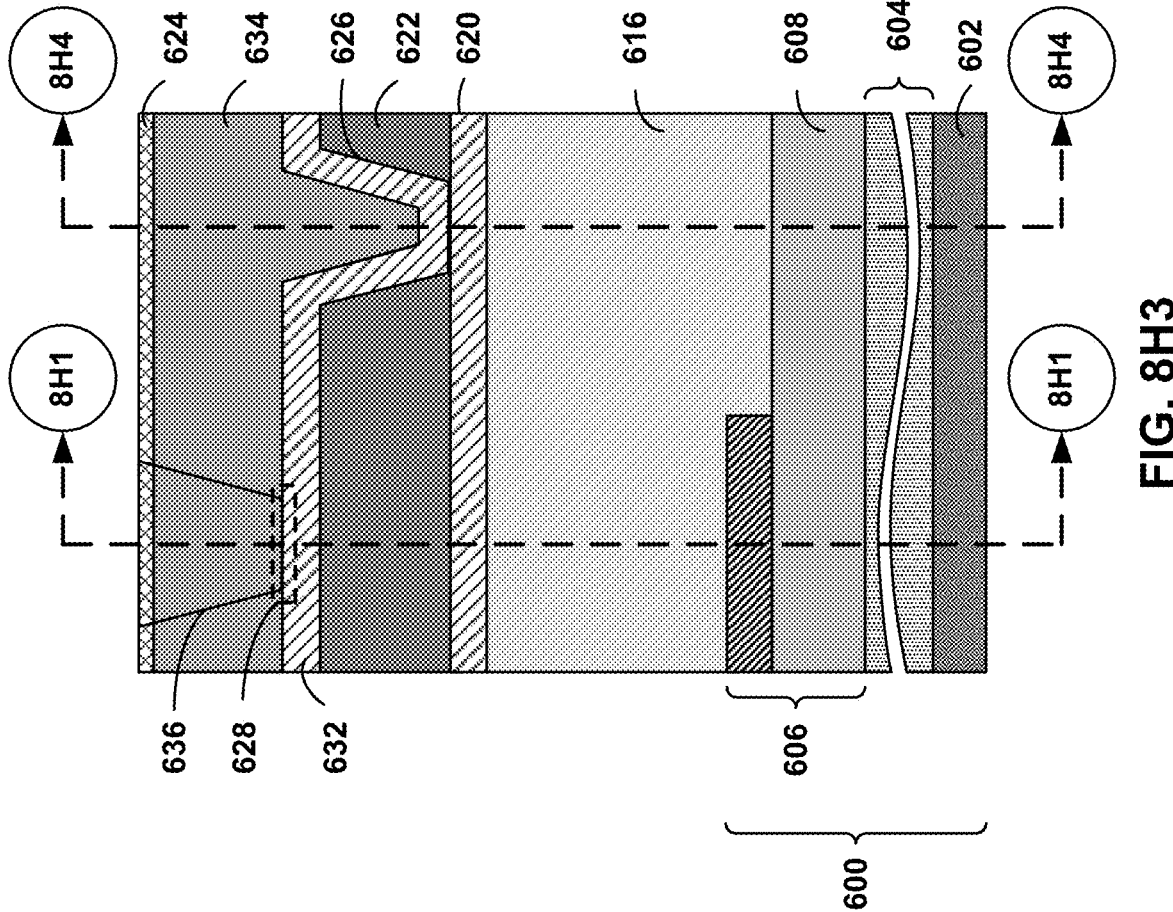
624
634
626
622
620
616
608
604
602
8H4
8H1
636
628
632
606
600
FIG. 8H3
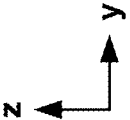
y
z

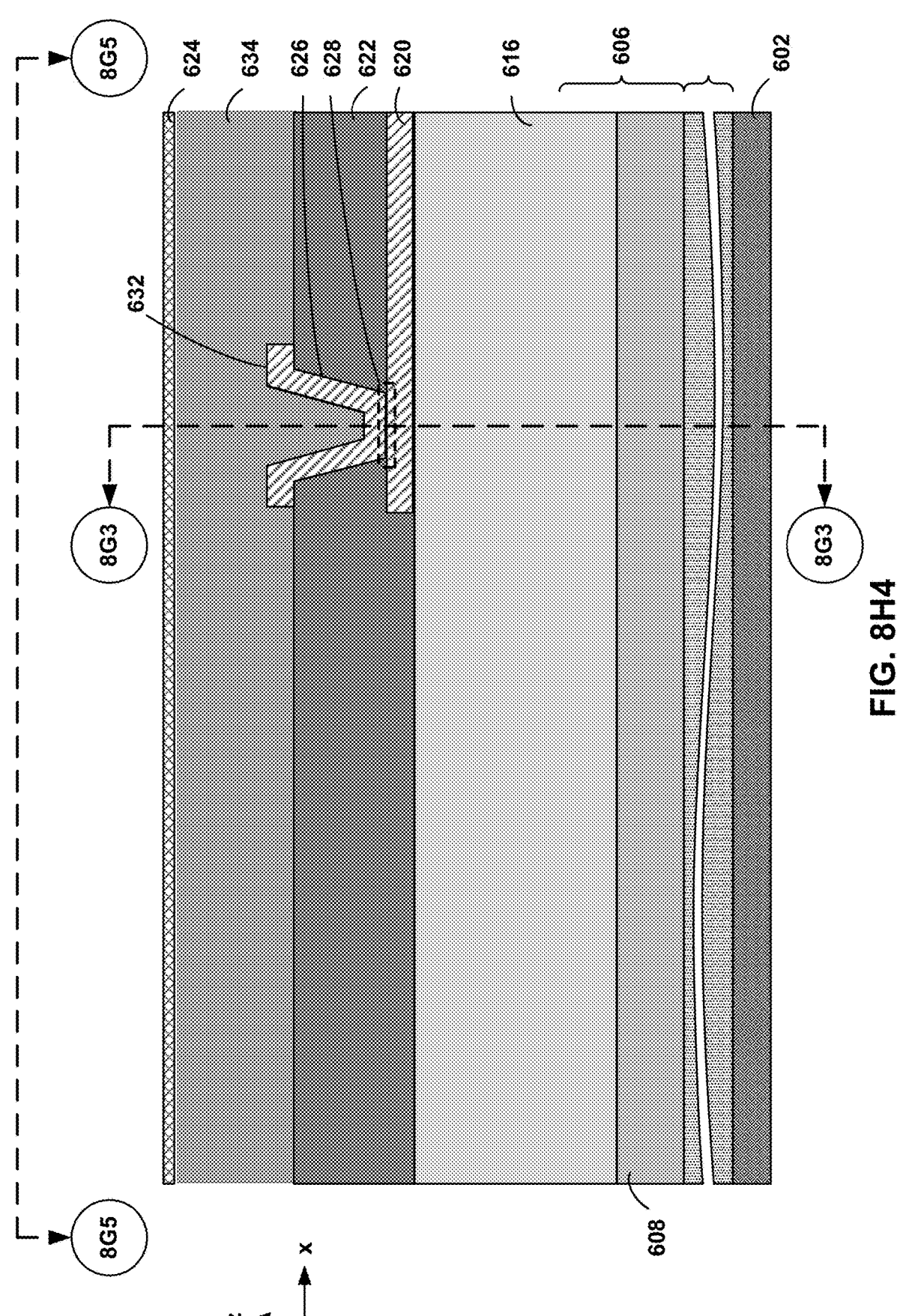
FIG. 8H4

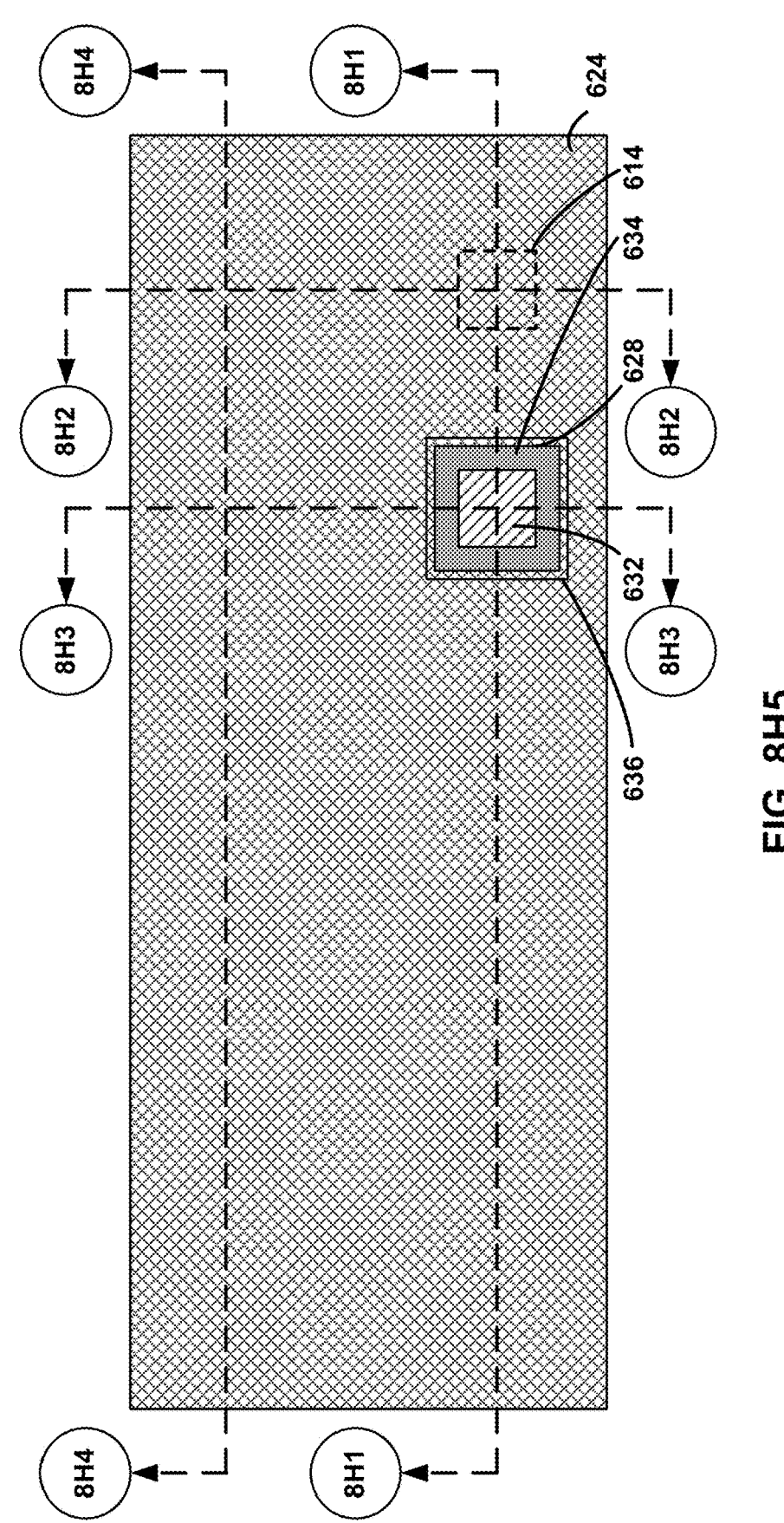
FIG. 8H5

APPARATUS AND METHODS FOR BONDING PAD REDISTRIBUTION LAYERS IN INTEGRATED CIRCUITS

BACKGROUND

Semiconductor devices, such as memories, field programmable gate arrays, central processing units, graphics processing units, application-specific integrated circuits, and other types of integrated circuits, are often manufactured on a semiconductor wafer (or other material). The various layers that constitute an integrated circuit are formed on the semiconductor wafer, which is eventually diced into multiple integrated circuit die. For simplicity, an integrated circuit die also will be referred to in the remaining discussion as a "die."

As integrated circuit technology continues to evolve, feature sizes and spacing between features continues to shrink. Such advances enable smaller die sizes but also present significant challenges.

BRIEF DESCRIPTION OF THE DRAWINGS

Like-numbered elements refer to common components in the different figures.

FIGS. 6A1-6F5 are cross-sectional views of a portion of a substrate during an example fabrication of the bonding pad redistribution layer of FIG. 5A.

FIGS. 7C1-7F5 are cross-sectional views of a portion of a substrate during an example fabrication of the bonding pad redistribution layer of FIG. 5B.

FIGS. 8E1-8H5 are cross-sectional views of a portion of a substrate during an example fabrication of the bonding pad redistribution layer of FIG. 5C.

DETAILED DESCRIPTION

An integrated circuit die typically includes one or more bonding pads disposed along one or more edges of a top surface of the die. Wire bonds to these bonding pads are typically used to electrically connect the die to one another, to a substrate, and/or to package leads. As integrated circuit technology continues to evolve, feature sizes and spacing between features continues to shrink.

For example, spacing between adjacent bonding pads has significantly reduced as semiconductor processing technology has advanced. As a result, however, the available space for wire bonds to adjacent bonding pads has likewise become smaller. Because of limitations in wire bond loop accuracy, electrical shorts have resulted between adjacent bond wires, lowering device yield.

Technology is described for providing a bonding pad redistribution layer for integrated circuits. In an embodiment, a bonding pad redistribution layer includes a first additional metal layer disposed above an uppermost metal layer of an integrated circuit die. The uppermost metal layer includes a plurality of first bonding pads at a first bonding pad pitch. The first additional metal layer includes a plurality of second bonding pads at a second bonding pad pitch greater than the first bonding pad pitch. A plurality of conductors each electrically couple a unique one of the first bonding pads to a corresponding one of the second bonding pads.

In another embodiment, a bonding pad redistribution layer includes a first additional metal layer disposed above an uppermost metal layer of an integrated circuit die, and a second additional metal layer disposed above the first additional metal layer. The uppermost metal layer includes a plurality of first bonding pads at a first bonding pad pitch. The second additional metal layer includes a plurality of second bonding pads at a second bonding pad pitch greater than the first bonding pad pitch. The first additional metal layer electrically couples a unique one of the first bonding pads to a corresponding one of the second bonding pads.

In embodiments, each die includes one or more of a memory device, a field programmable gate array (FPGA), a central processing unit (CPU), a graphics processing unit (GPU), an application-specific integrated circuit (ASIC), or other type of integrated circuit. For simplicity, the remaining discussion will describe the technology for die that include memory circuits. Persons of ordinary skill in the art will understand that the described technology also may be used with other type of circuit, such as described above.

Figure 1:
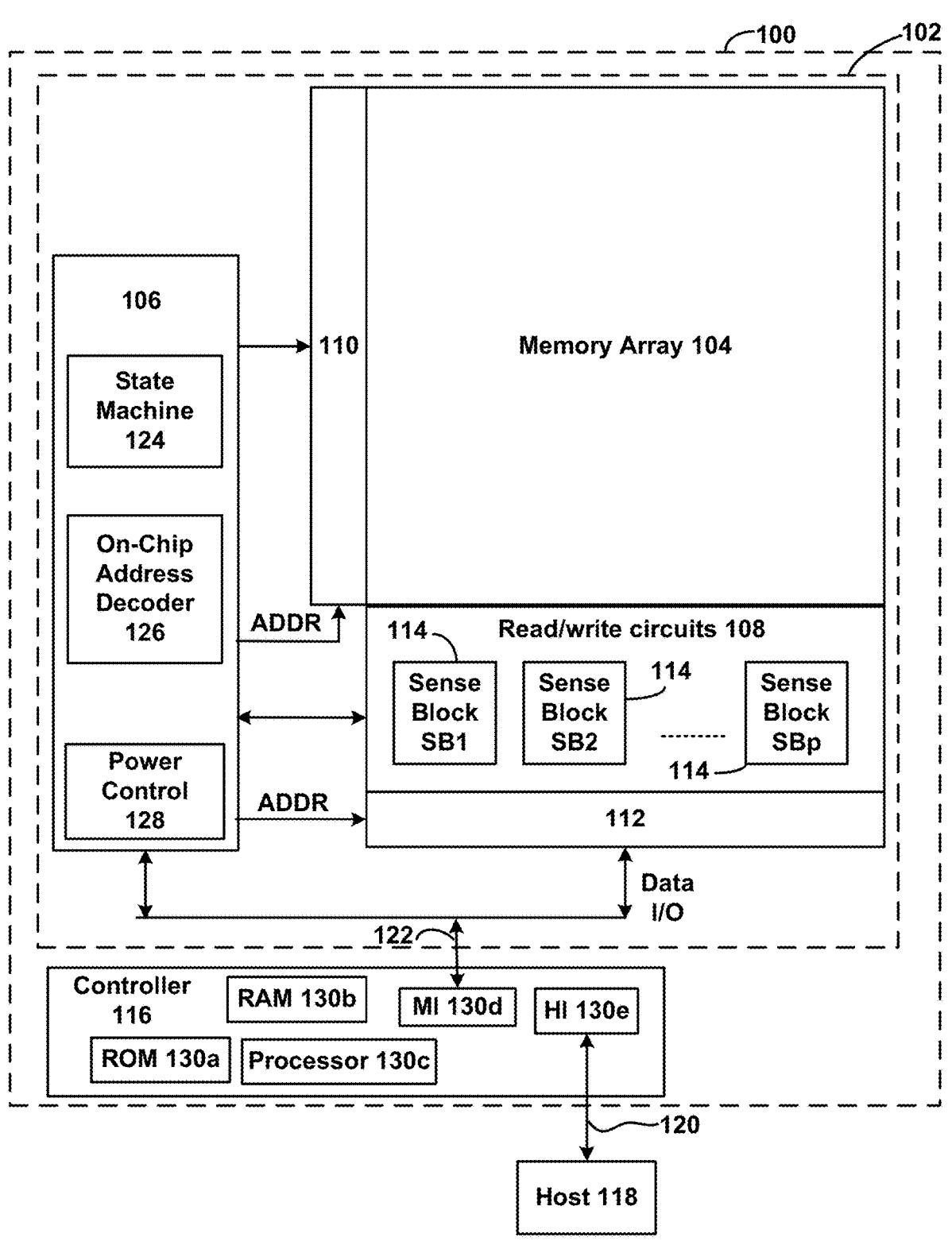
FIG. 1 is a block diagram of an embodiment of a memory system.

FIG. 1 is a functional block diagram of an example memory system that can be implemented on a die. The components depicted in FIG. 1 are electrical circuits. Memory system 100 includes one or more memory die 102. Each memory die 102 includes a three dimensional ("3D") memory array 104 of memory cells (such as, for example, a three dimensional monolithic array of memory cells), control circuitry 106, and read/write circuits 108. In other embodiments, a two dimensional array of memory cells can be used.

Memory array 104 is addressable by word lines via a row decoder 110 and by bit lines via a column decoder 112. Read/write circuits 108 include multiple sense blocks 114 including SB1, SB2, . . . , SBp (sensing circuitry) and allow a page of memory cells to be read or programmed in parallel.

In some memory systems, a controller 116 is included in the same memory device 100 (e.g., a removable storage card) as the one or more memory die 102. However, in other systems, controller 116 can be separated from memory die 102. In some embodiments controller 116 will be on a different die than memory die 102. In some embodiments, one controller 116 will communicate with multiple memory die 102. In other embodiments, each memory die 102 has its own controller. Commands and data are transferred between a host 118 and controller 116 via a data bus 120, and between controller 116 and the one or more memory die 102 via lines 122. In one embodiment, memory die 102 includes a set of input and/or output (I/O) pins that connect to lines 122.

Memory array 104 may include one or more arrays of non-volatile memory cells including a 3D array. Memory array 104 may include a monolithic three dimensional memory structure in which multiple memory levels are formed above (and not in) a single substrate, such as a wafer, with no intervening substrates. Memory array 104 may include any type of non-volatile memory that is monolithically formed in one or more physical levels of arrays of memory cells having an active area disposed above a silicon substrate. Memory array 104 may be in a non-volatile memory device having circuitry associated with the operation of the memory cells, whether the associated circuitry is above or within the substrate.

Control circuitry 106 cooperates with the read/write circuits 108 to perform memory operations (e.g., erase, program, read, and others) on memory array 104, and includes a state machine 124, an on-chip address decoder 126, and a power control module 128. State machine 124 provides die-level control of memory operations. In one embodiment, state machine 124 is programmable by software. In other embodiments, state machine 124 does not use software and is completely implemented in hardware (e.g., electrical circuits). In one embodiment, control circuitry 106 includes registers, ROM fuses and other storage devices for storing default values such as base voltages and other parameters.

On-chip address decoder 126 provides an address interface between addresses used by host 118 or controller 116 to the hardware address used by row decoder 110 and column decoder 112. Power control module 128 controls the power and voltages supplied to the word lines and bit lines during memory operations. Power control module 128 may include charge pumps for creating voltages. Sense blocks 114 include bit line drivers.

State machine 124 and/or controller 116, including various combinations of one or more of row decoder 110, column decoder 112, on-chip address decoder 126, power control module 128, sense blocks 114, and read/write circuits 108, can be considered one or more control circuits (or a managing circuit) that performs the functions described herein. The one or more control circuits can include hardware only or a combination of hardware and software (including firmware). For example, a controller programmed by firmware to perform the functions described herein is one example of a control circuit.

The (on-chip or off-chip) controller 116 (which in one embodiment is an electrical circuit) may include one or more ROM 130*a*, RAM 130*b*, processors 130*c*, a memory interface 130*d* and a host interface 130*e*, all of which are interconnected. One or more processors 130*c* are one example of a control circuit. Other embodiments can use state machines or other custom circuits designed to perform one or more functions.

The storage devices (ROM 130*a*, RAM 130*b*) stored code (software) such as a set of instructions (including firmware), and one or more processors 130*c* are operable to execute the set of instructions to provide the functionality described herein. Alternatively or additionally, one or more processors 130*c* can access code from a storage device in memory array 104, such as a reserved area of memory cells connected to one or more word lines.

RAM 130*b* can be used to store data for controller 116, including caching program data. Memory interface 130*d*, in communication with ROM 130*a*, RAM 130*b* and processor 130*c*, is an electrical circuit that provides an electrical interface between controller 116 and one or more memory die 102. For example, memory interface 130*d* can change the format or timing of signals, provide a buffer, isolate from surges, latch I/O, etc. One or more processors 130*c* can issue commands to control circuitry 106 (or any other component of memory die 102) via memory interface 130*d*. In one embodiment, one or more processors 130*c* can access code from ROM 130*a* or RAM 130*b* to receive a request to read from host 118 that includes an operation limitation, perform a read process on the memory die 102 within the operation limitation and return data to host 118 from the read process that includes errors in response to the request to read. Host interface 130*e* provides an electrical interface with data bus 120 to receive commands, addresses and/or data from host 118 to provide data and/or status to host 118.

In one example memory system 100, memory array 104 includes a three dimensional memory structure that includes flash memory vertical NAND strings with charge-trapping material. However, other (2D and 3D) memory structures also can be used with the technology described herein. For example, floating gate memories (e.g., NAND-type and NOR-type flash memory), ReRAM cross-point memories, magnetoresistive memory (e.g., MRAM), and phase change memory (e.g., PCRAM) can also be used.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
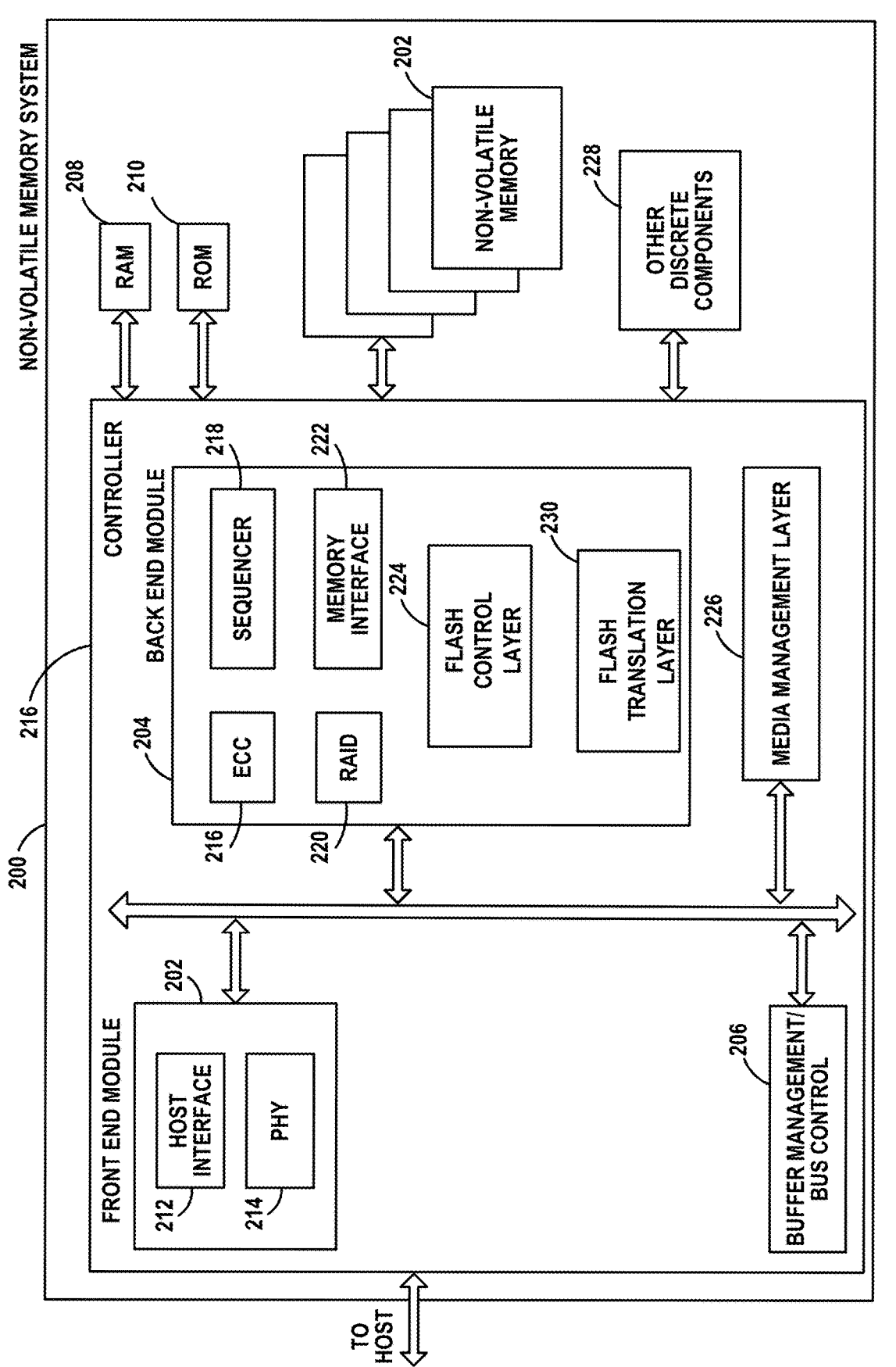
FIG. 2 is another block diagram of an embodiment of a memory system.

FIG. 2 is another block diagram of example memory system 100, depicting more details of one example implementation of controller 116. As used herein, a flash memory controller is a device that manages data stored on flash memory and communicates with a host, such as a computer or electronic device.

A flash memory controller can have various functionality in addition to the specific functionality described herein. For example, the flash memory controller can manage the read and programming processes, format the flash memory to ensure the memory is operating properly, map out bad flash memory cells, and allocate spare memory cells to be substituted for future failed cells. Some part of the spare memory cells can be used to hold firmware to operate the flash memory controller and implement other features.

In operation, when a host needs to read data from or write data to the flash memory, the host will communicate with the flash memory controller. If the host provides a logical address to which data is to be read/written, the flash memory controller can convert the logical address received from the host to a physical address in the flash memory. (Alternatively, the host can provide the physical address).

The flash memory controller also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 116 and non-volatile memory die 102 may be any suitable memory interface, such as Toggle Mode 200, 400, or 800. In one embodiment, memory system 100 may be a card based system, such as a secure digital (SD) or a micro secure digital (micro-SD) card that can be in or connected to cellular telephones, computers, servers, smart appliances, digital cameras, etc. In an alternate embodiment, memory system 100 may be part of an embedded memory system. In another example, memory system 100 may be in the form of a solid state disk (SSD) drive (having one or, more memory die 102) installed in or connected to a personal computer or server. Examples of hosts are cellular telephones, computers, servers, smart appliances, digital cameras, etc.

In some embodiments, non-volatile memory system 100 includes a single channel between controller 116 and non-volatile memory die 102, however, the subject matter described herein is not limited to having a single memory channel. For example, in some memory system architectures, 2, 4, 8 or more channels may exist between the controller and a memory die, depending on controller capabilities. In any of the embodiments described herein, more than a single channel may exist between the controller and the memory die, even if a single channel is shown in the drawings.

As depicted in FIG. 2, controller 116 includes a front end module 202 that interfaces with a host, a back end module 204 that interfaces with the one or more non-volatile memory die 102, and various other modules that perform functions which will now be described in detail.

The components of controller 116 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function or related functions, or a self-contained hardware or software component that interfaces with a larger system, for example.

For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor or circuit for controller 116 to perform the functions described herein. The architecture depicted in FIG. 2 is one example implementation that may (or may not) use the components of controller 116 depicted in FIG. 1 (i.e., RAM, ROM, processor, interface).

Referring again to modules of controller 116, a buffer manager/bus control 206 manages buffers in random access memory (RAM) 208 and controls the internal bus arbitration of controller 116. A read only memory (ROM) 210 stores system boot code. Although illustrated in FIG. 2 as located separately from the controller 116, in other embodiments one or both of the RAM 208 and ROM 210 may be located within controller 116. In yet other embodiments, portions of RAM 208 and ROM 210 may be located both within and without controller 116. Further, in some implementations, controller 116, RAM 208, and ROM 210 may be located on separate semiconductor die. In some embodiments, a portion of RAM 208 is used to cache program data.

Front end module 202 includes a host interface 212 and a physical layer interface (PHY) 214 that provide the electrical interface with the host or next level storage controller. The choice of the type of host interface 212 can depend on the type of memory being used. Examples of host interfaces 212 include, but are not limited to, SATA, SATA Express, SAS, Fibre Channel, USB, PCIe, and NVMe. Host interface 212 typically facilitates transfer for data, control signals, and timing signals.

Back end module 204 includes an error correction code (ECC) engine 216 (electrical circuit, software or combination of circuit and software) that encodes the data bytes received from the host, and decodes and error corrects the data bytes read from the non-volatile memory. A command sequencer 218 generates command sequences, such as program/read/erase command sequences, to be transmitted to non-volatile memory die 102. A RAID (Redundant Array of Independent Dies) module 220 manages generation of RAID parity and recovery of failed data.

The RAID parity may be used as an additional level of integrity protection for the data being written into the non-volatile memory system 100. In some cases, RAID module 220 may be a part of ECC engine 216. Note that the RAID parity may be added as one or more extra die as implied by the common name, but it may also be added within the existing die, e.g. as an extra plane, or extra block, or extra word lines within a block.

A memory interface 222 provides the command sequences to non-volatile memory die 102 and receives status information from non-volatile memory die 102. In one embodiment, memory interface 222 may be a double data rate (DDR) interface, such as a Toggle Mode 200, 400, or 800 interface.

A flash control layer 224 (firmware and/or hardware, such as an electrical circuit) controls the overall operation of back end module 204. Flash control layer 224 includes a program manager that manages the programming processes described below. The program manager can be implemented as a dedicated electrical circuit or via software (e.g., firmware).

Additional components of memory system 100 illustrated in FIG. 2 include media management layer 226, which performs wear leveling of memory cells of non-volatile memory die 102. Memory system 100 also includes other discrete components 228, such as external electrical interfaces, external RAM, resistors, capacitors, or other components that may interface with controller 116.

In alternative embodiments, one or more of physical layer interface 214, RAID module 220, media management layer 226 and buffer management/bus controller 206 are optional components that are not necessary in controller 116.

Flash translation layer 230 manages the translation between logical addresses and physical addresses. Logical addresses are used to communicate with the host. Physical addresses are used to communicate with the memory die. Flash translation layer 230 can be a dedicated electrical circuit or firmware.

Controller 116 may interface with one or more memory die 102. In one embodiment, controller 116 and multiple memory die 102 (together comprising memory system 100) implement a SSD, which can emulate, replace or be used instead of a hard disk drive inside or connected to a host, as a NAS device, etc. Additionally, the SSD need not be made to emulate a hard drive.

Figure 3:
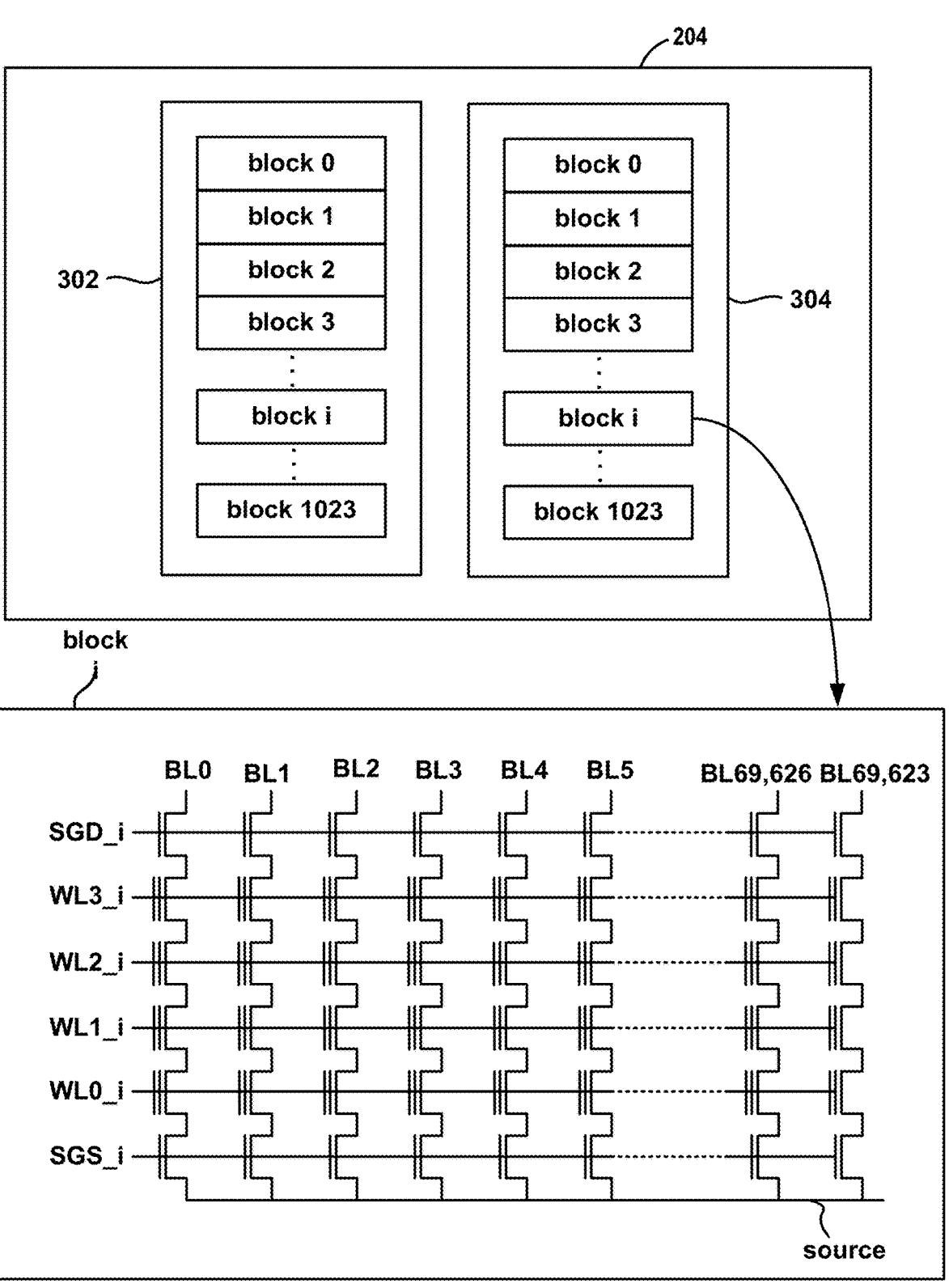
FIG. 3 is a block diagram of an embodiment of a memory array.

FIG. 3 depicts an exemplary structure of memory array 104. In one embodiment, the array of memory cells is divided into multiple planes. In the example of FIG. 3, memory array 104 is divided into two planes: Plane 302 and Plane 304. In other embodiments, more or fewer than two planes can be used.

In some embodiments, each plane is divided into a large number of blocks (e.g., blocks 0-1023, or another amount). Each block includes many memory cells. In one embodiment, the block is the unit of erase. That is, each block contains the minimum number of memory cells that are erased together. Other units of erase also can be used.

In one embodiment, a block contains a set of NAND strings which are accessed via bit lines (e.g., bit lines BL0-BL69,623) and word lines (WL0, WL1, WL2, WL3). FIG. 3 shows four memory cells connected in series to form a NAND string. Although four cells are depicted in each NAND string, more or less than four memory cells can be used (e.g., 16, 32, 64, 220, 256 or another number or memory cells can be on a NAND string).

One terminal of the NAND string is connected to a corresponding bit line via a drain select gate (connected to select gate drain line SGD), and another terminal is connected to a source line via a source select gate (connected to select gate source line SGS). Although FIG. 3 shows 69624 bit lines, a different number of bit lines also can be used. Additionally, as discussed above, the block can implement non-volatile storage technologies other than NAND flash memory.

Each block is typically divided into a number of pages. In one embodiment, a page is a unit of programming. Other units of programming also can be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array.

As described above, an integrated circuit die typically includes one or more bonding pads disposed along one or more edges of a top surface of the die. Wire bonds to these bonding pads are typically used to electrically connect the die to one another, to a substrate, and/or to package leads. The spacing between adjacent bonding pads has significantly reduced as semiconductor processing technology has advanced, reducing the available space for wire bonds to adjacent bonding pads. Because of limitations in wire bond loop accuracy, electrical shorts have resulted between adjacent bond wires, lowering device yield.

Technology is described for providing a bonding pad redistribution layer for integrated circuits. In an embodiment, a bonding pad redistribution layer includes a first additional metal layer disposed above an uppermost metal layer of an integrated circuit die. The uppermost metal layer includes a plurality of first bonding pads at a first bonding pad pitch. The first additional metal layer includes a plurality of second bonding pads at a second bonding pad pitch greater than the first bonding pad pitch. A plurality of conductors each electrically couple a unique one of the first bonding pads to a corresponding one of the second bonding pads.

In another embodiment, a bonding pad redistribution layer includes a first additional metal layer disposed above an uppermost metal layer of an integrated circuit die, and a second additional metal layer disposed above the first additional metal layer. The uppermost metal layer includes a plurality of first bonding pads at a first bonding pad pitch. The second additional metal layer includes a plurality of second bonding pads at a second bonding pad pitch greater than the first bonding pad pitch. The first additional metal layer electrically couples a unique one of the first bonding pads to a corresponding one of the second bonding pads.

Figure 4A:
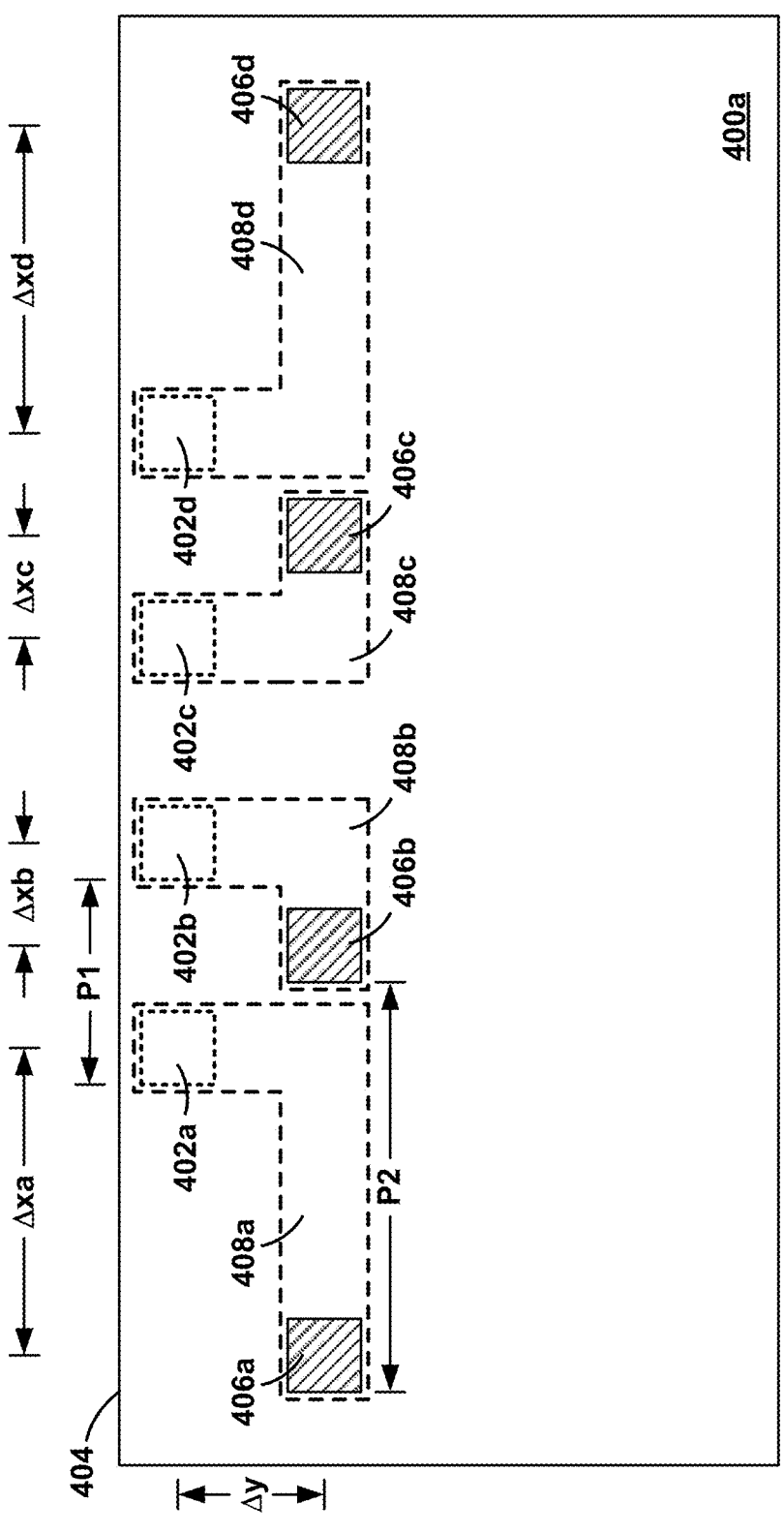
FIG. 4A depicts a plan view of an integrated circuit die that includes a bonding pad redistribution layer.

Referring now to FIG. 4A, a plan view of an integrated circuit 400*a* that includes an embodiment of a bonding pad redistribution layer is described. Integrated circuit 400*a* includes a plurality of first bonding pads 402 (e.g., 402*a*-402*d*) disposed along an edge 404 of integrated circuit 400*a*, and a corresponding plurality of second bonding pads 406 (e.g., 406*a*-406*d*) also disposed along edge 404 of integrated circuit 400*a*. First bonding pads 402 have a first bond pitch P1, and second bonding pads 406 have a second bond pitch P2 greater than first bond pitch P1.

In an embodiment, second bonding pads 406 are offset in a first direction (e.g., a y-direction) from corresponding first bonding pads 402 by an offset Δy. In the example of FIG. 4A, second bonding pads 406 are offset in the first direction from corresponding first bonding pads 402 by the same offset Δy. In other embodiments, second bonding pads 406 may be offset in the first direction from corresponding first bonding pads 402 by varying offsets. In an embodiment, second bonding pads 406 are disposed farther from edge 404 than first bonding pads 402.

In an embodiment, second bonding pads 406 are offset in a second direction (e.g., an x-direction) from corresponding first bonding pads 402 by varying amounts. In an embodiment, the second direction is substantially perpendicular to the first direction. In particular, second bonding pad 406*a* is offset in the second direction from corresponding first bonding pad 402*a* by Δxa, second bonding pad 406*b* is offset in the second direction from corresponding first bonding pad 402*b* by Δxb, second bonding pad 406*c* is offset in the second direction from corresponding first bonding pad 402*c* by Δxc, and second bonding pad 406*d* is offset in the second direction from corresponding first bonding pad 402*d* by Δxd.

In an embodiment, first bonding pads 402 are disposed on an uppermost (e.g., top) metal layer of an integrated circuit fabrication process. In an embodiment, integrated circuit 400*a* includes a first additional metal layer 408 disposed above the top metal layer of the integrated circuit fabrication process. In an embodiment, second bonding pads 406 are disposed on the first additional metal layer 408.

In the example depicted in FIG. 4A, first additional metal layer portion 408a electrically couples first bonding pad 402a and corresponding second bonding pad 406a, first additional metal layer portion 408b electrically couples first bonding pad 402b and corresponding second bonding pad 406b, first additional metal layer portion 408c electrically couples first bonding pad 402c and corresponding second bonding pad 406c, and first additional metal layer portion 408d electrically couples first bonding pad 402d and corresponding second bonding pad 406d.

In the embodiment of FIG. 4A, first additional metal layer 408 forms a bonding pad redistribution layer for electrically coupling first bonding pads 402 with corresponding second bonding pads 406. In this regard, bond wires (not shown) may be attached to second bonding pads 406 which are electrically coupled to corresponding first bonding pad 402, but have a second bond pitch P2 greater than first bond pitch P1. Without wanting to be bound by any particular theory, it is believed that the bonding pad redistribution layer that includes first additional metal layer 408 may reduce the incidence of wire bond shorting.

Figure 4B:
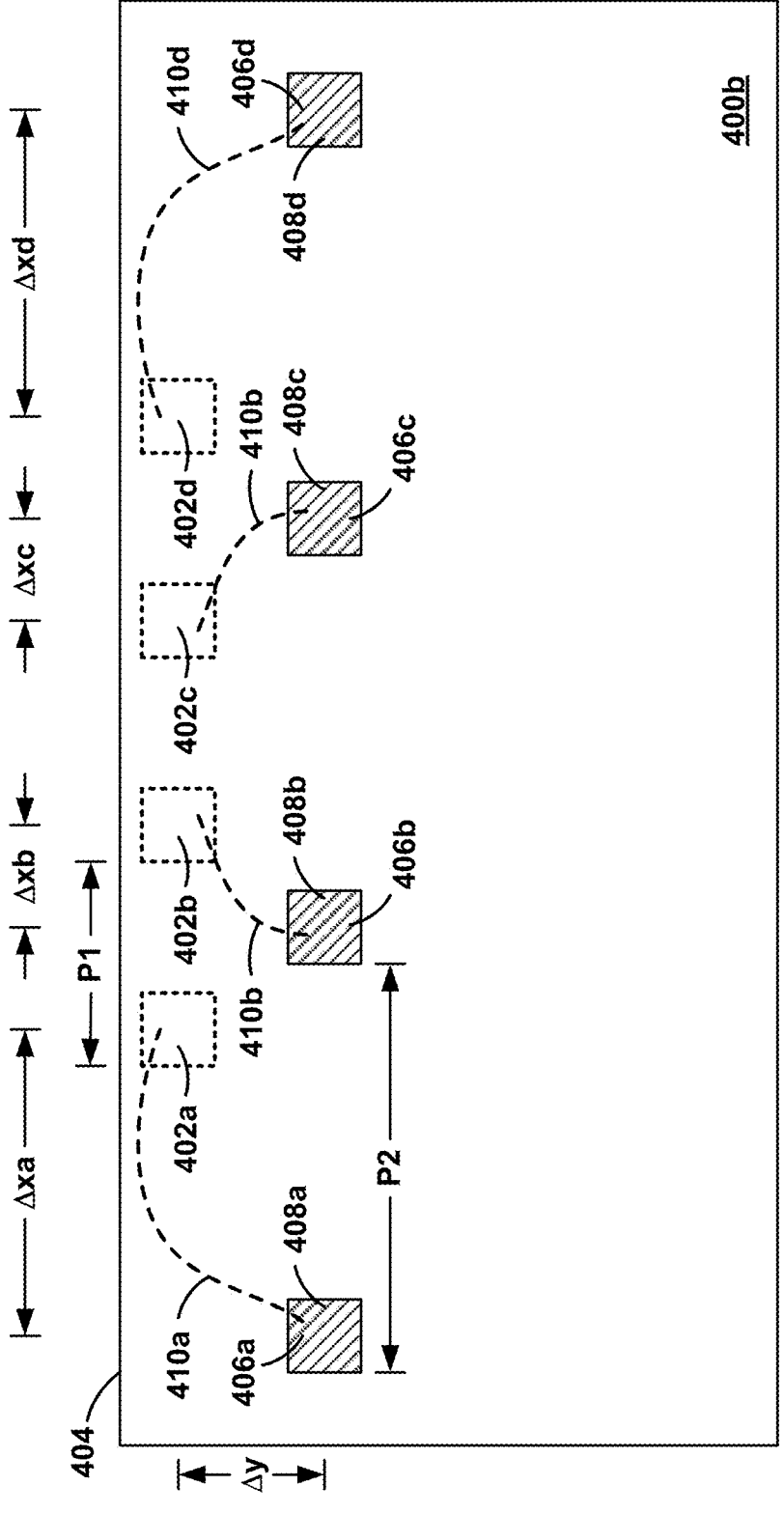
FIG. 4B depicts a plan view of an integrated circuit die that includes another bonding pad redistribution layer.

Referring now to FIG. 4B, a plan view of an integrated circuit 400b that includes another embodiment of a bonding pad redistribution layer is described. Integrated circuit 400b includes a plurality of first bonding pads 402 (e.g., 402a-402d) disposed along an edge 404 of integrated circuit 400b, and a corresponding plurality of second bonding pads 406 (e.g., 406a-406d) also disposed along edge 404 of integrated circuit 400b. First bonding pads 402 have a first bond pitch P1, and second bonding pads 406 have a second bond pitch P2 greater than first bond pitch P1.

In an embodiment, second bonding pads 406 are offset in a first direction (e.g., a y-direction) from corresponding first bonding pads 402 by an offset Δy. In the example of FIG. 4B, second bonding pads 406 are offset in the first direction from corresponding first bonding pads 402 by the same offset Δy. In other embodiments, second bonding pads 406 may be offset in the first direction from corresponding first bonding pads 402 by varying offsets. In an embodiment, second bonding pads 406 are disposed farther from edge 404 than first bonding pads 402.

In an embodiment, second bonding pads 406 are offset in a second direction (e.g., an x-direction) from corresponding first bonding pads 402 by varying amounts. In an embodiment, the second direction is substantially perpendicular to the first direction. In particular, second bonding pad 406a is offset in the second direction from corresponding first bonding pad 402a by Δxa, second bonding pad 406b is offset in the second direction from corresponding first bonding pad 402b by Δxb, second bonding pad 406c is offset in the second direction from corresponding first bonding pad 402c by Δxc, and second bonding pad 406d is offset in the second direction from corresponding first bonding pad 402d by Δxd.

In an embodiment, first bonding pads 402 are disposed on an uppermost (e.g., top) metal layer of an integrated circuit fabrication process. In an embodiment, integrated circuit 400b includes a first additional metal layer 408 disposed above the top metal layer of the integrated circuit fabrication process. In an embodiment, second bonding pads 406 are formed on the first additional metal layer 408.

In the example depicted in FIG. 4B, first additional metal layer portion 408a may be used to electrically coupled via an external bond wire 410a first bonding pad 402a and corresponding second bonding pad 406a, first additional metal layer portion 408b may be used to electrically coupled via an external bond wire 410b first bonding pad 402b and corresponding second bonding pad 406b, first additional metal layer portion 408c may be used to electrically coupled via an external bond wire 410c first bonding pad 402c and corresponding second bonding pad 406c, and first additional metal layer portion 408d may be used to electrically coupled via an external bond wire 410d first bonding pad 402d and corresponding second bonding pad 406d In the embodiment of FIG. 4B, first additional metal layer 408 forms a bonding pad redistribution layer for electrically coupling first bonding pads 402 with corresponding second bonding pads 406. In this regard, bond wires (not shown) may be attached to second bonding pads 406 which are electrically coupled to corresponding first bonding pad 402, but have a second bond pitch P2 greater than first bond pitch P1. Without wanting to be bound by any particular theory, it is believed that the bonding pad redistribution layer that includes first additional metal layer 408 may reduce the incidence of wire bond shorting.

Figure 4C:
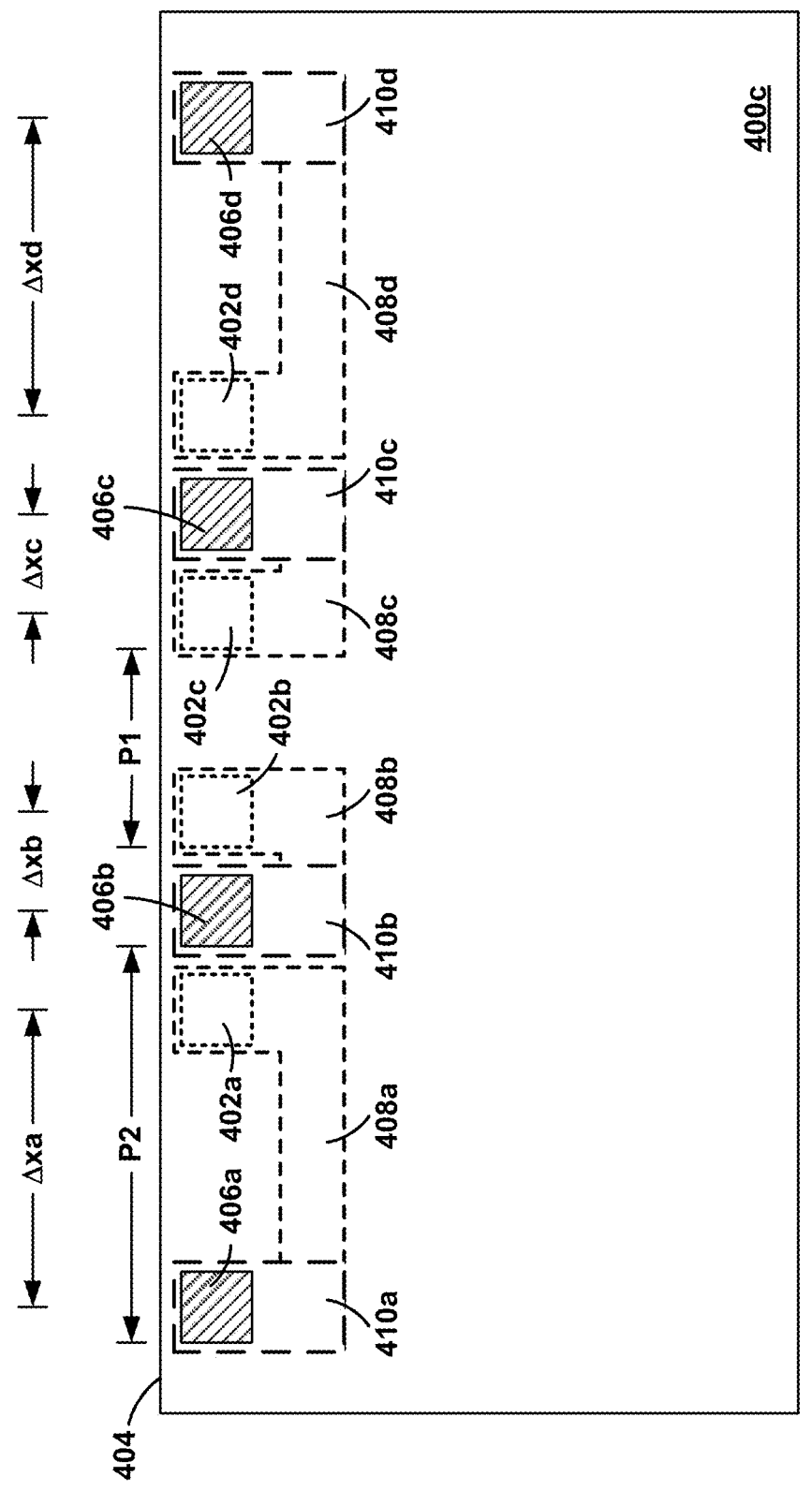
FIG. 4C depicts a plan view of still another integrated circuit die that includes still another bonding pad redistribution layer.

Referring now to FIG. 4C, a plan view of an integrated circuit 400a that includes still another embodiment of a bonding pad redistribution layer is described. Integrated circuit 400c includes a plurality of first bonding pads 402 (e.g., 402a-402d) disposed along an edge 404 of integrated circuit 400a, and a corresponding plurality of second bonding pads 406 (e.g., 406a-406d) also disposed along edge 404 of integrated circuit 400a. First bonding pads 402 have a first bond pitch P1, and second bonding pads 406 have a second bond pitch P2 greater than first bond pitch P1.

In an embodiment, second bonding pads 406 are substantially aligned in a first direction (e.g., a y-direction) with corresponding first bonding pads 402. In an embodiment, second bonding pads 406 are offset in a second direction (e.g., an x-direction) from corresponding first bonding pads 402 by varying amounts. In an embodiment, the second direction is substantially perpendicular to the first direction. In particular, second bonding pad 406a is offset in the second direction from corresponding first bonding pad 402a by Δxa, second bonding pad 406b is offset in the second direction from corresponding first bonding pad 402b by Δxb, second bonding pad 406c is offset in the second direction from corresponding first bonding pad 402c by Δxc, and second bonding pad 406d is offset in the second direction from corresponding first bonding pad 402d by Δxd.

In an embodiment, first bonding pads 402 are disposed on an uppermost (e.g., top) metal layer of an integrated circuit fabrication process. In an embodiment, integrated circuit 400c includes a first additional metal layer 408 disposed above the top metal layer of the integrated circuit fabrication process, and a second additional metal layer 410 disposed above first additional metal layer 408. In an embodiment, second bonding pads 406 are formed on the second additional metal layer 410.

In the example depicted in FIG. 4C, first additional metal layer portion 408a is electrically coupled to second additional metal layer portion 410a, which collectively electrically couple first bonding pad 402a and corresponding second bonding pad 406a. In addition, first additional metal layer portion 408b is electrically coupled to second additional metal layer portion 410b, which collectively electrically couple first bonding pad 402b and corresponding second bonding pad 406b. Likewise, first additional metal layer portion 408c is electrically coupled to second additional metal layer portion 410c, which collectively electrically couple first bonding pad 402c and corresponding second bonding pad 406c. Similarly, first additional metal layer portion 408d is electrically coupled to second additional metal layer portion 410*d*, which collectively electrically couple first bonding pad 402*d* and corresponding second bonding pad 406*d*.

In the embodiment of FIG. 4C, first additional metal layer 408 and second additional metal layer 410 form a bonding pad redistribution layer for electrically coupling first bonding pads 402 with corresponding second bonding pads 406. In this regard, bond wires (not shown) may be attached to second bonding pads 406 which are electrically coupled to corresponding first bonding pad 402, but have a second bond pitch P2 greater than first bond pitch P1. Without wanting to be bound by any particular theory, it is believed that the bonding pad redistribution layer that includes first additional metal layer 408 and second additional metal layer 410 may reduce the incidence of wire bond shorting.

Figure 5B:
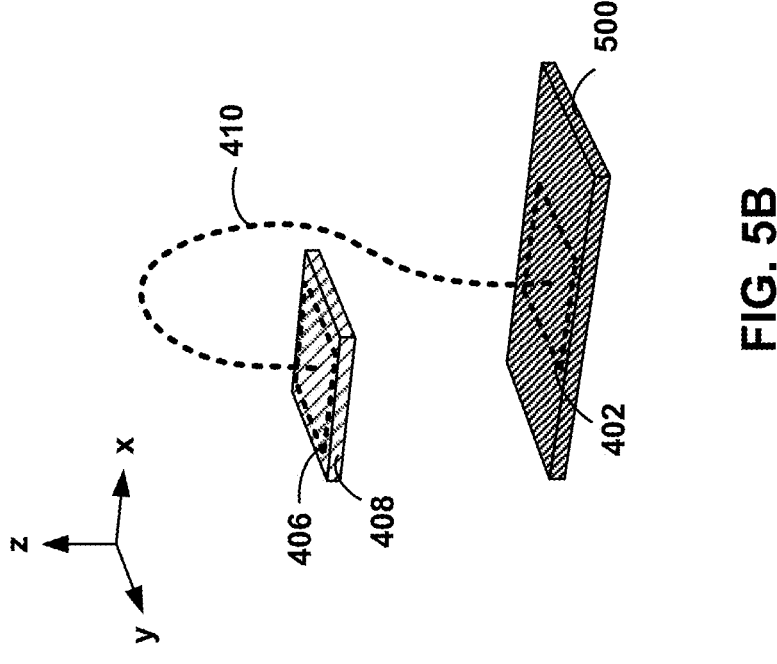
FIG. 5B depicts a perspective view of a portion of the bonding pad redistribution layer of FIG. 4B.
Figure 5A:
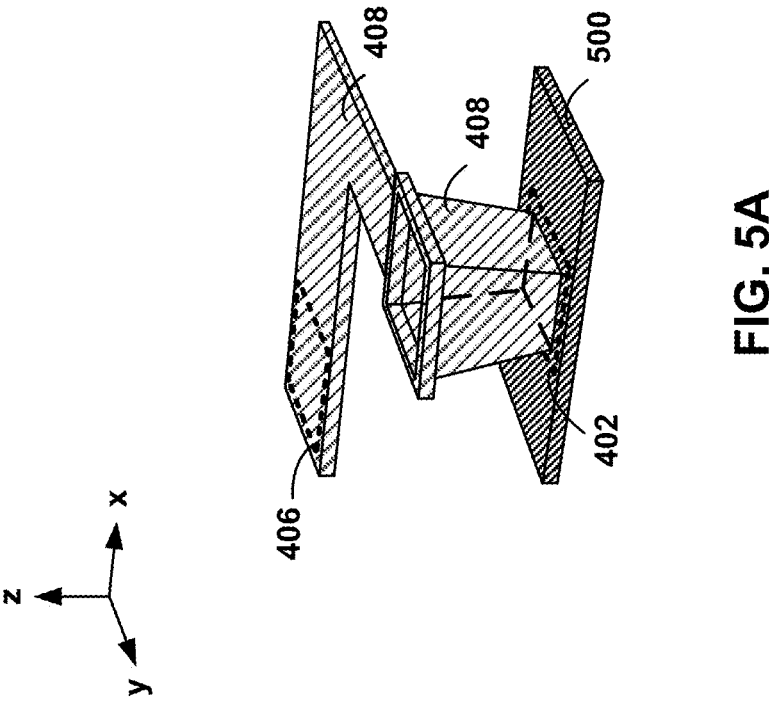
FIG. 5A depicts a perspective view of a portion of the bonding pad redistribution layer of FIG. 4A.

Referring now to FIG. 5A, a perspective view of a portion of the bonding pad redistribution layer of FIG. 4A is described. In particular, FIG. 5A depicts an uppermost (e.g., top) metal layer 500 of an integrated circuit fabrication process. Top metal layer 500 includes a first bonding pad 402. First additional metal layer 408 includes a second bonding pad 406, and is included in a bonding pad redistribution layer for electrically coupling first bonding pad 402 with corresponding second bonding pad 406.

Referring now to FIG. 5B, a perspective view of a portion of the bonding pad redistribution layer of FIG. 4B is described. In particular, FIG. 5B depicts an uppermost (e.g., top) metal layer 500 of an integrated circuit fabrication process. Top metal layer 500 includes a first bonding pad 402. First additional metal layer 408 includes a second bonding pad 406, and is included in a bonding pad redistribution layer for electrically coupling via bond wires 410 first bonding pad 402 with corresponding second bonding pad 406.

Figure 5C:
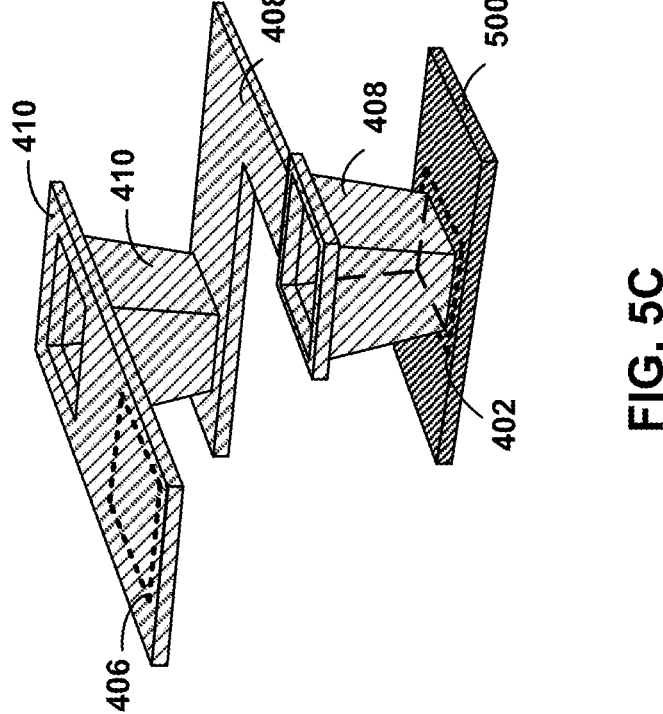
FIG. 5C depicts a perspective view of a portion of the bonding pad redistribution layer of FIG. 4C.

Referring now to FIG. 5C, a perspective view of a portion of the bonding pad redistribution layer of FIG. 4C is described. In particular, FIG. 5C depicts an uppermost (e.g., top) metal layer 500 of an integrated circuit fabrication process. Top metal layer 500 includes a first bonding pad 402. First additional metal layer 408 is coupled to second additional metal layer 410, which includes a second bonding pad 406. First additional metal layer 408 and second additional metal layer 410 are included in a bonding pad redistribution layer for electrically coupling first bonding pad 402 with corresponding second bonding pad 406.

Referring now to FIGS. 6A1-6F5, an example method of forming a bonding pad redistribution layer such as the example bonding pad redistribution layer 500*a* of FIG. 5A is described.

With reference to FIGS. 6A1-6A3, an integrated circuit 600 is shown as having already undergone several processing steps. Integrated circuit 600 includes a substrate 602, one or more intermediate material layers 604, and a top portion 606 disposed above intermediate material layers 604. In embodiments, integrated circuit 600 includes all of the material layers to form a complete integrated circuit die, up to and including an uppermost (e.g., top) metal layer of an integrated circuit fabrication process.

Substrate 602 may be any suitable substrate such as a silicon, germanium, silicon-germanium, undoped, doped, bulk, SOI or other substrate with or without additional circuitry. For example, substrate 602 may include one or more n-well or p-well regions (not shown).

Intermediate material layers 604 may include one or more material layers used in a semiconductor integrated circuit fabrication process. For example, intermediate material layers 604 may include isolation layers, conductive material layers, dielectric material layers, or other similar material layers that are fabricated to form one ore more electronic circuit elements.

In an embodiment, intermediate material layers 604 include a memory array, such as memory array 104 of FIG. 1. Persons of ordinary skill in the art will understand that intermediate material layers 604 may include circuitry in addition to or other than a memory array.

Top portion 606 includes a first dielectric material layer 608, a first metal layer 610 (also referred to herein as "top metal layer 610"), one or more conductors 612, and a first bonding pad 614. As described in more detail below, electrical signals on conductors 612 are electrically coupled to top metal layer 610 and ordinarily may be brought off-die by attaching a bond wire to first bonding pad 614.

First dielectric material layer 608 may be approximately 300-700 nm of silicon dioxide. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Top metal layer 610 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In an embodiment, top metal layer 610 may be between about 20 nm and about 250 nm of tungsten. Other conductive material layers and/or thicknesses may be used. In embodiments, top metal layer 610 is an uppermost (e.g., top) metal layer of an integrated circuit fabrication process.

In some embodiments, an adhesion layer (not shown), such as titanium nitride or other similar adhesion layer material, may be disposed between first dielectric material layer 608 and top metal layer 610.

Conductors 612 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In an embodiment, conductors 612 are electrically coupled to top metal layer 610, and may be between about 20 nm and about 250 nm of heavily doped polysilicon. Other conductive material layers and/or thicknesses may be used.

First bonding pad 614 is disposed on top metal layer 610 and is suitable for attachment of a bond wire (not shown). Although not shown in FIGS. 6A1-6A3, top metal layer 610 typically includes multiple first bonding pads, including first bonding pad 614. In an embodiment, the first bonding pads have a first bonding pad pitch P1. As used herein, a bonding pad pitch is a minimum separation between a same feature on adjacent bonding pads (e.g., an edge-to edge spacing, a center-to-center spacing, or the like).

Thus, as described above, an electrically conductive path couples electrical signals on conductors 612 to top metal layer 610, and such signals ordinarily may be brought off-die by attaching a bond wire to first bonding pad 614 of top metal layer 610. As described below, however, rather than attaching bond wires to first bonding pad 614, additional material layers are disposed above top portion 606 to form a bonding pad redistribution layer that provides second bonding pads having a second bonding pad pitch P2 greater than first bonding pad pitch P1.

A second dielectric material layer 616 is formed over top portion 606. For example, approximately 300-700 nm of silicon dioxide may be deposited on top portion 606 and planarized using chemical mechanical polishing or an etchback process to form a planar surface, resulting in the structure depicted in FIGS. 6B1-6B3. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Second dielectric material layer 616 is patterned and etched to form a first etched recess 618 that exposes a top surface of top metal layer 610 at first bonding pad 614, resulting in the structure depicted in FIGS. 6C1-6C3. For example, second dielectric material layer 616 may be patterned and etched using conventional lithography techniques, with wet or dry etch processing. In embodiments, first etched recess 618 may have a rectangular, an ellipsoidal, or other shape. In the embodiment depicted in FIGS. 6C1-6C2, first etched recess 618 has a tapered rectangular shape.

A second metal layer 620 (also referred to herein as "first additional metal layer 620") is deposited conformally over second dielectric material layer 616, forming on the bottom and sidewalls of first etched recess 618. First additional metal layer 620 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.).

In an embodiment, first additional metal layer 620 may be between about 20 nm and about 250 nm of tungsten. Other conductive material layers and/or thicknesses may be used. In some embodiments, an adhesion layer (not shown), such as titanium nitride or other similar adhesion layer material, may be disposed between second dielectric material layer 616 and first additional metal layer 620.

First additional metal layer 620 is patterned and etched. For example, first additional metal layer 620 may be patterned and etched using conventional lithography techniques, with a soft or hard mask, and wet or dry etch processing. In at least one embodiment, first additional metal layer 620 is patterned and etched, resulting in the structure depicted in FIGS. 6D1-6D3. In an embodiment, first additional metal layer 620 has a substantially L-shape, although other shapes may be used.

A third dielectric material layer 622 and a nitride layer 624 are formed over top portion 606. For example, approximately 300-700 nm of silicon dioxide may be deposited on top portion 606, and between about 3 nm to about 10 nm of silicon nitride may be deposited by atomic layer deposition (ALD) on third dielectric material layer 622. Nitride layer 624 may be planarized using chemical mechanical polishing or an etchback process to form a planar surface, resulting in the structure depicted in FIGS. 6E1-6E3. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Third dielectric material layer 622 and nitride layer 624 are patterned and etched (e.g., using conventional lithography techniques, with wet or dry etch processing) to form a second etched recess 626 that exposes a top surface of first additional metal layer 620 at a second bonding pad 628, resulting in the structure shown in FIGS. 6F1-6F5.

Second bonding pad 628 is electrically coupled via first additional metal layer 620 to corresponding first bonding pad 614. In an embodiment, a bonding wire (not shown) may be attached via second etched recess 626 to second bonding pad 628.

The structure depicted in FIGS. 6F1-6F5 that includes second dielectric material layer 616, first etched recess 618, first additional metal layer 620, third dielectric material layer 622, nitride layer 624 and second etched recess 626 is referred to herein as a bonding pad redistribution layer 630a.

In embodiments, second etched recess 626 may have a rectangular, an ellipsoidal, or other shape. In the embodiment depicted in FIGS. 6F1-6F5, second etched recess 626 has a tapered rectangular shape. Although not shown in FIGS. 6F1-6F5, bonding pad redistribution layer 630a includes multiple second bonding pads (including second bonding pad 628) having a second pitch P2 greater than first bonding pad pitch P1, with each second bonding pad electrically coupled via first additional metal layer 620 to a corresponding first bonding pad.

In an embodiment, second bonding pad 628 and first bonding pad 614 are offset from one another in a first direction (e.g., an x-axis direction) and in a second direction (e.g., a y-axis direction).

Thus, by forming bonding pad redistribution layer 630a above top portion 606, rather than attaching bond wires to first bonding pads (including first bonding pad 614) at first pitch P1, bonding pad redistribution layer 630a is disposed above top portion 606 to enable attaching bond wired to second bonding pads (including second bonding pad 628) at second bonding pad pitch P2 greater than first bonding pad pitch P1.

Without wanting to be bound by any particular theory, it is believed that bonding pad redistribution layer 630a may reduce incidents of bond wire shorts between adjacent bond wires.

Referring now to FIGS. 7C1-7F5, an example method of forming a bonding pad redistribution layer such as the example bonding pad redistribution layer 500b of FIG. 5B is described. To avoid duplicating the same text described above, the method depicted in FIGS. 7C1-7F5 follow the method depicted in FIGS. 6A1-6B3 as described above.

With reference to FIGS. 7C1-7C3, an integrated circuit 600 is shown as having already undergone several processing steps. Integrated circuit 600 includes substrate 602, one or more intermediate material layers 604, top portion 606 disposed above intermediate material layers 604, and second dielectric material layer 616 disposed above top portion 606.

Top portion 606 includes first dielectric material layer 608, top metal layer 610, one or more conductors 612, and first bonding pad 614. In addition, a first additional metal layer 620 is deposited over second dielectric material layer 616 and planarized using chemical mechanical polishing or an etchback process to form a planar surface.

First additional metal layer 620 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.).

In an embodiment, first additional metal layer 620 may be between about 20 nm and about 250 nm of tungsten. Other conductive material layers and/or thicknesses may be used. In some embodiments, an adhesion layer (not shown), such as titanium nitride or other similar adhesion layer material, may be disposed between second dielectric material layer 616 and first additional metal layer 620.

First additional metal layer 620 is patterned and etched. For example, first additional metal layer 620 may be patterned and etched using conventional lithography techniques, with a soft or hard mask, and wet or dry etch processing. In at least one embodiment, first additional metal layer 620 is patterned and etched to form etched first additional metal layer 620e, resulting in the structure depicted in FIGS. 7D1-7D3. In an embodiment, etched first additional metal layer 620 has a substantially rectangular (e.g., square) shape, although other shapes may be used.

A third dielectric material layer 622 and a nitride layer 624 are formed over top portion 606. For example, approximately 300-700 nm of silicon dioxide may be deposited on top portion 606, and between about 3 nm to about 10 nm of silicon nitride may be deposited by atomic layer deposition (ALD) on third dielectric material layer 622. Nitride layer 624 may be planarized using chemical mechanical polishing or an etchback process to form a planar surface, resulting in the structure depicted in FIGS. 7E1-7E5. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Third dielectric material layer 622 and nitride layer 624 are patterned and etched to form a first etched recess 618 that exposes a top surface of top metal layer 610 at first bonding pad 614, and form a second etched recess 626 that exposes a top surface of etched first additional metal layer 620e at a second bonding pad 628, resulting in the structure depicted in FIGS. 7F1-7F5.

For example, third dielectric material layer 622 and nitride layer 624 may be patterned and etched using conventional lithography techniques, with wet or dry etch processing. In embodiments, first etched recess 618 may have a rectangular, an ellipsoidal, or other shape. In embodiments, second etched recess 626 may have a rectangular, an ellipsoidal, or other shape. In the embodiment depicted in FIGS. 7F1-7F5, first etched recess 618 and second etched recess 626 each have a tapered rectangular shape.

Second bonding pad 628 may be electrically coupled via an external wire bond (not shown) to corresponding first bonding pad 614. In an embodiment, second bonding pad 628 and first bonding pad 614 are offset from one another in a first direction (e.g., an x-axis direction) and in a second direction (e.g., a y-axis direction).

The structure depicted in FIGS. 7F1-7F5 that includes second dielectric material layer 616, first etched recess 618, etched first additional metal layer 620e, third dielectric material layer 622, nitride layer 624 and second etched recess 626 is referred to herein as a bonding pad redistribution layer 630b. Although not shown in FIGS. 7F1-7F5, bonding pad redistribution layer 630b includes multiple second etched recesses (including second etched recess 626) and multiple second bonding pads (including second bonding pad 628).

In an embodiment, bonding pad redistribution layer 630b includes multiple second bonding pads having a second pitch P2 greater than first bonding pad pitch P1, with each second bonding pad capable of being electrically coupled via an external bond wire to a corresponding first bonding pad. Without wanting to be bound by any particular theory, it is believed that bonding pad redistribution layer 630b may reduce incidents of bond wire shorts between adjacent bond wires.

Referring now to FIGS. 8E1-8H5, an example method of forming a bonding pad redistribution layer such as the example bonding pad redistribution layer 500c of FIG. 5C is described. To avoid duplicating the same text described above, the method depicted in FIGS. 8E1-8H5 follow the method depicted in FIGS. 6A1-6D3 as described above.

With reference to FIGS. 8E1-8E3, an integrated circuit 600 is shown as having already undergone several processing steps. Integrated circuit 600 includes substrate 602, one or more intermediate material layers 604, top portion 606 disposed above intermediate material layers 604, second dielectric material layer 616 disposed above top portion 606, and first additional metal layer 620.

Top portion 606 includes first dielectric material layer 608, top metal layer 610, one or more conductors 612, and first bonding pad 614. In addition, third dielectric material layer 622 is formed over top portion 606. For example, approximately 300-700 nm of silicon dioxide may be deposited on top portion 606 and may be planarized using chemical mechanical polishing or an etchback process to form a planar surface. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Third dielectric material layer 622 is patterned and etched (e.g., using conventional lithography techniques, with wet or dry etch processing) to form a second etched recess 626 that exposes a top surface of first additional metal layer 620, resulting in the structure shown in FIGS. 8F1-8F5.

A third metal layer 632 (also referred to herein as "second additional metal layer 632") is deposited conformally over third dielectric material layer 622, forming on the bottom and sidewalls of second etched recess 626. Second additional metal layer 632 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.).

In an embodiment, second additional metal layer 632 may be between about 20 nm and about 250 nm of tungsten. Other conductive material layers and/or thicknesses may be used. In some embodiments, an adhesion layer (not shown), such as titanium nitride or other similar adhesion layer material, may be disposed between third dielectric material layer 622 and second additional metal layer 632.

Second additional metal layer 632 is patterned and etched. For example, second additional metal layer 632 may be patterned and etched using conventional lithography techniques, with a soft or hard mask, and wet or dry etch processing. In at least one embodiment, second additional metal layer 632 is patterned and etched, resulting in the structure depicted in FIGS. 8G1-8G5. In an embodiment, second additional metal layer 632 has a substantially rectangular shape, although other shapes may be used.

A fourth dielectric material layer 634 and a nitride layer 624 are formed over top portion 606. For example, approximately 300-700 nm of silicon dioxide may be deposited on top portion 606, and between about 3 nm to about 10 nm of silicon nitride may be deposited by atomic layer deposition (ALD) on fourth dielectric material layer 634. Nitride layer 624 may be planarized using chemical mechanical polishing or an etchback process to form a planar surface. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Fourth dielectric material layer 634 and nitride layer 624 are patterned and etched (e.g., using conventional lithography techniques, with wet or dry etch processing) to form a third etched recess 636 that exposes a top surface of second additional metal layer 632 at a second bonding pad 628, resulting in the structure shown in FIGS. 8H1-8H5. Second bonding pad 628 is electrically coupled via second additional metal layer 632 and first additional metal layer 620 to corresponding first bonding pad 614.

In an embodiment, second bonding pad 628 and first bonding pad 614 are offset from one another in a first direction (e.g., an x-axis direction) but are substantially aligned in a second direction (e.g., a y-axis direction).

The structure depicted in FIGS. 8H1-8H5 that includes second dielectric material layer 616, first etched recess 618, first additional metal layer 620, third dielectric material layer 622, second additional metal layer 632, third etched recess 636, fourth dielectric material layer 634 and nitride layer 624 is referred to herein as a bonding pad redistribution layer 630c.

In embodiments, third etched recess 636 may have a rectangular, an ellipsoidal, or other shape. In the embodiment depicted in FIGS. 8G1-8G5, third etched recess 636 has a tapered rectangular shape. Although not shown in FIGS. 8H1-8H5, bonding pad redistribution layer 630c includes multiple second bonding pads (including second bonding pad 628) having a second pitch P2 greater than first bonding pad pitch P1.

In an embodiment, bonding pad redistribution layer 630c includes multiple second bonding pads having a second pitch P2 greater than first bonding pad pitch P1, with each second bonding pad electrically coupled via first additional metal layer 620 to a corresponding first bonding pad.

Thus, by forming bonding pad redistribution layer 630c above top portion 606, rather than attaching bond wires to first bonding pads (including first bonding pad 614) at first pitch P1, bonding pad redistribution layer 630c is disposed above top portion 606 to enable attaching bond wired to second bonding pads (including second bonding pad 628) at second bonding pad pitch P2 greater than first bonding pad pitch P1.

Without wanting to be bound by any particular theory, it is believed that bonding pad redistribution layer 630c may reduce incidents of bond wire shorts between adjacent bond wires.

One embodiment includes an apparatus that includes an integrated circuit die that includes an uppermost metal layer of an integrated circuit fabrication process, a plurality of first bonding pads disposed on the uppermost metal layer at a first bonding pad pitch, a first additional metal layer disposed above the uppermost metal layer, and a plurality of second bonding pads disposed on the first additional metal layer at a second bonding pad pitch greater than the first bonding pad pitch. The apparatus further includes a plurality of conductors each electrically coupling a unique one of the first bonding pads to a corresponding one of the second bonding pads.

One embodiment includes apparatus that includes an integrated circuit die that includes an uppermost metal layer of an integrated circuit fabrication process, a plurality of first bonding pads disposed on the uppermost metal layer at a first bonding pad pitch, a first additional metal layer disposed above the uppermost metal layer, a second additional metal layer disposed above the first additional metal layer, and a plurality of second bonding pads disposed on the second additional metal layer at a second bonding pad pitch greater than the first bonding pad pitch. The apparatus further includes a plurality of conductors each electrically coupling a unique one of the first bonding pads to a corresponding one of the second bonding pads.

One embodiment includes method that includes forming an integrated circuit die using an integrated circuit fabrication process that includes an uppermost metal layer, the integrated circuit die comprising a plurality of first bonding pads disposed on the uppermost metal layer at a first bonding pad pitch, forming a first additional metal layer above the uppermost metal layer, forming a plurality of second bonding pads disposed on the first additional metal layer at a second bonding pad pitch greater than the first bonding pad pitch, and forming a plurality of conductors each electrically coupling a unique one of the first bonding pads to a corresponding one of the second bonding pads.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
an integrated circuit die comprising:
an uppermost metal layer of an integrated circuit fabrication process;
a plurality of first bonding pads disposed on the uppermost metal layer at a first bonding pad pitch;
a first additional metal layer disposed above the uppermost metal layer; and
a plurality of second bonding pads disposed on the first additional metal layer at a second bonding pad pitch greater than the first bonding pad pitch; and
a plurality of conductors each electrically coupling a unique one of the first bonding pads to a corresponding one of the second bonding pads,
wherein the first bonding pads are disposed along a distal edge of the integrated circuit die, and the second bonding pads are disposed along the distal edge of the integrated circuit die.

2. The apparatus of claim 1, wherein the plurality of conductors comprise the first additional metal layer.

3. The apparatus of claim 1, wherein the plurality of conductors comprise a plurality of bond wires.

4. The apparatus of claim 1, wherein the integrated circuit die comprises a plurality of first etched recesses each disposed at a corresponding one of first bonding pads.

5. The apparatus of claim 1, wherein the first additional metal layer is coupled to uppermost metal layer at each of the first bonding pads.

6. The apparatus of claim 1, wherein the integrated circuit die comprises a plurality of second etched recesses each disposed at a corresponding one of second bonding pads.

7. The apparatus of claim 1, wherein the second bonding pads are offset in a first direction from the first bonding pads.

8. The apparatus of claim 7, wherein each of the second bonding pads is offset in a second direction from a corresponding one of the first bonding pads, wherein the second direction is substantially perpendicular to the first direction.

9. The apparatus of claim 1, wherein the first bonding pads and the second bonding pads are disposed along an edge of the integrated circuit die, and the second bonding pads are disposed farther from the edge than the first bonding pads.

10. An apparatus comprising:
an integrated circuit die comprising:
an uppermost metal layer of an integrated circuit fabrication process;
a plurality of first bonding pads disposed on the uppermost metal layer at a first bonding pad pitch;
a first additional metal layer disposed above the uppermost metal layer;
a second additional metal layer disposed above the first additional metal layer; and
a plurality of second bonding pads disposed on the second additional metal layer at a second bonding pad pitch greater than the first bonding pad pitch; and
a plurality of conductors each electrically coupling a unique one of the first bonding pads to a corresponding one of the second bonding pad,
wherein the first bonding pads are disposed along a distal edge of the integrated circuit die, and the second bonding pads are disposed along the distal edge of the integrated circuit die.

11. The apparatus of claim 10, wherein the plurality of conductors comprise the first additional metal layer and the second additional metal layer.

12. The apparatus of claim 10, wherein the integrated circuit die comprises a plurality of first etched recesses each disposed at a corresponding one of first bonding pads.

13. The apparatus of claim 10, wherein the integrated circuit die comprises a plurality of second etched recesses disposed above the first additional metal layer.

14. The apparatus of claim 10, wherein the first additional metal layer is coupled to uppermost metal layer at each of the first bonding pads.

15. The apparatus of claim 10, wherein the integrated circuit die comprises a plurality of third etched recesses each disposed at a corresponding one of second bonding pads.

16. The apparatus of claim 10, wherein the first bonding pads and the second bonding pads are disposed along and at a same distance from an edge of the integrated circuit die.

17. A method comprising:
forming an integrated circuit die using an integrated circuit fabrication process that includes an uppermost metal layer, the integrated circuit die comprising a plurality of first bonding pads disposed on the uppermost metal layer at a first bonding pad pitch and on a distal edge of the integrated circuit die;
forming a first additional metal layer above the uppermost metal layer;
forming a plurality of second bonding pads disposed on the first additional metal layer at a second bonding pad pitch greater than the first bonding pad pitch and on the distal edge of the integrated circuit die; and
forming a plurality of conductors each electrically coupling a unique one of the first bonding pads to a corresponding one of the second bonding pads.

18. The method of claim 17, further comprising forming the plurality of conductors using the first additional metal layer.

* * * * *